(12) United States Patent
Nordmark et al.

(10) Patent No.: US 11,934,752 B1
(45) Date of Patent: Mar. 19, 2024

(54) SYSTEM AND METHOD FOR ADDING AND DEFINING PERFECTLY MATCHED LAYERS FOR A MODEL OF A PHYSICAL SYSTEM

(71) Applicant: COMSOL AB, Stockholm (SE)

(72) Inventors: Arne Nordmark, Stocksund (SE); Eduardo Fontes, Vallentuna (SE); Hans Rullgård, Nyäshamn (SE); Henrik Sönnerlind, Ekerö (SE); Johan Öjemalm, Solna (SE); Lars Langemyr, Stockholm (SE); Daniel Bertilsson, Vallentuna (SE); Nils Malm, Lidingö (SE); Johan Thaning, Årsta (SE); Eduardo Gonzalez, Stockholm (SE); Niklas Rom, Vallentuna (SE); Simon Erlandsson, Solna (SE)

(73) Assignee: COMSOL AB, Stockholm (SE)

( * ) Notice: Subject to any disclaimer, the term of this patent is extended or adjusted under 35 U.S.C. 154(b) by 86 days.

(21) Appl. No.: 17/019,987

(22) Filed: Sep. 14, 2020

Related U.S. Application Data

(63) Continuation-in-part of application No. 16/045,935, filed on Jul. 26, 2018, now Pat. No. 10,776,541, (Continued)

(51) Int. Cl.
*G06F 30/23* (2020.01)
(52) U.S. Cl.
CPC .................................... *G06F 30/23* (2020.01)
(58) Field of Classification Search
CPC ..................................................... G06F 30/23
See application file for complete search history.

(56) References Cited

U.S. PATENT DOCUMENTS

| | | | |
|---|---|---|---|
| 6,687,659 B1 * | 2/2004 | Shen ...................... | G06F 17/13 702/14 |
| 6,718,291 B1 | 4/2004 | Shapiro | |

(Continued)

OTHER PUBLICATIONS

Engquist, B. & Majda, A., "absorbing boundary conditions for the numerical simulation of waves," Mathematics of Computation 31.139, pp. 629-651 (1977). (23 pages).

(Continued)

*Primary Examiner* — Kibrom K Gebresilassie
(74) *Attorney, Agent, or Firm* — Michael Best & Friedrich LLP

(57) ABSTRACT

A graphical user interface includes GUI elements configured for defining discretized base geometry data for a model of a physical system, receiving a first input representing a user instruction to add a perfectly matched layer to the model, receiving a second input representing the user selection of boundaries that define a base geometry, and receiving a third input representing extra geometry meshing instructions. Extra geometry line segment data is discretized representing an outward direction of a PML from the boundary according to the extra geometry meshing instructions. Weak form expressions representing a wave-related phenomena are formed based on received PML settings and physics settings parameterized using discretized base geometry data and discretized extra geometry data. Matrix data are generated based on the formed weak form expressions. A solution to a simulation of the wave-related phenomena of the model is generated based on the formed weak form expressions. A graphical representation of the solution is generated for display on the GUI.

20 Claims, 72 Drawing Sheets

Related U.S. Application Data which is a continuation of application No. 13/840,664, filed on Mar. 15, 2013, now abandoned.

(60) Provisional application No. 63/064,051, filed on Aug. 11, 2020, provisional application No. 63/047,180, filed on Jul. 1, 2020, provisional application No. 61/760,504, filed on Feb. 4, 2013.

(56) References Cited

U.S. PATENT DOCUMENTS

| | | | |
|---|---|---|---|
| 6,982,710 | B2 | 1/2006 | Salomie |
| 7,519,518 | B2* | 4/2009 | Langemyr ............... G06F 17/12 703/2 |
| 7,596,474 | B2 | 9/2009 | Langemyr |
| 7,623,991 | B1 | 11/2009 | Langemyr |
| 8,219,373 | B2 | 7/2012 | Fontes |
| 8,626,475 | B1 | 1/2014 | Fontes |
| 9,098,106 | B2 | 8/2015 | Danielsson |
| 9,146,652 | B1 | 9/2015 | Danielsson |
| 9,208,270 | B2 | 12/2015 | Fontes |
| 9,323,503 | B1* | 4/2016 | Fontes ................. G06F 30/23 |
| 9,372,673 | B2 | 6/2016 | Bertilsson |
| 10,019,544 | B2 | 7/2018 | Bertilsson |
| 10,650,177 | B2 | 5/2020 | Bertilsson |
| 10,776,541 | B2 | 9/2020 | Nordmark |
| 2003/0105614 | A1 | 6/2003 | Langemyr |
| 2004/0034514 | A1* | 2/2004 | Langemyr ............... G06F 17/13 703/2 |
| 2005/0060130 | A1 | 3/2005 | Shapiro |
| 2005/0232511 | A1 | 10/2005 | Ziou |
| 2009/0024370 | A1 | 1/2009 | Scott |
| 2009/0244082 | A1 | 10/2009 | Livingston |
| 2010/0076732 | A1 | 3/2010 | Yoon |
| 2010/0121626 | A1 | 5/2010 | Montana |
| 2012/0179426 | A1 | 7/2012 | Fontes |
| 2015/0164357 | A1* | 6/2015 | Zeng .................... A61B 5/7278 607/18 |
| 2020/0292810 | A1* | 9/2020 | Gopinath .......... G02B 27/0068 |
| 2022/0160265 | A1* | 5/2022 | Sankhala .......... A61B 5/14532 |

OTHER PUBLICATIONS

Zienkiewicz, O. C. et al., "A novel boundary infinite element," International Journal for Numerical Methods in Engineering 19.3, pp. 393-404 (1983). (12 pages).

Berenger, J-P, "A perfectly matched layer for the absorption of electromagnetic waves," Journal of Computational Physics 114.2, pp. 185-200 (1994). (16 pages).

Eriksson, K. et al., "Introduction to Adaptive Methods for Differential Equations," Acta Numerica 4, pp. 105-158 (1995). (54 pages).

Berenger, J-P, "Perfectly matched layer for the FDTD solution of wave-structure interaction problems," IEEE Transactions of Antennas and Propagation 44.1, pp. 110-117 (1996). (8 pages).

Liu, Q-H & Tao, J ., "The perfectly matched layer for acoustic waves in absorptive media," The Journal of the Acoustical Society of America 102.4, pp. 2072-2082 (1997). (11 pages).

Becker, R. & Rannacher, R., "An optimal control approach to a posteriori error estimation in finite element methods," Acta Numerica 10, pp. 1-102 (2001). (102 pages).

Beneson, W. et al., "Handbook of Physics," New York: Springer, ISBN: 9780387336329 (2002). (1183 pages).

Bermudez, A. et al., "An optimal perfectly matched layer with unbounded absorbing function for time-harmonic acoustic scattering problems," Journal of Computational Physics 223.2, pp. 469-488 (2007). (26 pages).

Oskooi, A. F. et al., "The failure of perfectly matched layers, and towards their redemption by adiabatic absorbers," Opt. Express 15.15, pp. 11376-11392 (2008). (17 pages).

Loh, P-R et al., "Fundamental relation between phase and group velocity, and application to the failure of perfectly matched layers in backward-wave structures," Phys. Rev. E 79, p. 065601 (2009). (5 pages).

Powell, M., "The BOBYQA Algorithm for Bound Constrained Optimization without Derivatives," Technical Report, Department of Applied Mathematics and Theoretical Physics (2009). (39 pages).

Johnson, S.G., "Notes on perfectly matched layers (PMLs)," Published online, <URL: http://math.mit.edu/~stevenj/18.369/pml.pdf/> (2010). (18 pages).

Runborg, O., "Helmholtz Equation and High Frequency Approximations," Published online, <URL: http://www.csc.kth.se/utbildning/kth/kurser/DN2255/ndiff12/Lecture5.pdf/> (2012). (21 pages).

Larson, M. G. & Bengzon, F., "The Finite Element Method: Theory, Implementation, and Applications vol. 10," Springer Series: Texts in Computational Science and Engineering, ISBN: 978-3-642-33287-6 (2013). (402 pages).

Yamamoto, K. et al., "Visualization of Acoustic Evanescent Waves by the Stroboscopic Photoelastic Method," Physics Procedia 70, pp. 716-720 (2015). (5 pages).

Chern, A., "A reflectionless discrete pelfectly matched layer," Journal of Computational Physics 381, pp. 91-109 (2019). (22 pages).

Edwards, H.C., "Managing complexity in massively parallel, adaptive, multiphysics applications," Engineering with Computers, 2006, vol. 22, pp. 135-155 (21 pages).

Iarve, E.V. et al., "Mesh-independent matrix cracking and delamination modeling in laminated composites," Int. J. Numer. Meth. Engng., Apr. 2011, vol. 88, pp. 749-773 (25 pages).

Qin, H. et al., "D-NURBS: A Physics-Based Framework for Geometric Design," IEEE Transactions on Visualization and Computer Graphics, Mar. 1996, vol. 2, No. 1, pp. 85-96 (12 pages).

\* cited by examiner

NAMES OF GEOMETRIC ENTITIES IN DIFFERENT SPACE DIMENSIONS

| ENTITY DIMENSION | NAME IN 3D | NAME IN 2D | NAME IN 1D | NAME IN 0D |
|---|---|---|---|---|
| 3D | domain | | | |
| 2D | boundary | domain | | |
| 1D | edge | boundary | domain | |
| 0D | vertex | vertex | boundary | domain |

FIG 2

| Number of Layers: | — 1400a |
|---|---|
| 3 | |

Layers Section Identifier:

| Layer_sect1 | — 1400b |
|---|---|

| Layer Order ▼ | |
|---|---|
| 1 | — 1400c |
| 2 | |
| 3 | |

Layer Thickness:

| 5mm | — 1400d |
|---|---|

Layer Material:

| mat1 | — 1400e |
|---|---|

| Layer Orientation ▼ | — 1400f |
|---|---|

Layer Identifier:

| isolator ✚ | — 1400g |
|---|---|

| Layer Order ▼ |
|---|

Layer Thickness:

| |
|---|

Layer Material:

| |
|---|

| Layer Orientation ▼ |
|---|

Layer Identifier:

| ✚ |
|---|

| Layer Order ▼ |
|---|

Layer Thickness:

| |
|---|

Layer Material:

| |
|---|

| Layer Orientation ▼ |
|---|

Layer Identifier:

| ✚ |
|---|

FIG 14A

Geometric Entity Selection

Geometric entity level: | Boundary ▼ |

- Domain
- Boundary
- Edge
- Point

Selection:

1
2
3
4
5
6

― 1800c

Extra Geometry Selection

Geometry 2
Custom Selection 1

▼ Auxiliary Dependent Variable

Field variable name:
| u1 |

Initial value:
| 0 |

Initial time derivative:
| 0 |

▼ Discretization

Shape function type:
| Language ▼ |

Element order:
| Quadratic ▼ |

― 1800b

FIG 18B $$CO + \frac{1}{2} O_2 \rightarrow CO_2 \quad \text{2000a}$$

$$C_3H_6 + \frac{9}{2} O_2 \rightarrow 3H_2O + 3CO_2 \quad \text{2000b}$$

$$r_1 = \frac{k_1 c_{CO} c_{O2}}{(1 + K_{CO} c_{CO} + K_{C3H6} c_{C3H6})^2} \quad \text{2000c}$$

$$r_2 = \frac{k_2 c_{C3H6} c_{O2}}{(1 + K_{CO} c_{CO} + K_{C3H6} c_{C3H6})^2} \quad \text{2000d}$$

$$k = A \exp\left(-\frac{E}{R_g T}\right) \quad \text{2000e}$$

TABLE I: ARRHENIUS PARAMETERS — 2000f

| RATE/ABSORPTION CONSTANT | FREQUENCY FACTOR (JOULE/MOL) | ACTIVATION ENERGY (JOULE/MOL) |
|---|---|---|
| k1 | 7.07·1013 | 1.09·105 |
| k2 | 1.47·1015 | 1.26·105 |
| KCO | 8.1 | -3400 |
| KC3H6 | 257.9 | 1588 |

FIG 20

$$\frac{\partial c}{\partial t} + \nabla \cdot (c\mathbf{u}) = s \quad \text{2100a}$$

$$\mathbf{u} = -\frac{k}{\eta} \nabla P \quad \text{2100b}$$

$$c\mathbf{u} = \mathbf{N}_{solvent} + \sum \mathbf{N}_i \quad \text{2100c}$$

$$\mathbf{N}_i = -\mathbf{D}_i \nabla c_i + \mathbf{u} c_i \quad \text{2100d}$$

$$\frac{\partial c_i}{\partial t} + \nabla \cdot (-\mathbf{D}_i \nabla c_i) + \mathbf{u} \nabla c_i = R_i \quad \text{2100e}$$

$$\left. \begin{array}{l} c_{CO} = c_{COin} \\ c_{C3H6} = c_{C3H6in} \\ c_{O2} = c_{O2in} \\ c_{CO2} = 0 \\ c_{H2O} = 0 \end{array} \right\} \quad \text{2100f}$$

$$\mathbf{n} \cdot (-\mathbf{D}_i \nabla c_i) = 0 \quad \text{2100g}$$

$$c = c_{solvent} + \sum c_i \quad \text{2100h}$$

FIG 21

$$\frac{\partial c_{pi}}{\partial t} + \nabla \cdot (-\mathbf{D}_{pi} \nabla c_{pi}) = R_{pi} \quad \text{2200a}$$

$$-\mathbf{D}_{pi} \nabla c_{pi} \cdot \mathbf{n} = 0 \quad \text{at } r = 0 \quad \text{2200b}$$

$$\left. \begin{array}{l} c_{pi} = -\varepsilon c_i \quad \text{2200c} \\ A_p (-\mathbf{D}_{pi} \nabla c_{pi} \cdot \mathbf{n}) = R_i \quad \text{2200d} \end{array} \right\} \text{ at } \frac{r}{r_p} = 1$$

| Name | Expression | Value | Description |
|---|---|---|---|
| P_feed | 2[atm] | 2.0265E5 Pa | Feed pressure |
| T | 508[K] | 508.00 K | Temperature |
| kmCO | 3.90[cm/s] | 0.039000 m/s | External mass transfer c... |
| kmO2 | 3.90[cm/s] | 0.039000 m/s | External mass transfer c... |
| D_CO | 0.0487[cm^2/s] | 4.8700E-6 m... | Diffusion coefficient for... |
| D_O2 | 0.0469[cm^2/s] | 4.6900E-6 m... | Diffusion coefficient for... |
| D_C3H6 | 0.0487[cm^2/s] | 4.8700E-6 m... | Diffusion coefficient for... |
| D_CO2 | 0.0487[cm^2/s] | 4.8700E-6 m... | Diffusion coefficient for... |
| D_H2O | 0.0487[cm^2/s] | 4.8700E-6 m... | Diffusion coefficient for... |
| E1 | 1.09e5[J/mol] | 1.0900E5 J/... | Activation energy for R1 |
| E2 | 1.26e5[J/mol] | 1.2600E5 J/... | Activation energy for R2 |
| A1 | 7.07e13[m^3/mol/s] | 7.0700E13 m... | Preexponential factor fo... |
| A2 | 1.47e15[m^3/mol/s] | 1.4700E15 m... | Preexponential factor fo... |
| Aco | 8.1m[m^3/mol] | 8.1000 m³/m... | Constant for adsorption... |
| Ac3h6 | 257.9[m^3/mol] | 8.1000 m³/m... | Constant for adsorption... |
| Eco | -3400[J/mol] | -3400 J/mol | Activation energy for ad... |

FIG 24A

Transport of Diluted Speci
- Convection and Diffusion
- No Flux 1
- Initial Values 1
- Reactions 1
- Inflow 1
- Outflow 1
- Concentration 1

2500a

▸ Override and Contribution
▸ Equation
▾ Model Inputs
Velocity Field Bulk:
u [User defined ▾]
[u]    x   m/s ▾ Coordinate System Selection
Coordinate system:
[Global coordinate system: ▾]

▾ Diffusion
Bulk material:
[None ▾]
Diffusion coefficient:
$D_{C3H6}$ [User defined ▾]
[D_C3H6]   m²/s
$D_{CO}$ [User defined ▾]
[D_CO]   m²/s
$D_{CO2}$ [User defined ▾]
[D_CO2]   m²/s
$D_{H2O}$ [User defined ▾]
[D_H2O]   m²/s
$D_{O2}$ [User defined ▾]
[D_O2]   m²/s 2500b

Particle
▸ Override and Contribution
▸ Equation
▾ Model Inputs
Velocity field Particle:
u [User defined ▾]
[0]   m/s ▾ Coordinate System Selection
Coordinate system:
[Global coordinate system: ▾]

▾ Diffusion
Particle material:
[None ▾]
Diffusion coefficient:
$D_{C3H6p}$ [User defined ▾]
[D_C3H6p]   m²/s
$D_{COp}$ [User defined ▾]
[D_COp]   m²/s
$D_{CO2p}$ [User defined ▾]
[D_CO2p]   m²/s
$D_{H2Op}$ [User defined ▾]
[D_H2Op]   m²/s
$D_{O2p}$ [User defined ▾]
[D_O2p]   m²/s 2500c

Bulk:
- Initial Values:
  Concentration:
  - C3H6 [1e-6] mol/m³
  - CO [1e-6] mol/m³
  - CO2 [1e-6] mol/m³
  - H2O [1e-6] mol/m³
  - O2 [1e-6] mol/m³

Particle:
- Initial Values:
  Concentration:
  - C3pH6p [1e-6] mol/m³
  - COp [1e-6] mol/m³
  - CO2p [1e-6] mol/m³
  - H2Op [1e-6] mol/m³
  - O2p [1e-6] mol/m³

FIG 26

Bulk:

▸ Override and Contribution

▸ Equation

▾ Reactions

| | | |
|---|---|---|
| $R_{C3H6}$ | -Ap*C3H6flux | mol/(m³·s) |
| $R_{CO}$ | -Ap*COflux | mol/(m³·s) |
| $R_{CO2}$ | -Ap*CO2flux | mol/(m³·s) |
| $R_{H2O}$ | -Ap*H2Oflux | mol/(m³·s) |
| $R_{O2}$ | -Ap*O2flux | mol/(m³·s) |

↗ 2800b

Particle

▾ Equation

Show equation assuming:

[Study 2, Time Dependent ▼]

$$\frac{\partial c_i}{\partial t} + \nabla \cdot (-D_i \nabla c_i) + u \cdot \nabla c_i = R_i$$

▾ Reactions

| | | |
|---|---|---|
| $R_{C3H6p}$ | -r^2*R2 | mol/(m³·s) |
| $R_{COp}$ | -r^2*R1 | mol/(m³·s) |
| $R_{CO2p}$ | -r^2*(R1+3*R2) | mol/(m³·s) |
| $R_{H2Op}$ | -r^2*3*R2 | mol/(m³·s) |
| $R_{O2p}$ | -r^2*(0.5*R1+4.5*R2) | mol/(m³·s) |

Equation View | Model Lib | Material Browser

Operator Name

| Name | Expression | Unit | Description |
|---|---|---|---|
| chds.Dxx_... | D_C3H6 | m²/s | Diffusion Coeff... |
| chds.Dyx_... | 0 | m²/s | Diffusion Coeff... |
| chds.Dzx_... | 0 | m²/s | Diffusion Coeff... |
| chds.Dxy_... | 0 | m²/s | Diffusion Coeff... |
| chds.Dyy_... | D_C3H6 | m²/s | Diffusion Coeff... |
| chds.Dzy_... | 0 | m²/s | Diffusion Coeff... |
| chds.Dxz_... | 0 | m²/s | Diffusion Coeff... |
| chds.Dyz_... | 0 | m²/s | Diffusion Coeff... |
| chds.Dzz_... | 0 | m²/s | Diffusion Coeff... |
| chds.Dav_... | chds.Dxx_C3H6 | m²/s | Average diffusi... |

Shape Functions

| Name | Shape function | Unit | Description | Shape fram |
|---|---|---|---|---|
| C3H6 | Lagrange (Lin... | mol/... | Concentration | Material |
| CO | Lagrange (Lin... | mol/... | Concentration | Material |
| CO2 | Lagrange (Lin... | mol/... | Concentration | Material |
| H2O | Lagrange (Lin... | mol/... | Concentration | Material |
| O2 | Lagrange (Lin... | mol/... | Concentration | Material |

Weak Expressions

| Weak exprssion | Integration Fra |
|---|---|
| -C3H6t*test(C3H6)-chds.Dxx_C3H6*C3H6* | Material |
| -COt*test(CO)-chds.Dxx_CO*COx*test(Cox | Material |
| -CO2t*test(CO2)-chds.Dxx_CO2*CO2x*test | Material |
| -H2Ot*test(H2O)-chds.Dxx_H2O*H2Ox*test | Material |
| -O2t*test(O2)-chds.Dxx_O2*O2x*test(O2x) | Material |

2900a

Constraints

| Constraint | Constraint force | Shape funct... | Selection |
|---|---|---|---|
| | | | |

FIG 29

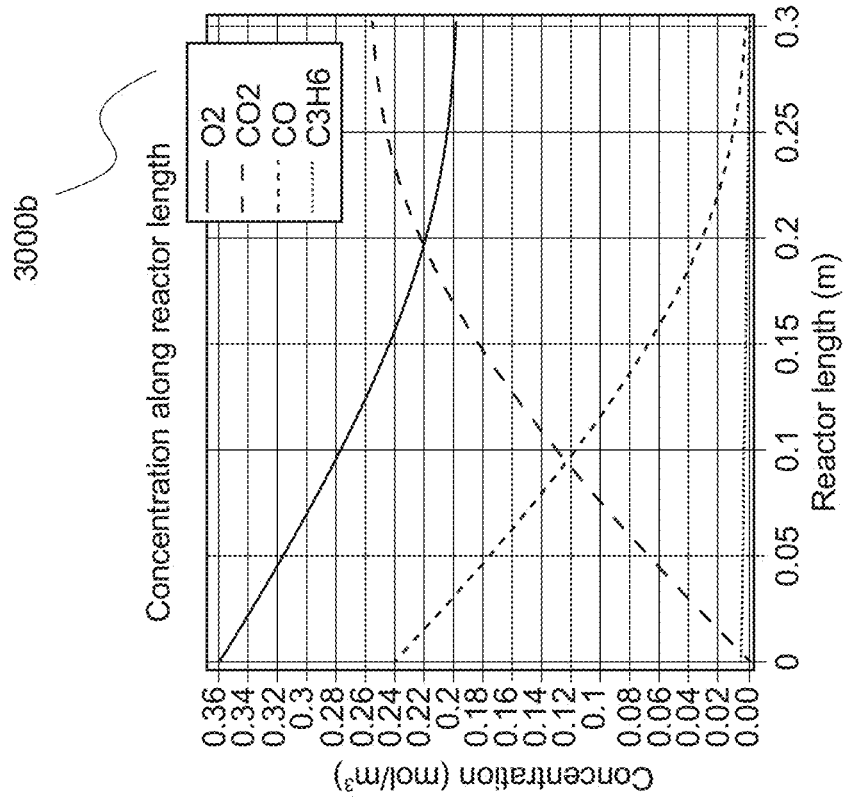
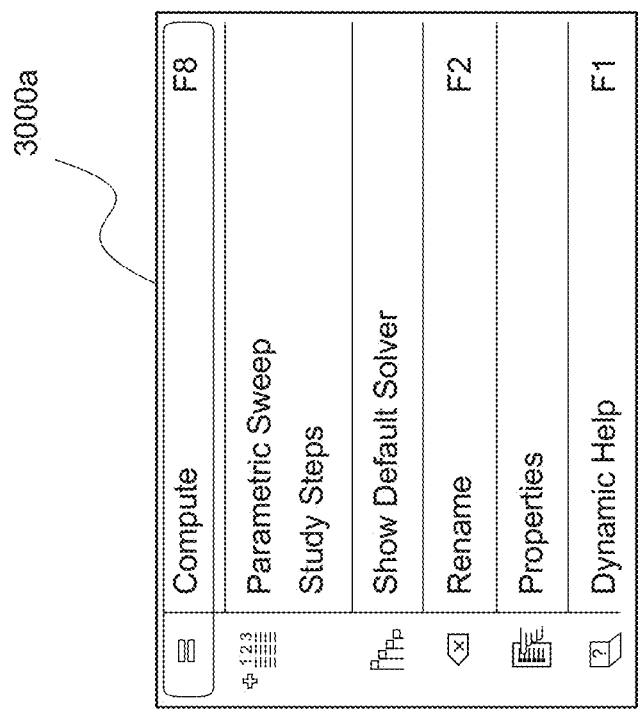
*The concentration of reactants and products along the reactor length.*
FIG 30

$$\Omega \cdot \nabla I(\Omega,s) = \kappa I_b(T) - \beta I(\Omega,s) + \frac{\sigma_s}{4\pi} \int_0^{4\pi} I(\Omega,s)\phi(\Omega',\Omega)\partial\Omega'$$

3100a $$I_b(T) = \frac{n^2 \sigma T^4}{\pi}$$

| Pressure Acoustics |
|---|
| Label: Pressure Acoustics 1 |

▼ Domain Selection

Selection: All domains

| 1 (not applicable) |
|---|
| 2 (not applicable) |
| 3 |
| 4 (not applicable) |
| 5 (not applicable) |
| 6 (not applicable) |

▶ Override and Contribution

▼ Equation

Show equation assuming:

Study 1, Frequency Domain ← 3502

$$\nabla \cdot \left( -\frac{1}{\rho_c}(\nabla p_t - q_d) \right) - \frac{k_{eq}^2 p_t}{\rho_c} = Q_m$$

$$p_t = p + p_b$$

$$k_{eq}^2 = \left(\frac{\omega}{c_c}\right)^2 - k_z^2$$

$$c_c = c, \quad \rho_c = \rho$$

▼ Equation

Temperature:

$T$ User defined 293.15[K]   K

Absolute pressure:

$P_A$ User defined

1[atm]   Pa

▼ Pressure Acoustic Model

Fluid Model:

Linear elastic

Specify:

Density and speed of sound

Speed of sound:

$c$ From material

Densitys:

$\rho$ From material

FIG 35B

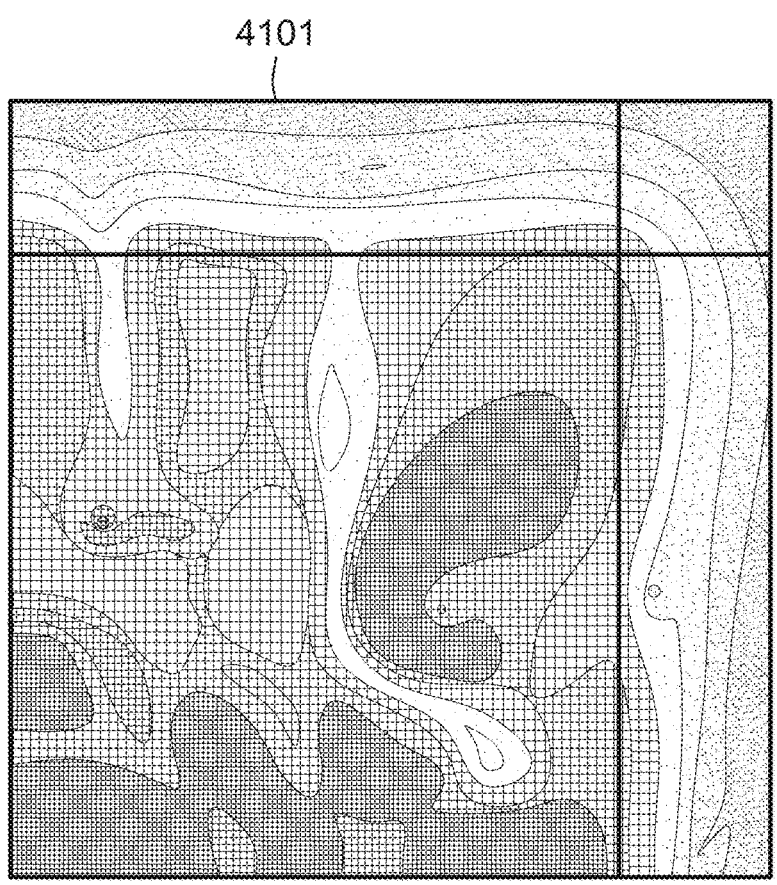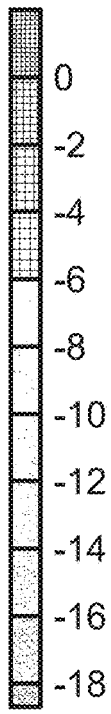
FIG 41A
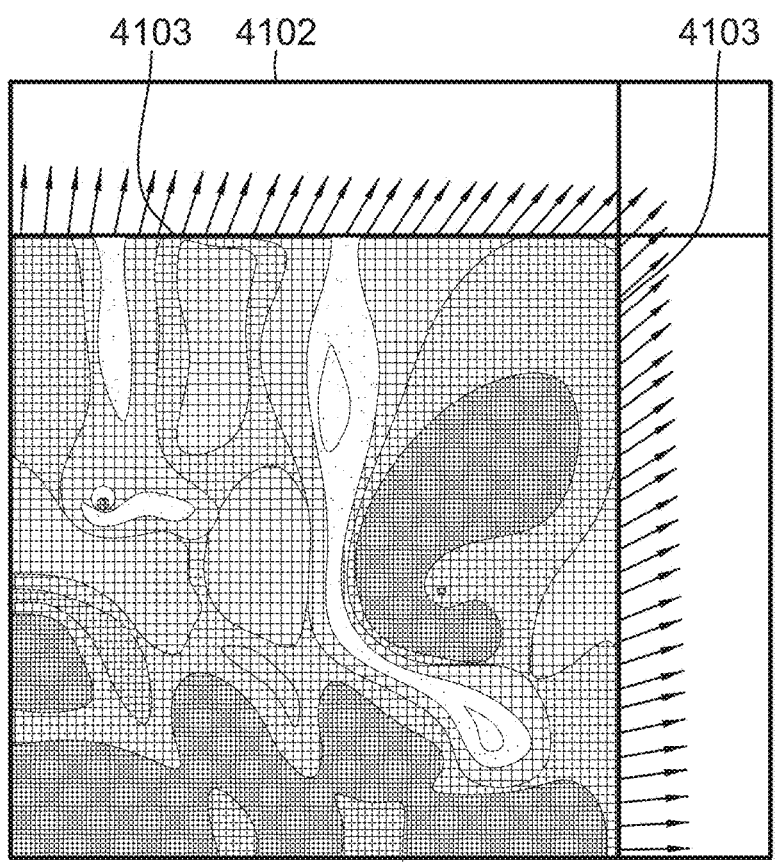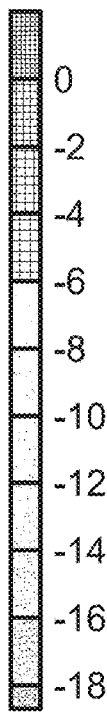
FIG 41B

SYSTEM AND METHOD FOR ADDING AND DEFINING PERFECTLY MATCHED LAYERS FOR A MODEL OF A PHYSICAL SYSTEM

CROSS-REFERENCE TO RELATED APPLICATIONS

This application claims priority to and the benefits of U.S. Provisional Application No. 63/064,051, filed on Aug. 11, 2020, and U.S. Provisional Application No. 63/047,180, filed on Jul. 1, 2020; and this application is a continuation-in-part of U.S. Application Ser. No. 16/045,935, filed Jul. 26, 2018, to be issued as U.S. Pat. No. 10,776,541, which is a continuation of U.S. Application Ser. No. 13/840,664, filed Mar. 15, 2013, now abandoned, which claims priority to and the benefits of U.S. Provisional Application No. 61/760,504, filed on Feb. 4, 2013, the disclosures of which are each hereby incorporated by reference herein in their entireties.

FIELD OF THE INVENTION

The present invention relates generally to systems and methods for modeling and simulation, and more particularly, to techniques for modeling and simulation on a computing system that include defining perfectly matched layers for a model of a physical system.

BACKGROUND

Computer design systems are used to develop product designs and may include graphical user interfaces. Computer design systems can be complemented with packages analyzing a single aspect of a design, such as, structural analysis in conjunction with computer-aided design systems. It would be desirable to have improved design systems that can operate in more complex environments.

SUMMARY OF THE INVENTION

According to one aspect of the present disclosure, a computer-implemented simulation method executable on one or more processors is configured to add and define one or more perfectly matched layers (PMLs) to a model of a physical system. The model describes a wave-related phenomenon represented as a combined set of equations. The simulation method comprises discretized base geometry data of the model of the physical system being defined via one or more processors as a mesh representation of a physical domain. A selection of boundaries or boundary segments is received, via a graphical user interface, that corresponds to at least a portion of the discretized base geometry data. Discretized extra geometry data is defined via the one or more processors, representing a meshed line segment. Physics settings are defined for modeling the physical system via the one or more processors. PML settings inputs are received including coordinate stretching settings. Weak form expressions are formed, via the one or more processors, representing the wave-related phenomenon of the model. The weak form expressions include weak form PML expressions based on (i) one or more of the physics settings being parametrized using discretized base geometry data associated with the boundary or boundary segment selection, (ii) the discretized extra geometry data, and (iii) at least a portion of the PML settings inputs. Matrix data is generated, via the one or more processors, representing an assembling of a stiffness and/or dampening matrix based on the formed weak form expressions. Solution data is generated, via the one or more processors, representing a solution to a simulation of the wave-related phenomenon of the model. The simulation is based on the formed weak form expressions. A graphical representation is generated, via the one or more processors, of at least a portion of the solution data. The graphical representation is configured for display on a graphical user interface.

According to another aspect of the present disclosure, a graphical user interface (GUI) is executed in a computing system comprising one or more processors. The GUI is configured to allow a user to add and define one or more PMLs using product geometry parametrization to a boundary representation of a physical domain in a model of a physical system. The model describes a wave-related phenomenon represented in terms of a combined set of equations. The GUI including GUI elements are configured for implementation of the following acts comprising defining, via one or more processors, discretized base geometry data for the model of the physical system as a mesh representation of a physical domain. A first input is received, via one or more GUIs, representing a user instruction to add a PML to the model. In response to receiving the input to add a PML to the model, a GUI settings window is displayed including selection tools for receiving a second input representing a user selection of boundaries or boundary segments corresponding to at least a portion of the discretized base geometry data. A second input is received, via the GUI settings window selection tools, representing the user selection of boundaries or boundary segments corresponding to at least a portion of the discretized base geometry data. A third input is received representing extra geometry meshing instructions. Extra geometry line segment data is discretized, via the one or more processors, representing an outward direction a PML from the boundary or boundary segment according to the extra geometry meshing instructions. A fourth input is received, via the one or more GUIs, representing one or more physics settings. PML setting data is received, via the one or more GUIs, that includes one or more of coordinate stretching type, PML scaling factor, PML scaling curvature parameter, or wave source location setting. Weak form expressions are formed, via the one or more processors, representative of wave-related phenomenon of the model. The weak form expressions include weak form PML expressions based on at least a portion of the PML settings data, one or more the physics settings parametrized using the discretized base geometry data associated with the boundary segment selection, or the discretized extra geometry data. Matrix data is generated, via the one or more processors, representing an assembling of a stiffness matrix based on the formed weak form expressions. Solution data is generated, via the one or more processors, representing a solution to a simulation of the wave-related phenomenon of the model. The simulation is based on the formed weak form expressions. A graphical representation of at least a portion of the solution data is generated via the one or more processors. The graphical representation is configured for display on the one or more GUIs.

According to yet another aspect of the present disclosure, a GUI is executed in a computing system comprising one or more processors. The GUI is configured to modify a geometry and to generate and combine shape functions for a model of a physical system. The model includes the geometry and physical quantities represented in terms of a combined set of equations. The GUI including GUI elements are configured for implementation of the following acts comprising defining base geometry data representing a base geometry of a physical system represented by a first combined set of equations. The base geometry data is associated with a first model of the physical system. Extra geometry data is defined representing one or more extra geometries for a modified model based on the first model. One or more first user inputs are received via a GUI component. The first user inputs are applied to determine, via the one or more processors, a first set of geometric entity data representing one or more geometric entities of the base geometry of the physical system from which to extend the one or more extra geometries. The determining of the first set of first geometric entity data includes configuring the first set of geometric entity data for forming as Cartesian product data to be added with extra geometry data. Data representing a discretized modified model of the physical system are generated via the one or more processors. The discretized modified model includes the base geometry discretized into a first plurality of finite elements with the base geometry expressed as shape functions. Each of the first plurality of finite elements are of a dimensionality less than or equal to the dimensionality of the base geometry. The discretized modified model includes at least one of the one or more extra geometries discretized into a second plurality of finite elements with at least one of the one or more extra geometries expressed as shape functions. The second plurality of finite elements are of a dimensionality less than or equal to the dimensionality of the one or more extra geometries. The first plurality of finite elements are representative of the base geometry excluding the one or more extra geometries. The second plurality of finite elements are representative of at least one of the one or more extra geometries excluding the base geometry. Cartesian product data is formed, via the one or more processors, representing a Cartesian product of the first plurality of finite elements with the second plurality of finite elements. The forming of the Cartesian product data occurs after the generating of data representing the discretized modified model. Matrix data is generated, via the one or more processors, representing an assembling of a stiffness matrix based on the Cartesian product. Solution data is generated, via the one or more processors, representing a solution to the modified model. The solution is based on the matrix data representing the assembling of the stiffness matrix based on the Cartesian product of the first plurality of finite elements and the second plurality of finite elements, thereby allowing the generation of a finite element model based on the generated non-discretized equation data. The finite elements of the model are at least one of (i) the same or lower dimensionality as the base geometry or (ii) the same or lower dimensionality as the extra geometry, the model describing a physical system of a dimensionality that is the sum of the base geometry dimensionality and the extra geometry dimensionality. A graphical representation is generated, via at least one of the one or more processors, of at least a portion of the solution data. The graphical representation is configured for display on a graphical user interface.

According to further aspects of the present disclosure, one or more non-transitory computer readable media are encoded with instructions, which when executed by one or more processors associated with a design system, a simulation system, or a modeling system, causes at least one or the one or more processors to perform the above method or the above acts associated with a GUI.

The above summary is not intended to represent each embodiment or every implementation of the present disclosure. Rather, the foregoing summary merely provides an example of some of the novel aspects and features set forth herein. The above features and advantages, and other features and advantages of the present disclosure, will be readily apparent from the following detailed description of representative implementations and modes for carrying out the present invention, when taken in connection with the accompanying drawings and the appended claims.

BRIEF DESCRIPTION OF THE DRAWINGS

Features and advantages of the present disclosure will become more apparent from the following detailed description of exemplary implementations thereof taken in conjunction with the accompanying drawings in which:

FIG. 2 illustrates an exemplary a table of terms for geometric entities in different space dimensions, according to some aspects of the present disclosure.

FIGS. 14A to 14B illustrate exemplary materials selection tools for layered structures, according to some aspects of the present disclosure.

FIGS. 18A to 18B illustrate an exemplary menus and a settings window for adding an auxiliary dependent variable to a product of selections, according to some aspects of the present disclosure.

FIG. 20 illustrates exemplary equations and parameters describing modeled reactions, according to some aspects of the present disclosure.

FIG. 21 illustrates exemplary equations describing physical properties of species in the bulk of a modeled reactor, according to some aspects of the present disclosure.

FIG. 22 illustrates an exemplary equations describing physical properties of species in the porous particles of a modeled reactor, according to some aspects of the present disclosure.

FIGS. 24A to 24B illustrate exemplary settings windows for defining parameters and variables in a physics interface for modeling a reactor including porous particles described as an extra geometry, according to some aspects of the present disclosure.

FIGS. 25 to 29 illustrate exemplary settings windows for a bulk reactor and in porous particles included in the reactor, according to some aspect of the present disclosure.

FIG. 30 illustrates an exemplary a plot of concentrations along the reactor length of a modeled reactor, according to some aspect of the present disclosure.

FIG. 31 illustrates exemplary expressions describing absorption and scattering of radiation in a participating media, according to some aspect of the present disclosure.

FIGS. 35A to 35C illustrate exemplary setting windows for receiving physics settings for a model from a user, according to some aspects of the present disclosure.

FIG. 41A illustrates an exemplary graphical representation of a solution of traditional wave-related phenomena modeling implementation using PMLs, according to some aspects of the present disclosure.

FIG. 41B illustrates an exemplary graphical representation of a solution of a wave-related phenomena modeling implementation for the geometry in FIG. 41A using PMLs on a product geometry and representing the stretching direction of the PML using arrows, according to some aspects of the present disclosure.

Figure 1A:
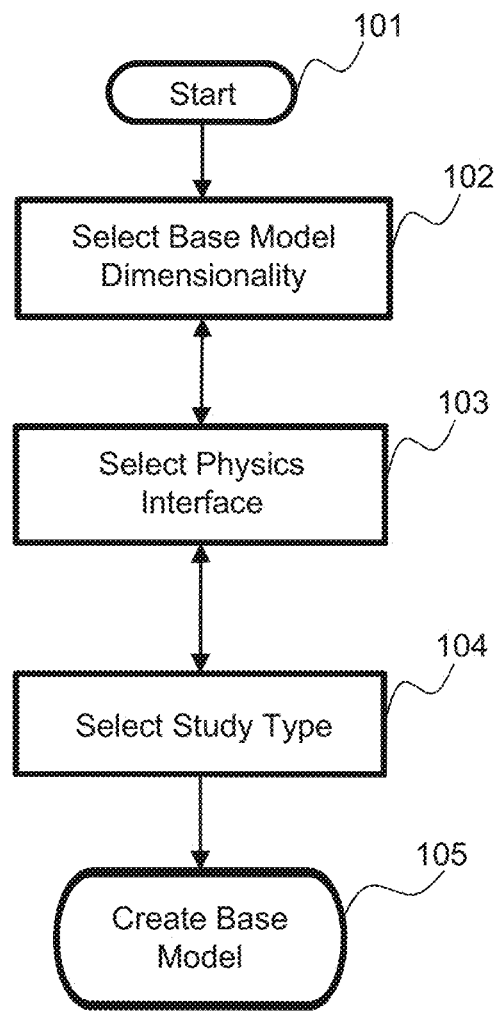
FIGS. 1A to 1E illustrate an exemplary flowchart and wizard for the creation of a base model, according to some aspects of the present disclosure.

While the present disclosure is susceptible to various modifications and alternative forms, specific implementations have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

The various implementations are described with reference to the accompanying figures, where like reference numerals may be used throughout the figures to designate similar or equivalent elements. The figures are not drawn to scale, and they are provided merely to illustrate the instant invention. It should be understood that numerous specific details, relationships, and methods are set forth to provide a full understanding. One having ordinary skill in the relevant art, however, will readily recognize that the various implementations can be practiced without one or more of the specific details, or with other methods. In other instances, well-known structures or operations are not shown in detail to avoid obscuring certain aspects of the various implementations. The various implementations are not limited by the illustrated ordering of acts or events, as some acts may occur in different orders and/or concurrently with other acts or events. Furthermore, not all illustrated acts or events are required to implement a methodology in accordance with the present invention.

While this invention is susceptible of embodiment in many different forms, there is shown in the drawings and will herein be described in detail preferred aspects of the invention with the understanding that the present disclosure is to be considered as an exemplification of the principles of the invention and is not intended to limit the broad aspect of the invention to the aspects illustrated. For purposes of the present detailed description, the singular includes the plural and vice versa (unless specifically disclaimed); the words "and" and "or" shall be both conjunctive and disjunctive; the word "all" means "any and all"; the word "any" means "any and all"; and the word "including" means "including without limitation." Moreover, words of approximation, such as "about," "almost," "substantially," "approximately," and the like, can be used herein to mean "at,", "near," or "nearly at," or "within 3-5% of," or "within acceptable tolerances," or any logical combination thereof, for example.

Exemplary methods, systems, and apparatus for constructing geometries for models of physical systems, and forming product geometries between base geometries and extra geometries are described. The contemplated geometries can be of various dimensions and the forming or computing of a product geometry includes Cartesian products in some implementations. Further exemplary aspects of the present disclosure contemplate defining physical properties, physical quantities, parameters, variables, and boundary conditions on such products, or portions thereof, that are further applied to describe a model of a physical system as a combined system of equations. In additional exemplary aspects of the present disclosure, the model is discretized and provided as a system of equations to an equation solver that solves the system of equations and provides a useful solution to an operator of a modeling or simulation system.

The exemplary aspects described herein can be particularly useful and provide a computational advantage for methods, systems, and apparatus for modeling and simulation of physical systems. Physics interfaces for modeling and simulation systems, such as physics and multiphysics modeling systems, include systems that provide for specific dimensionalities of geometries for the physical systems being modeled. Typical dimensions of geometr(ies) for a physical system that is being modeled include dimensions between zero and three. Some physics interfaces include systems for modeling on geometries of specific dimensions. For example, shell physics interfaces include systems for modeling surfaces embedded in three dimensions, or beam physics interfaces include systems for modeling line segments embedded in three-dimensions. Additionally, some physical systems that are the subject of modeling are described by a phase space that includes a higher dimensionality than three. For example, in describing spatial and velocity distributions of a gas, three dimensions can be applied for describing position and three dimensions for describing the velocity. It is contemplated that modeling such a system can include describing or defining the velocity as a field with values in each position with each value of the field representing a velocity density in that respective position.

It is contemplated that it would be desirable for a modeling system to represent or define geometries of physical systems as base geometries and to also be able to define one or more extra geometr(ies). For example, in some aspects, it can be desirable for a model of the spatial and velocity distribution of gas to include representing the spatial distribution as a three-dimensional geometry, also referred to as a base geometry, and to represent the velocity distribution as another three-dimensional geometry called an extra geometry. The phase space can then be represented by a Cartesian product or product geometry of at least some of the geometric entities of the base geometry and some or all of the geometric entities of the extra geometry. Geometric entities can be understood as being at least a part or portion of a specific dimension of the geometry for a model.

A Cartesian product or product geometry is exemplified as an operation that can be implemented between two sets of data, in this case geometry data, by forming all possible combinations of objects, or geometric entities, in one set of data with objects, or other geometric entities, in the other set of data. For example, assuming a first set of data is represented by $Y=\{1, 2, 3\}$ and a second set of data is represented by $Z=\{a, b, c\}$, the following outcome is an exemplary product geometry of the two exemplary sets of data: $Y \times Z=\{(1, a), (1, b), (1, c), (2, a), (2, b), (2, c), (3, a), (3, b), (3, c)\}$.

A formation of a product geometry between multiple sets of geometry data that represent physical systems of a model can be observed in different ways. For example, in some aspects, on a set of non-discretized geometries or geometric entities, a product geometry can be formed that includes all tuples of such non-discretized geometries or geometric entities. When implemented on a modeling system, such a product geometry can create either tuples of identifiers or some sort of indexes for the geometries or geometric entities or pointers to such identifiers or indexes. It is also contemplated in some aspects that a Cartesian product can be expressed in setting the start and end conditions for several nested loops or similar algorithm operations for creating such tuples.

In some aspects of a multiphysics modeling system, including modeling systems identified elsewhere herein, systems of coupled partial differential equations ("PDEs") may be discretized using finite elements in a base geometry and in the geometry in the extra dimension, which are associated with model(s) of a physical system. A Cartesian product of two sets of discretized geometries can include all tuples of the mesh element points that can be created between the two sets. It is contemplated that in some aspects a form of linking or concatenation can then be completed on the tuples. For example, if one tuple created from two exemplary two-dimensional geometries, such as ((1, 2), (5, 6)), includes two ordered coordinate pairs, the tuple can be modified into (1, 2, 5, 6) which would be understood to be a geometric coordinate or data point in a four-dimensional coordinate space.

It is also contemplated that on tuples of mesh element points, degrees of freedom ("DOF") can also be defined for dependent variables. Furthermore, in some aspects, shape functions can be defined on each geometry where discretization is performed. For each tuple, shape functions can form an expression that may be product. It is then contemplated that the discretized system may be solved on the product geometry between the base geometry and the one or more extra geometries.

Methods and system for setting up and solving models, such as multiphysics models based on coupled systems of PDEs, along with other modeling systems are described in U.S. Pat. No. 8,219,373, issued Jul. 10, 2012; U.S. Pat. No. 7,623,991, issued Nov. 24, 2009; U.S. Pat. No. 7,519,518, issued Apr. 14, 2009; U.S. Pat. No. 7,596,474, issued Sep. 29, 2009; and U.S. Patent Application Publication No. 2012/0179426, published Jul. 12, 2012. Ser. No. 13/184, 207, filed Jul. 15, 2011, each of which are hereby incorporated by reference herein in their entireties. These published patent documents describe, for example, method for setting up and executing multiphysics simulations, including several coupled physical phenomena, by receiving inputs in the form of physical properties that may be expressed in terms of physical quantities. In addition, the above-referenced U.S. patents and patent application disclose methods for setting up problems using physical properties, physical quantities, and physical phenomena described using partial differential equations (PDEs). These published patent documents provide for methods and systems for setting up and solve multiphysics problems using predefined application modes that are otherwise referred to in the present descriptions as physics interfaces. Components of the physics interfaces can include parameters, variables, physical properties, physical quantities, boundary and initial conditions, and solvers with settings and menus. These settings and menus may be tailored for the specific physics instead of using the generic mathematical settings. In addition, these published patent disclosures also describe methods for PDE modes, also referred to as PDE interfaces, in the cases where predefined physics interfaces are not available. The use of the generic PDE modes and PDE interfaces for setting up multiphysics problems requires knowledge about the description of physical properties, physical quantities, and physical phenomena in terms of PDEs.

It can further be desirable for modeling methods and system to include processes for defining coupled systems of equations, including coupled systems of differential equations and PDEs, on product geometries. It is further desirable for modeling methods and systems to include processes for solving coupled system of equations on product geometries. It is yet further desirable for modeling systems and methods to include processes for adding additional or extra geometries as Cartesian products to a base geometry of a model of a physical system.

In some aspects of the present disclosure, methods and systems for forming different product geometries (e.g., a product geometry of all tuples, a product geometry expressed as start and end conditions for creating tuples) are contemplated. In some aspects, a user of the modeling system can extend a physics interface to solve problems on product geometries of arbitrary dimensionality. It is also contemplated that physics interfaces can be provides that build models that are defined on product geometries. For example, in the exemplary gas model discussed above, a user of a modeling system could draw or provide the space in which the gas is contained and the velocity distribution can be predefined as a sphere. Then, in some aspects, a product geometry between the user defined spatial space and the predefined sphere can be formed automatically by the contemplated system and methods of the present disclosure. It is further contemplated that formation of a product geometry, such as in the example of the gas, including determining the predefined sphere and the definition of extra geometries can occur within the modeling system without being displayed on a graphical user interface to the user of the modeling system.

In some aspects of a modeling system, it can be desirable to model thin structures using shells where physical propert(ies) are described as function(s) of physical quantit(ies) along the thickness of the shell. For example, in some aspects of the present disclosure, a method for adding a thickness direction in the form of an extra dimension is contemplated using an extra geometry that is a line segment. The exemplary line segment can be divided into several sub-line segments, and the sub-line segments can include or be defined with different physical properties such as material properties. This aspect can be particularly desirable because it allows physical quantities such as displacements, stresses, and strains to be modeled along the thickness of the shell. The exemplary aspect of thin structure modeling by applying shells and extra geometries is particularly desirable and provides certain computational advantages. For example, shell problems such the one described can also be solved by modeling the shell as a three-dimensional solid. However, the meshing of a shell and adding an extra geometry is a preferable and better way of defining a thin structure than defining it as a full three-dimensional solid, particularly where the dimensions of the structure are several orders of magnitude larger than the thickness of the thin shell. An example of such a thin shell structure may be an airplane fuselage.

Other exemplary physics interfaces where it can be beneficial to model the physical system using product geometries of a base geometry and one or more extra geometries include beams, reactors including porous particles, radiation in a participating media, perfectly matched layers ("PMLs"), and others. For example, for a beam, the data representing a beam cross section is defined as an extra geometry and data representing the beam axis is defined is a base geometry. For a reactor including porous particles, data representing the particles defines an extra geometry and data representing the bulk of the reactor represents the base geometry. For radiation in a participating media, an extra geometry can model the directional dependence and any wavelength dependence while the base geometry provides a spatial distribution.

For PMLs, data representing boundaries is defined as a base geometry and data representing the PMLs is defined as one or more extra geometries. The PMLs are added to the boundaries by forming product geometry data representing a product geometry between the base geometry and the one or more extra geometries. It is further contemplated that for the PMLs, a scaling operation can also be defined on the product geometry.

It is contemplated that in some aspects equations, variables, operators, materials, boundary conditions etc. can be defined on a portion of a product geometry, which may also be referred to as a product of selections. In some aspects, such portions of a product geometry can be constructed, formed, or computed as Cartesian products between some of the geometric entities forming a product geometry in a base geometry, and some of the geometric entities in extra dimensions forming a product geometry. Some aspects of the present disclosure include a method for making such selections by selecting base geometry entities and extra geometry entities in a graphical user interface.

It is further contemplated that in some aspects various properties can be defined on product geometries or parts thereof by defining the desired properties on entities of an extra geometry. The properties defined on the entities of the extra geometry can then be applied to a Cartesian product of base geometry entities and the extra geometry entities. For example, a thickness direction of a multi-layer shell can be described or defined as an ordered set of layers where each layer includes material properties and a thickness. From such an ordered set of layers, a line segment can be constructed or provided automatically with several sub-line segments with each segment representing an extra geometry entity, which can include material properties being defined upon it. The line segment is the extra geometry of an extra dimension and can automatically form a product geometry with user-defined or pre-selected base geometry entities in the form of a shell. The material properties and certain other properties defined on the extra geometry entities can then applied to the portions of the product geometry, of which the extra geometries entities are a part of.

It is contemplated that the simulation methods for modifying a geometry of a model of a physical system can be executed as a standalone system that interfaces or connects with an engineering analysis system, such as a multiphysics modeling system. It is also contemplated that the simulation method for modifying a geometry can be one of a plurality of modules or routines that comprise an engineering analysis system. The simulation methods and systems can include or be connected with a user interface, such as a graphical user interface, that seeks inputs and displays instructions to a user. The simulation methods for modifying a geometry of a model of a physical system can be executed on one or more processors associated with various computing systems described elsewhere herein including, among other things, the computer systems and apparatus described for the multiphysics modeling system.

It is contemplated that is would desirable for the simulation method to be available in, or accessible to, an engineering analysis system, such as a multiphysics modeling system, as part of generating a model described in a model object (e.g., a model data structure including data fields and methods along with their interactions) in accordance with an object-oriented programming language (e.g., C++, C#, Java®).

In certain aspects of the present disclosure, a system or simulation method for generating a modified geometry of a model of a physical system is contemplated that may be based, at least in part, on PDE formulations. The modified geometry may be generated using inputs received via a dedicated graphical user interface. The modified geometry is contemplated to be useful for engineering analysis processes operating on computing system(s) that include modules or routines for performing finite element analysis methods, finite volume methods, computational fluid dynamic methods, multiphysics methods, and the like. Computing systems embodying the engineering analysis processes may be configured with one or more graphical user interfaces that allow a system user to input and execute simulations. The computing systems may include some of the non-limiting exemplary routines or methods described above and can further include different interfaces for different types of simulations. Different user interfaces may, for example, be provided for fluid flow, heat transfer, electromagnetic, and/or structural mechanics simulations. Simulations and associated interfaces for other engineering or physics phenomena are also contemplated for computer-aided engineering analysis systems.

Systems having a dedicated graphical user interface for modifying a geometry of a model of a physical system are contemplated in certain aspects of the present disclosure. For example, a computing system may include a graphical user interface for defining the parameters, variables, physical properties, physical quantities, and/or physics interface features for a desired physics phenomena associated with a desired analysis or simulation. It is contemplated that the various routines or methods associated with the system can be executed locally on, and/or remotely through network connection(s) to, one or more processing unit(s) executing engineering analysis or simulation systems.

One exemplary aspect of an engineering analysis method operating on a computing system that is contemplated by the present disclosure includes routines for setting up and solving multiphysics problems for simulations that may have several coupled physical phenomena. Input(s) for the analysis method(s) can be received in a form representative of physical properties that are further expressed in terms including physical quantities. The engineering analysis methods can also include routines for setting up problems using physical properties, physical quantities, and physical phenomena described using PDEs. It is contemplated that the setting up and solving of a multiphysics problem using the exemplary engineering analysis method can be accomplished via predefined physics interfaces. In addition, the setting up and solving of multiphysics problems may also be accomplished using PDE interfaces, which may also be referred to as PDE modes in situations where predefined physics interfaces are not available. It is contemplated that the use of the generic PDE interfaces for setting up a multiphysics problem can be accomplished by describing the physical properties, physical quantities, and physical phenomena in terms of PDEs.

Computing systems may be used for performing the different tasks described in the present disclosure. One aspect for using a computing system includes executing one or more computer programs, including engineering analysis components and methods, stored on computer readable media (e.g., temporary or fixed memory, magnetic storage, optical storage, electronic storage, flash memory, other storage media). A computer program may include instructions which, when executed by a processor, perform one or more tasks. In certain embodiments, a computing system executes machine instructions, as may be generated, for example, in connection with translation of source code to machine executable code, to perform modeling and simulation, and/or problem solving tasks. One technique, which may be used to model and simulate physical phenomena or physical processes, is to represent various physical properties and quantities, of the physical phenomena or physical processes being modeled and simulated, in terms of variables and equations or in other quantifiable forms that may be processed by a computing system. In turn, these equations or other quantifiable forms may be solved by a computing system configured to solve for one or more variables associated with the equation, or the computer may be configured to solve a problem using other received input parameters.

It is contemplated that computer programs for modeling and simulating physical phenomena or physical processes may provide many advantages particularly as the complexity of the physical phenomena or physical processes being modeled and simulated increases. For example, in certain aspects a user can combine one or more physical phenomena into a multiphysics model, as part of, for example, an engineering analysis. To further illustrate this example, a user may combine phenomena described by chemical kinetics and fluid mechanics, electromagnetic phenomena and structural mechanics, or other physics phenomena. Such multiphysics models may also involve multiple physical processes. For example, a process may be combined that includes an amplifier powering an actuator, where both the amplifier and the actuator are a part of one multiphysics model. Multiphysics modeling can also include solving coupled systems of partial differential equations (PDEs).

It may be desirable in certain aspects to model physical quantities of coupled multiple processes using different sets of PDEs, defined for different geometries and/or in different coordinate systems, to represent the different coupled multiple processes. It is contemplated that in certain embodiments, systems of PDEs defined for multiple geometries can be desirable. PDEs can provide an efficient and flexible arrangement for defining various couplings between the PDEs within a single geometry, as well as, between different geometries.

Referring now to FIGS. 1A-1E, an exemplary flowchart and wizard for the creation of a base model is illustrated according to some aspects of the present disclosure. In FIG. 1A, an exemplary flowchart is illustrated for a process for creating or forming a base model. It is contemplated that a base model generally does not include a base geometry until such base geometry is created, imported, or retrieved. The steps in the flow chart may be implemented, for example, in a multiphysics or other type of physics simulation system. At least a portion of each of the steps can be implemented in the form of graphical user interfaces ("GUIs") displayed by the system to the user of the modeling system.

A base model is a model including one or more physics interfaces. The exemplary system for creating the base model in FIG. 1 includes options for selecting dimensions that include 0-D, 1-D, 1-D axisymmetric, 2-D, 2-D axisymmetric, or 3-D. The base model can include geometries, also referred to as base geometries. In some aspects, base geometr(ies) can be constructed or determined from geometric primitives and operations, by importing a file or by interfacing the modeling system with computer-aided design ("CAD") system or by otherwise receiving or inputting the geometry into the modeling system. The geometry can include a collection of geometric entities and the entities can be connected manifolds, such as volumes, surfaces, curves, or vertexes, that are also referred to as points. A summary of exemplary modeling terms applied to some geometric entities is included in FIG. 2 where a modeling term can depend in some situations on the dimensions of the geometry.

Figure 1B:
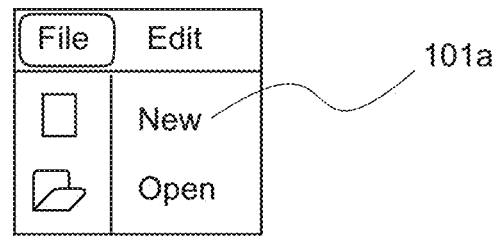
Figure 1C:
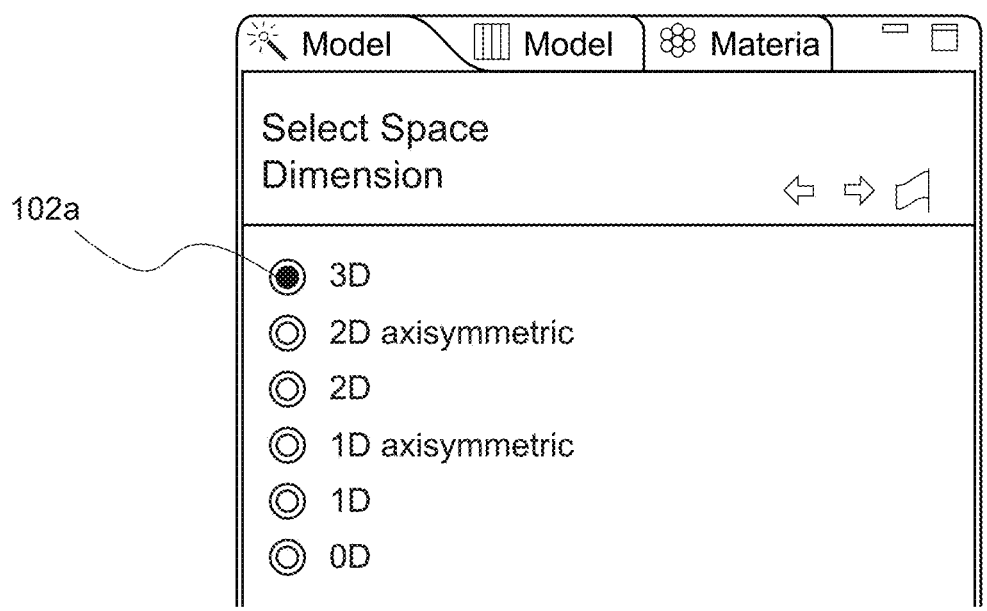
Figure 1D:
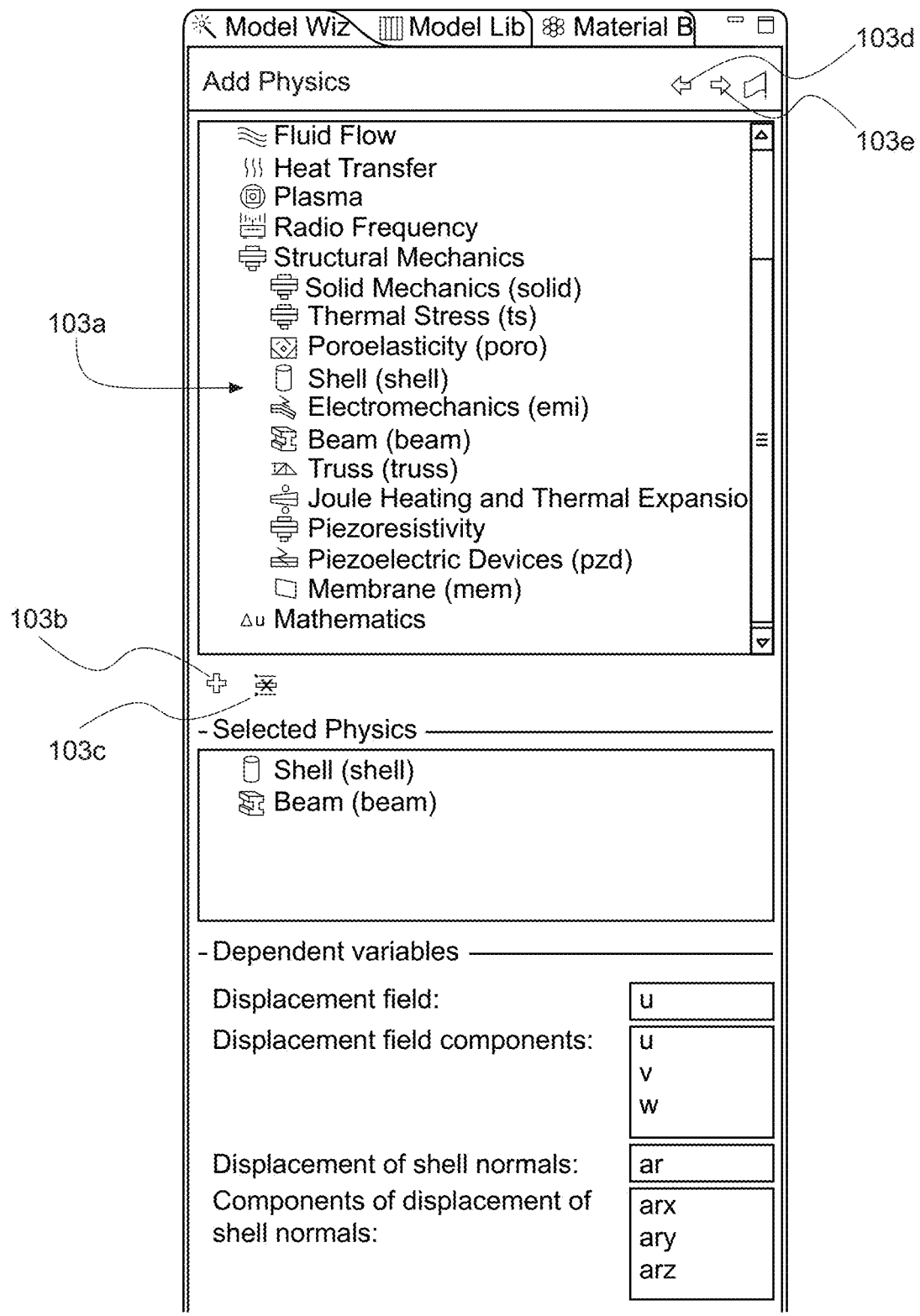

Referring back to FIG. 1A, at step 101, the process for creating the base model is commenced and this can be done via the exemplary aspect illustrated in FIG. 1B of selecting the "New" icon 101a in dropdown menu presented in a GUI. Next, in step 102, the dimension of a base model is specified or determined. One exemplary aspect of specifying the dimension is illustrated in FIG. 1C where a system user can select the base model dimension from a list of options displayed in a GUI. In this example, a 3D icon or button 102a is selected, though any one of several options are available. Next, at step 103, an exemplary interface with a menu of physics interface options is displayed to a user, as illustrated in FIG. 1D. Selections of one or more physics interfaces can be received by the modeling system and applied to the base model. For example, the user can select from one or more physics interfaces included in a physics interface lists 103a in a wizard. A desired physics interface can then be added to a base model by selecting the interface listing itself or a corresponding icon 103b. An added physics interface can also be removed by selecting a previously added physics interface and selecting a "remove" icon 103c. In the exemplary aspect of FIG. 1D, the user has selected shell and beam physics, though any of the listed physics or others can be selected. As discussed here and elsewhere in this disclosure, it is contemplated that the physics interfaces can include operations for defining variables, parameters, expressions, initial values, shape functions, solvers, and settings for a base model. For example, the physics interfaces can include expressions in the form of user editable partial differential equations (PDEs) expressing physical quantities and physical properties. The variables, parameters, expressions, initial values, shape functions, solvers, and settings can further include identifiers that may be assigned automatically and be unique to the particular modeling system. It is contemplated that the variables, parameters, expressions, initial values, shape functions, solvers, and settings can be accessible to and changed by the user.

Figure 1E:
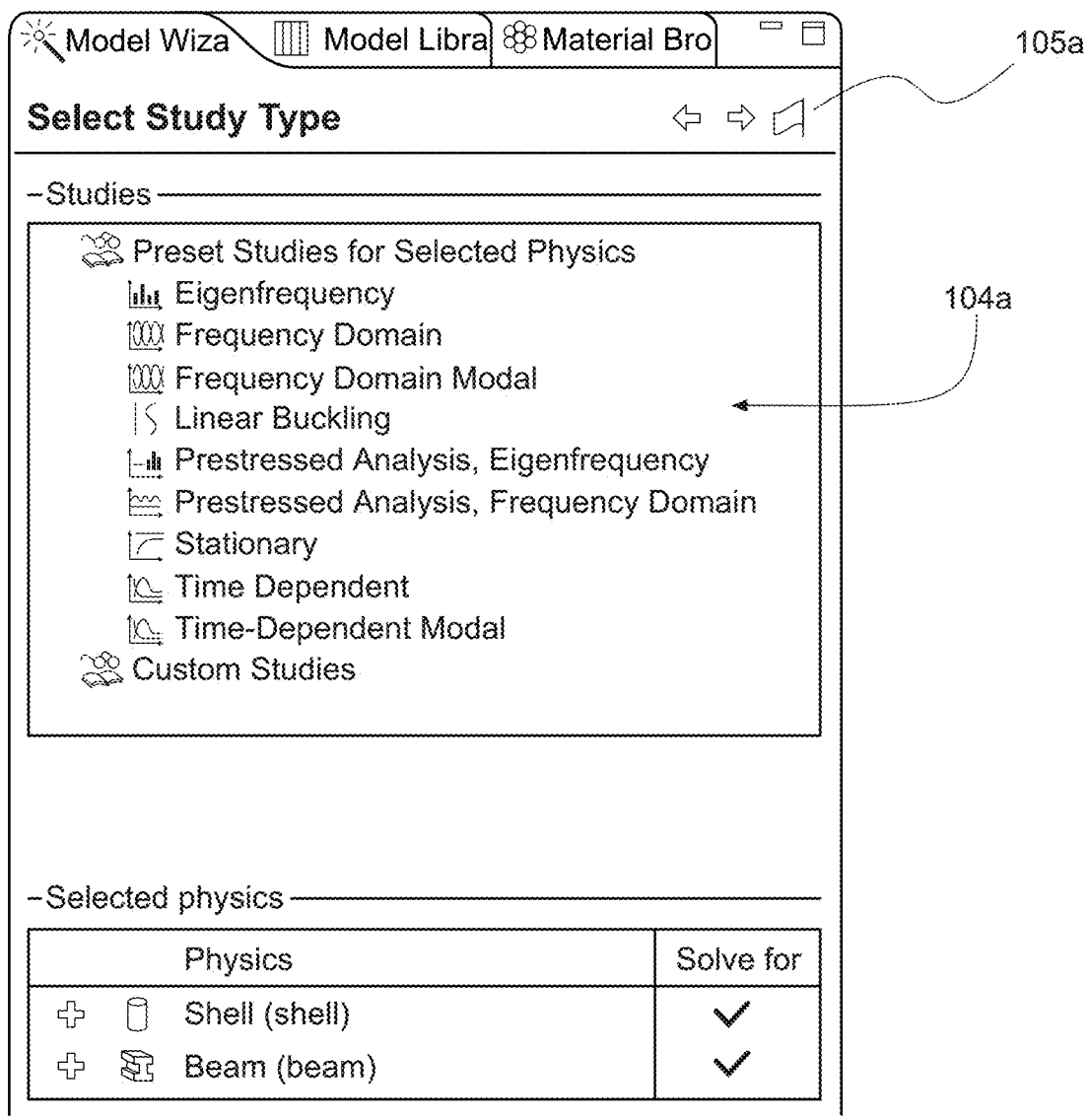

Next, at step 104, a selection can be received for a study type to be implemented for a simulation including the base model. For example, an exemplary study type list 104a can be displayed to a user from which a study type can be selected, as illustrated in FIG. 1E. A study type can define a sequence of study steps including stationary, eigenvalue, eigenfrequency, or time dependent study step sequences, along with others. In one exemplary aspect, a study can include implementing a stationary study step that can then be used to compute the initial conditions for a subsequent time-dependents study step.

Finally, at step 105, the exemplary process of creating a base model can be finalized by selecting a "Finish" icon 105a or through some other trigger. A created or form base model can include a set of predefined variables, parameters, physical properties, physical quantities, boundary conditions, initial conditions, and solvers that are determined according to user selections in the previous steps of the base model creation process. It is contemplated that a final base model can be displayed and otherwise accessed via additional interfaces displayed by the modeling system. To the extent a user would to edit the base model, in some aspects it is contemplated that a user may go back or proceed to the next step in the process by selecting the "back" icon 103d or "forward" icon 103e or finish the process by selecting the "finish" icon 105a. It is also contemplated that a user can omit making selections in steps 103 and 104 by making similar selections; in some aspects this can be done using the same or similar icons (e.g., 103d, 103e, 105a). Furthermore, the process can proceed immediately to step 105 at any time by selecting the "finish" icon 105a, bypassing any intermediate steps.

Figure 3A:
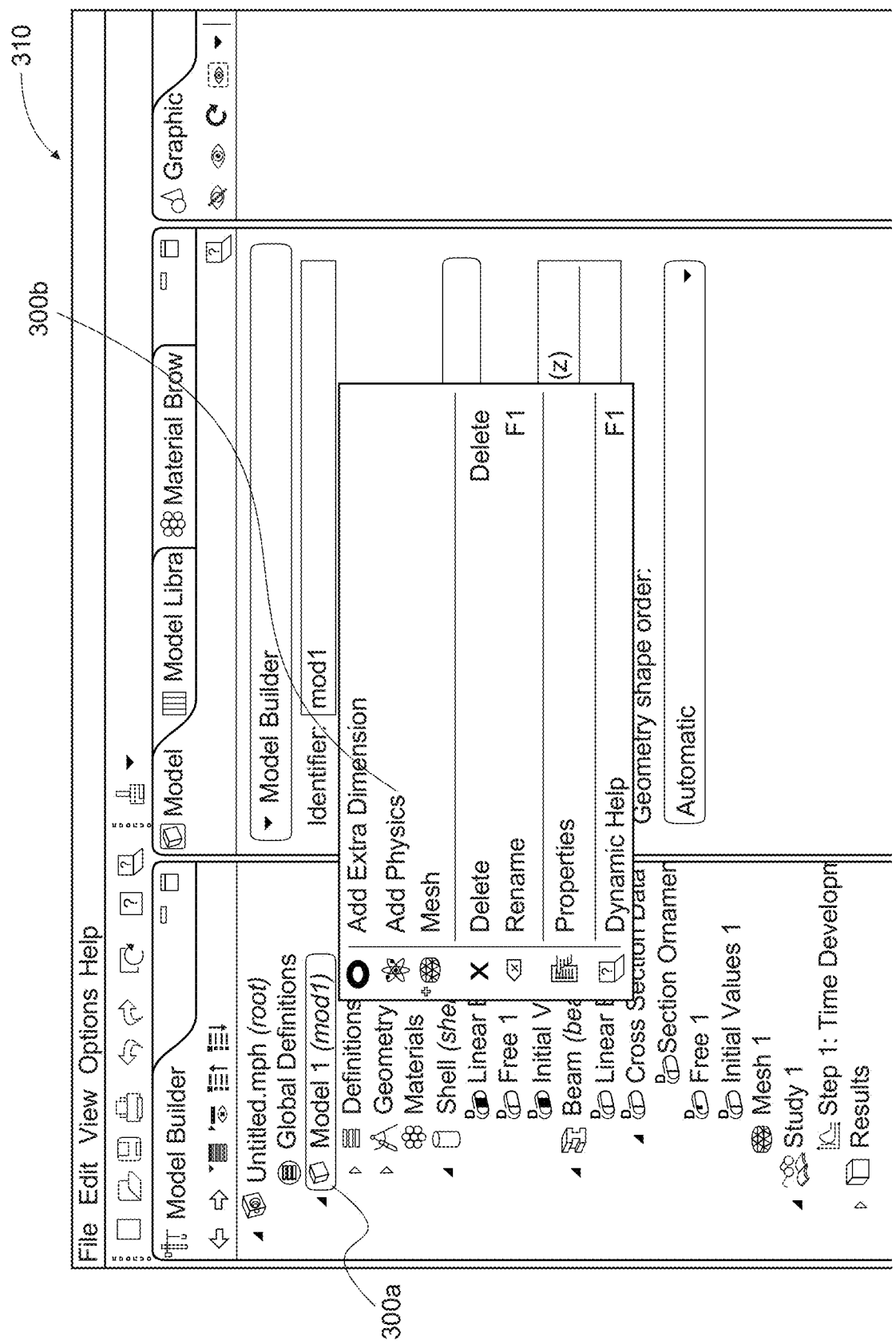
FIGS. 3A to 3B illustrates exemplary menus for adding a physics interface and study to a base model, according to some aspects of the present disclosure.
Figure 3B:
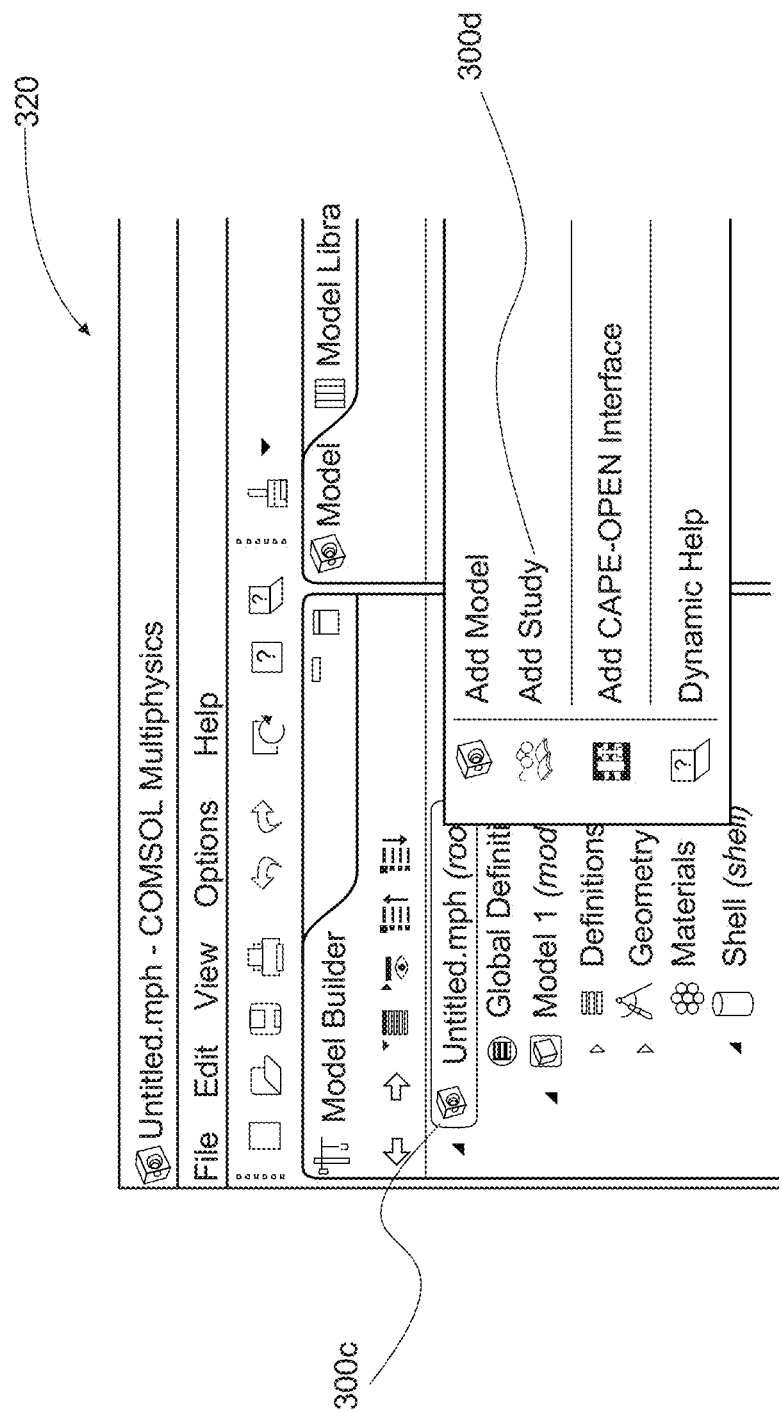

Referring now to FIGS. 3A-3B, exemplary GUIs 310, 320 with menus are illustrated for adding a physics interface and study to a base model, according to some aspects of the present disclosure. In some aspects, if the user omitted to make selections of physics interfaces or study type in method steps 103 or 104, or wants to make additional choices, the user may add additional physics interfaces or study types to a base model. The user may do so by selecting the base model node 300a and further selecting an "add physics" icon 300b from a subsequent menu. The process can then proceed to the exemplary physics interface list 103a in FIG. 1D. Similarly, a user may add a study by selecting a root node 300c in FIG. 3B from a the model builder window and further selecting an "add study" icon 300d, also from a subsequent menu, and then the process can proceed to the exemplary study list 104a in FIG. 1E.

Figure 4A:
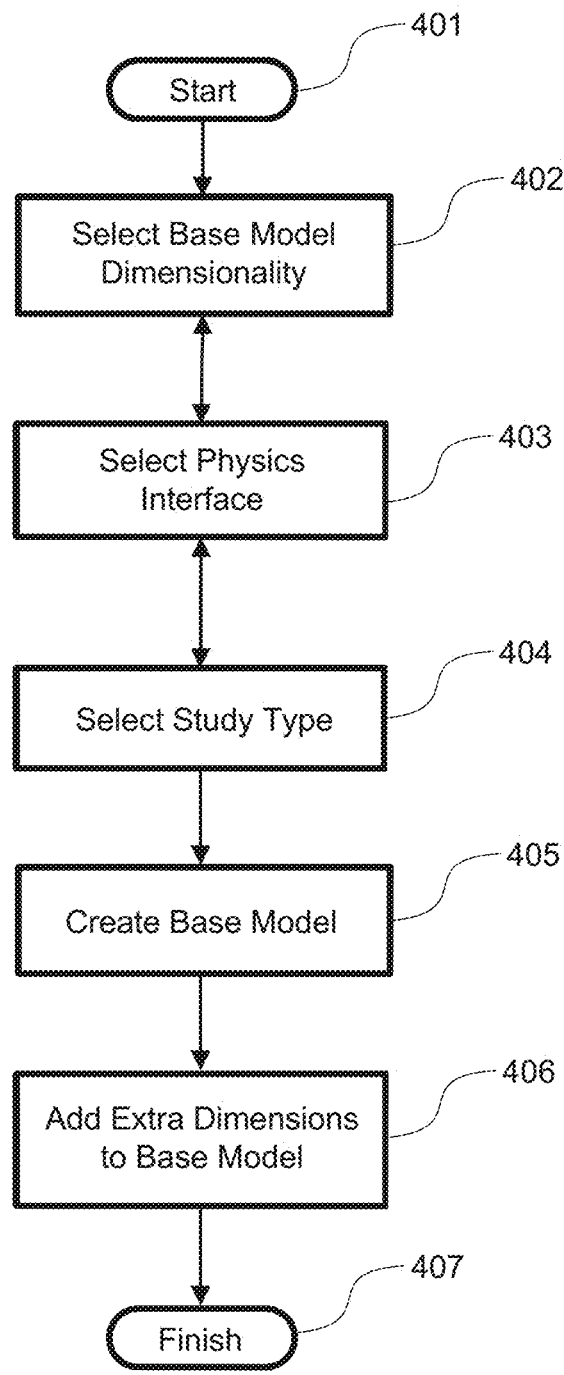
FIGS. 4A to 4C illustrate an exemplary a flowchart and wizard for the creation of an extra dimension, according to some aspects of the present disclosure.
Figure 4B:
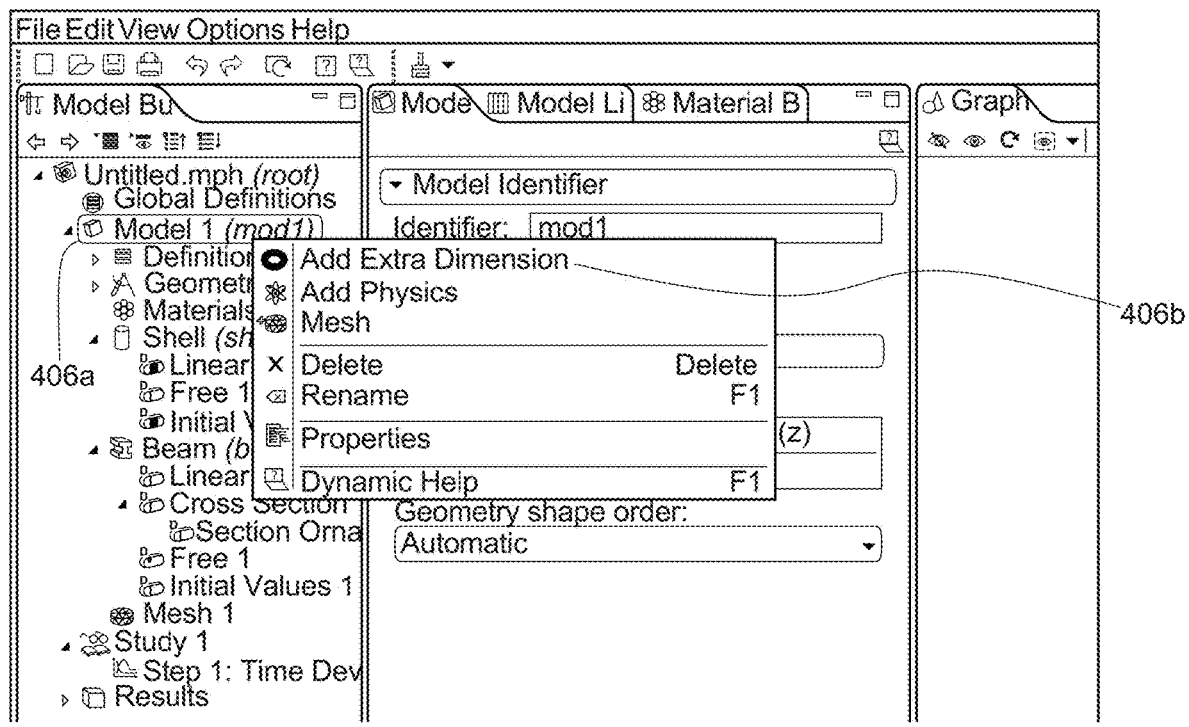
Figure 4C:
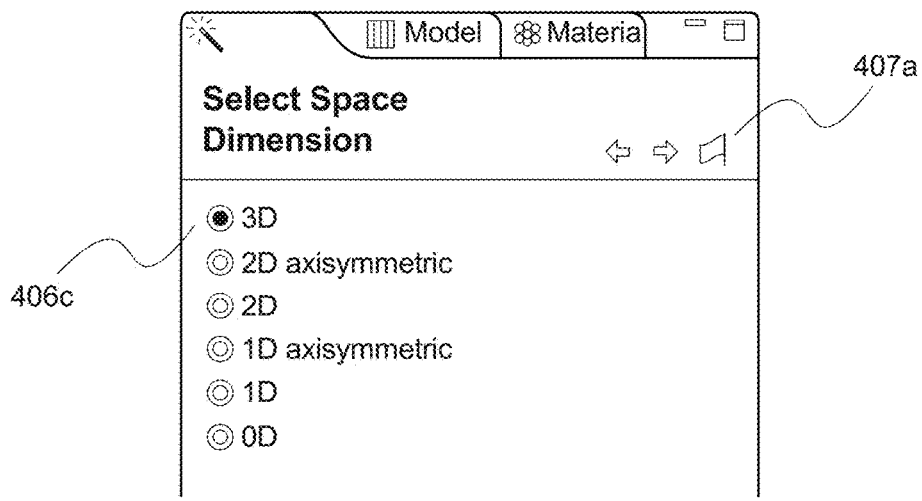

Referring now to FIGS. 4A-4C, an exemplary flowchart and wizard for adding one or more extra dimension to a base model is illustrated, according to some aspects of the present disclosure. It is contemplated that extra dimensions may be added as child features to a base model. The child features can be described in 0-D, 1-D, 1-D axisymmetric, 2-D, 2-D axisymmetric or 3-D. It is contemplated that an extra dimension feature can further include an extra geometry, where settings for physical quantities and physical properties can be defined.

In some aspects of the disclosed simulation systems and methods for modifying a base geometry or otherwise adding extra dimensions, physics interfaces of a modeling system can include instructions or operations for automatically defining extra dimension features. For example, the modeling system can include predefined variables, parameters, physical properties, physical quantities, boundary conditions, and initial conditions for a set of extra dimensions. Solvers may also be adapted or configured for solving models that include base geometries or base model with extra dimensions added thereto.

In some aspects of a modeling system, extra dimension features can be added manually to a base model, such as where an extra dimension feature is not predefined in a physics interface. In these situations, variables, parameters, physical properties, physical quantities, boundary conditions, initial conditions, and solvers are defined manually in the extra dimensions.

In FIG. 4A, steps 401 through 405 are similar to the process described in FIGS. 1A-1E for forming or creating a base model that includes a base geometry. Then, at step 406, an extra dimension feature is added to the base model. In one exemplary aspect of step 406, GUI(s) such as the one(s) illustrated in FIGS. 4B and 4C are displayed to a user of the modeling system that allow selection(s) to be received first of the base model node 406a and then of an "Add extra dimensions" icon 406b that may be displayed in a context menu or otherwise. The user can then be provided the option to select a button 406c or icon associated with the dimension (e.g., 1-D, 1-D axisymmetric, 2-D, 2-D axisymmetric, 3-D) of the extra dimensions feature. The selection can be made, for example, via a dimension list in a separate window or via the wizard previously described in FIGS. 1A-1E.

It is contemplated that a physics interface in the modeling system can be configured to automatically define settings for the one or more extra dimensions following a user's selection or activation of extra dimensions. In certain aspects, it is also contemplated that a physics interface can be predefined to include extra dimensions by default. The below discussion includes some examples of situations where extra dimensions can be automatically generated.

In some aspects, a GUI can be presented to a user that receives selections for implementing a process to automatically add perfectly matched layers to a base geometry. The process can further automatically define the PMLs following the receipt of a user's selection to add PMLs to a domain.

In some aspects, a GUI can be displayed to a user for selecting a shell physics interface. It is contemplated that the shell physics interface can be configured to generate a predefined extra dimensions feature for describing certain physical quantities and physical properties along the thickness of a shell. Such an extra dimension feature can, for example, be added by a modeling system user to allow for some customization of a model, or the extra dimension feature can be included by default for certain shell interfaces. For example, shell interfaces for thick or nonlinear shells may by default include a 1-D extra dimensions feature for describing physical properties as functions of physical quantities along the thickness of the shell.

In some aspects, a GUI can be displayed to a user for selecting a beam physics interface that includes extra dimension features for describing or defining a cross section of a beam. It is contemplated that the extra dimension features can be activated by the user based on selection, for example, for manually defining cross section(s), or the extra dimension features can be included based on defaults for certain predefined cross sections. For example, an H-beam interface may by default include a 2-D extra dimensions feature that includes a description of the H-cross section of the beam.

It is also contemplated that in some aspects a GUI can be displayed to a user for selecting a physics interface for modeling reactors with porous particles. The interface can include, for example, a predefined 1-D extra dimensions feature for describing transport and reactions along the radius of the particles. The extra dimension feature can be activated by a user or it may be included by default in the physics interface. For example, a physics interface for lithium-ion battery modeling can by default include a predefined 1-D extra dimension feature for describing lithium intercalation in graphite particles.

In some aspects, a GUI can be displayed for selecting a physics interface for modeling heat transfer that includes an extra dimension feature for describing radiation along an independent variable for wavelength. It is contemplated that while an extra dimension in this exemplary aspect may not have a geometric physical meaning it is a useful alternative for modeling heat transfer and radiation effects. Similarly, an extra dimension can be applied in another exemplary aspect to model along a coordinate that represents energy in the Boltzmann equation.

The process of adding selected extra dimensions to a base model, as exemplified above and in the context of the exemplary aspects described herein, can be finalized at step 407 by a user selecting a "finish" icon 407a in the GUI exemplified in FIG. 4C.

Figure 5A:
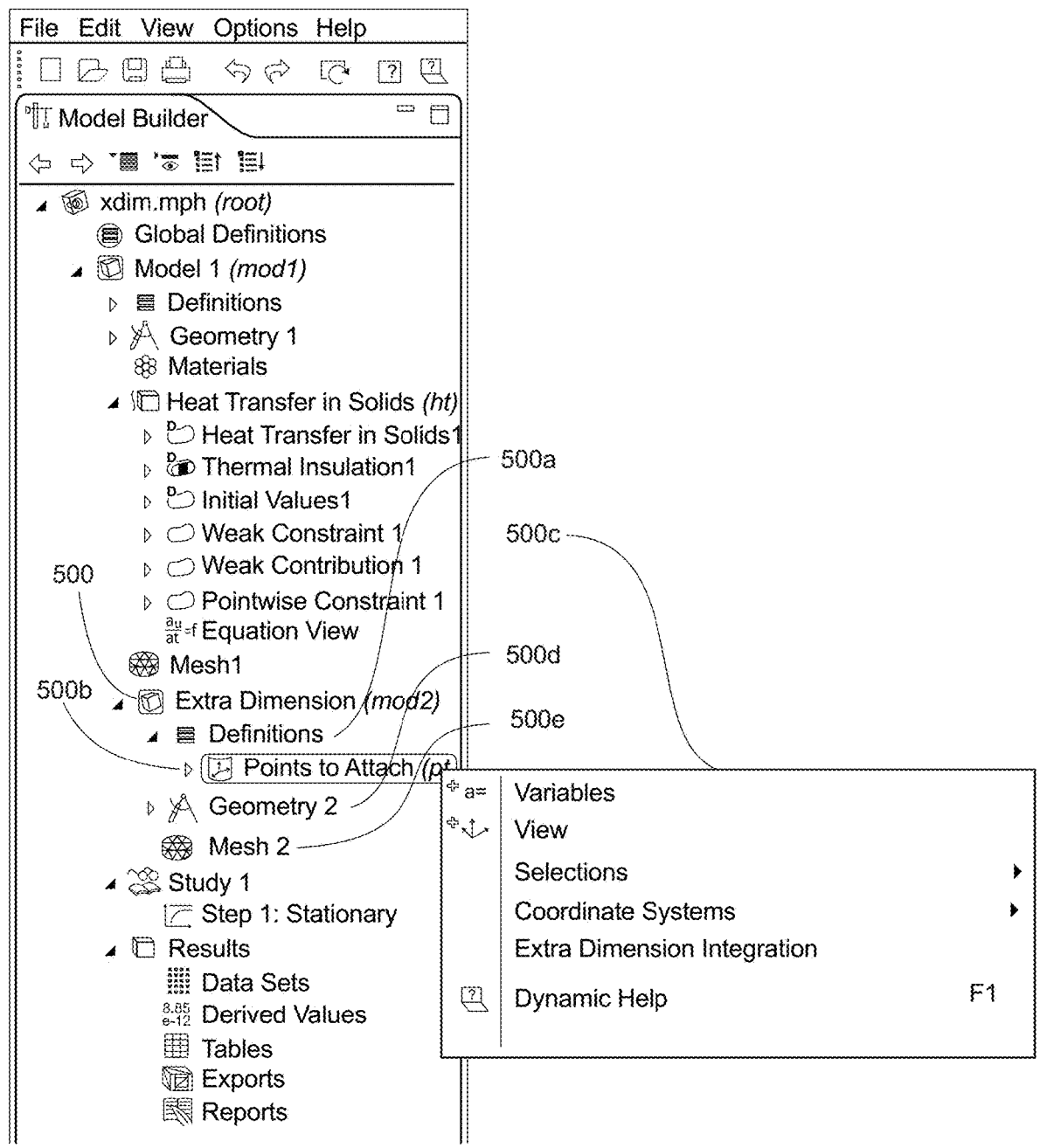
FIGS. 5A to 5C illustrate exemplary menus for features related to an extra dimension, according to some aspects of the present disclosure.
Figure 5B:
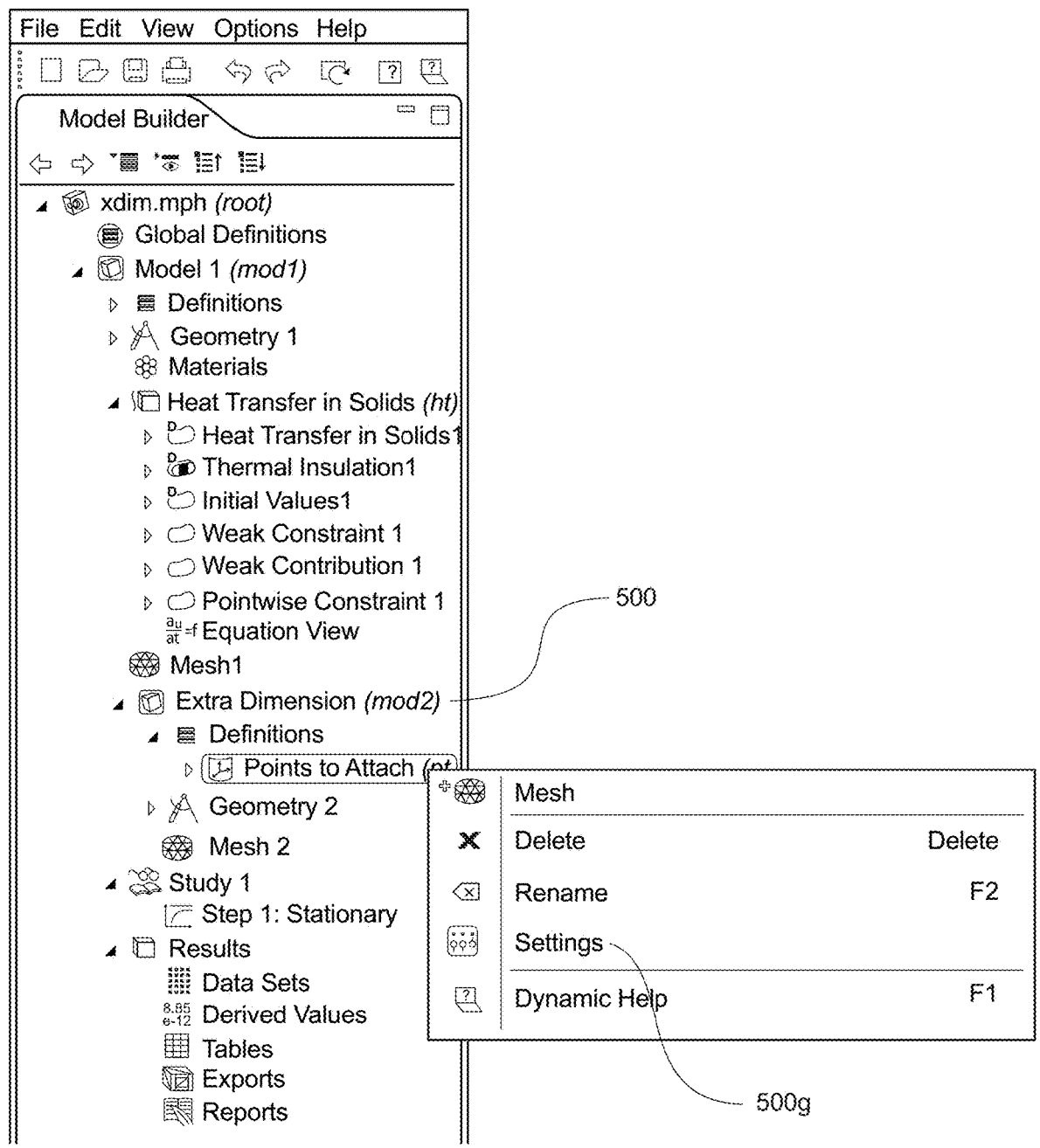
Figure 5C:
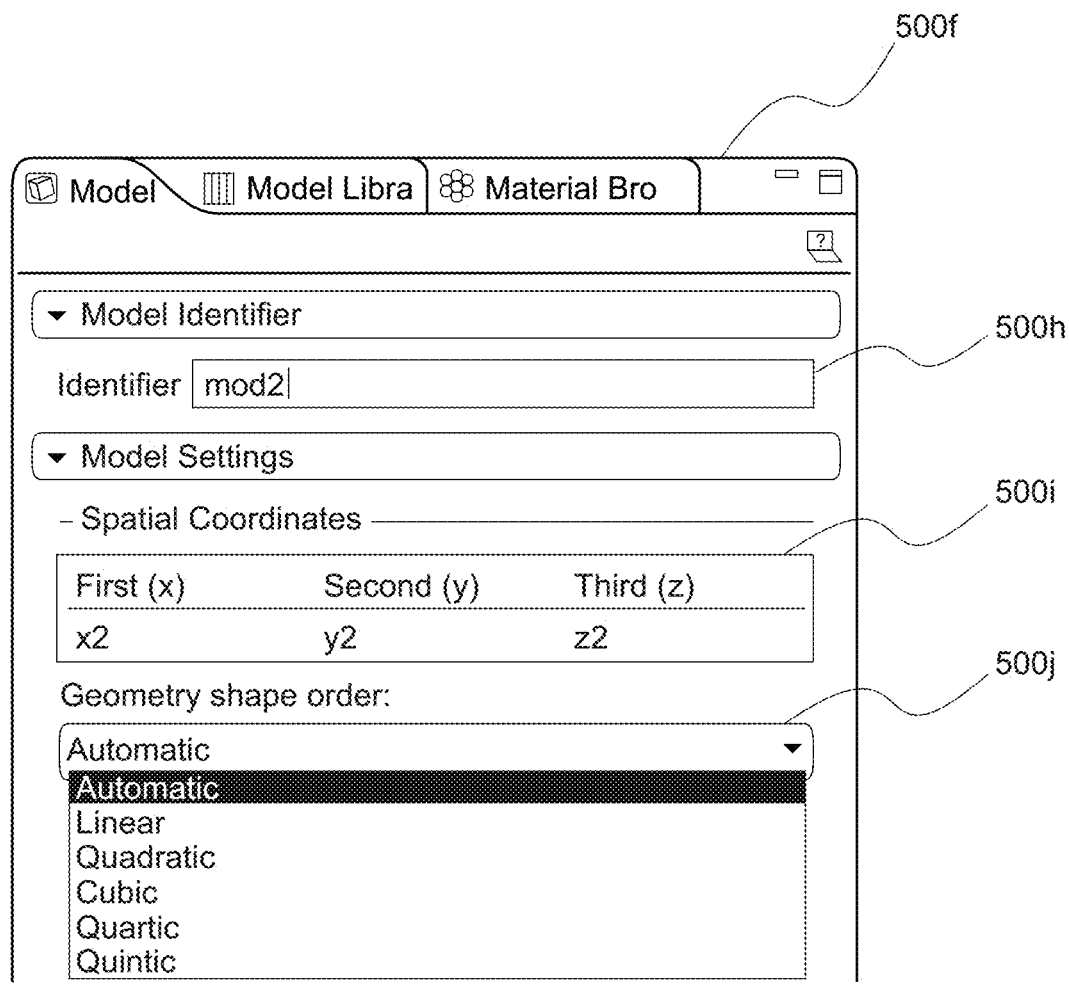

Referring now to FIGS. 5A-5C, exemplary menus are illustrated including extra dimension features that are added as a child feature to a base model, according to some aspects of the present disclosure. As discussed elsewhere, one or more extra dimension features can be attached to a base model. An extra dimension node 500 can include one or more child nodes for defining an extra dimension.

In some aspects, a definitions child node 500a includes another child node 500b that is further denoted by "Points to Attach" in the tree illustrated in FIGS. 5A and 5B. The child node 500b can be used to identify one or more vertices in an extra geometry that are connected to entities in a base geometry in the base model. This may assist in identifying physical quantities and physical properties in a product geometry with the corresponding physical quantities and physical properties in a base geometry. For instance, in an exemplary aspect of a base geometry including a 2-D geometry forming a 3-D product geometry with a 1-D extra geometry in an extra dimensions feature, the point of attachment can be used identify a vertex in the product geometry which shares the value of physical quantities and physical properties with the base geometry.

A definitions context menu may be displayed by selecting the definitions node 500a and include different settings 500c for view, selections, extra dimension integration, variables, and coordinate system. Additional child nodes may be added to the definitions node by selecting one or more of the settings 500c. It is contemplated that a user can define viewing setting such as light settings, grids and geometry labels using additional settings available under the "View" setting. Selections can be applied to create specific selections of geometric entities, which may be customized by a user. Extra dimension integration can be used to integrate over geometries including extra dimensions. Variables can include symbolic expressions that may be defined on the extra dimension, though variables defined on a product geometry may be defined using a variables node in the base geometry. Coordinate systems listed in the context menu can include settings describing the coordinate system of the extra dimension.

In some aspects, a geometry child node 500d can include information about extra geometries created in an extra dimensions feature. Furthermore, a mesh child node 500e can include information about meshes on extra geometries. FIG. 5C illustrates an exemplary settings window 500f for the extra dimension feature, which can be accessed through user selections, such as a "Settings" icon 500g. A settings window 500f can include a user editable extra dimension identifier 500h which can be automatically set by the system to a unique identifier. Furthermore, a settings window 500f can also include user editable names 500i of spatial coordinates that are applied in the extra dimension, where the unique names may be automatically assigned by the system. It is also contemplated that a geometry shape order 500j can be selected or set to an automatic setting in the settings window 500f. The geometry shape order sets the order of curved mesh elements that may be used to describe an extra geometry using finite elements.

Figure 6A:
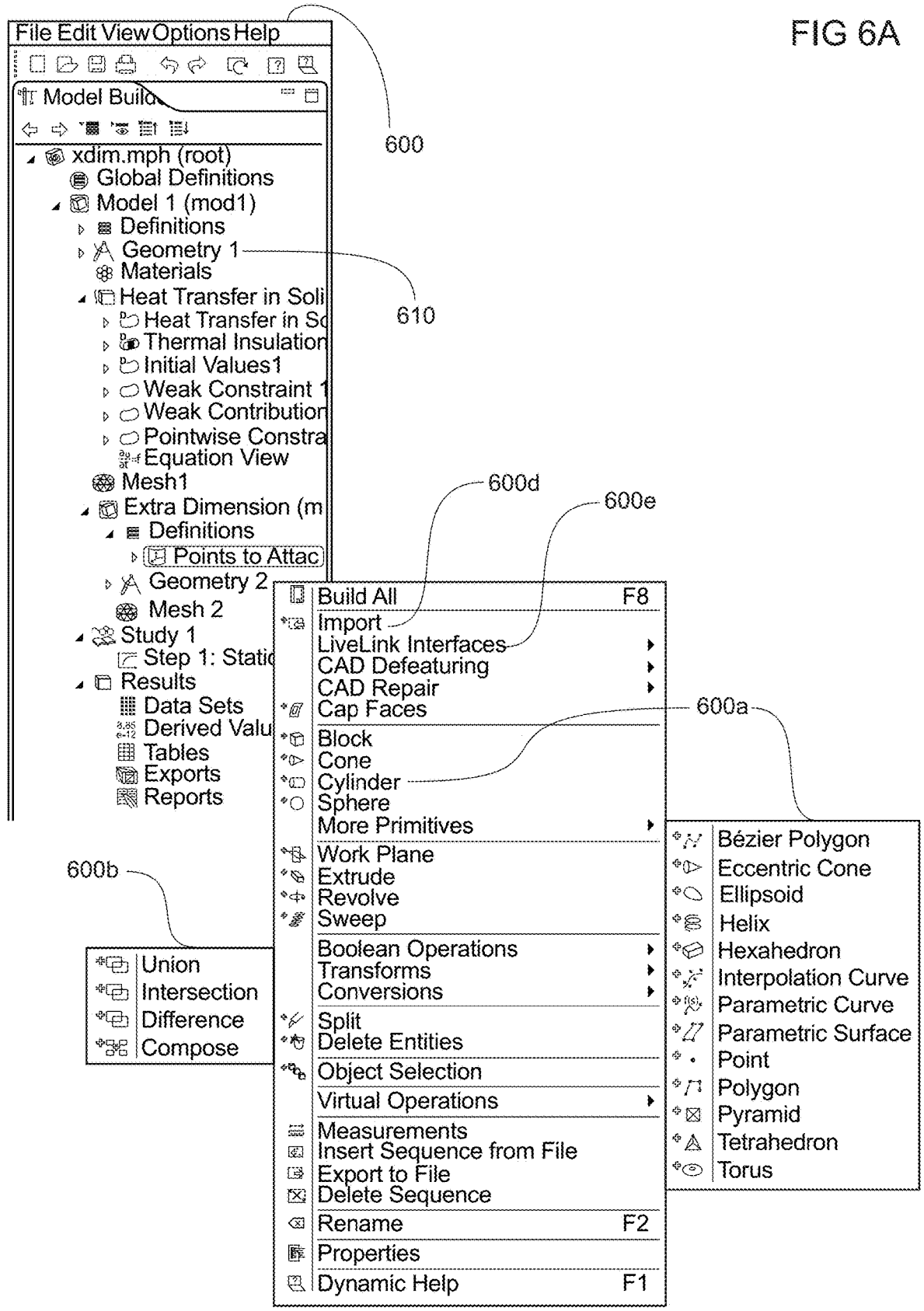
FIGS. 6A to 6B illustrate exemplary menus, tools, and graphical representations for creating extra geometries, according to some aspects of the present disclosure.
Figure 6B:
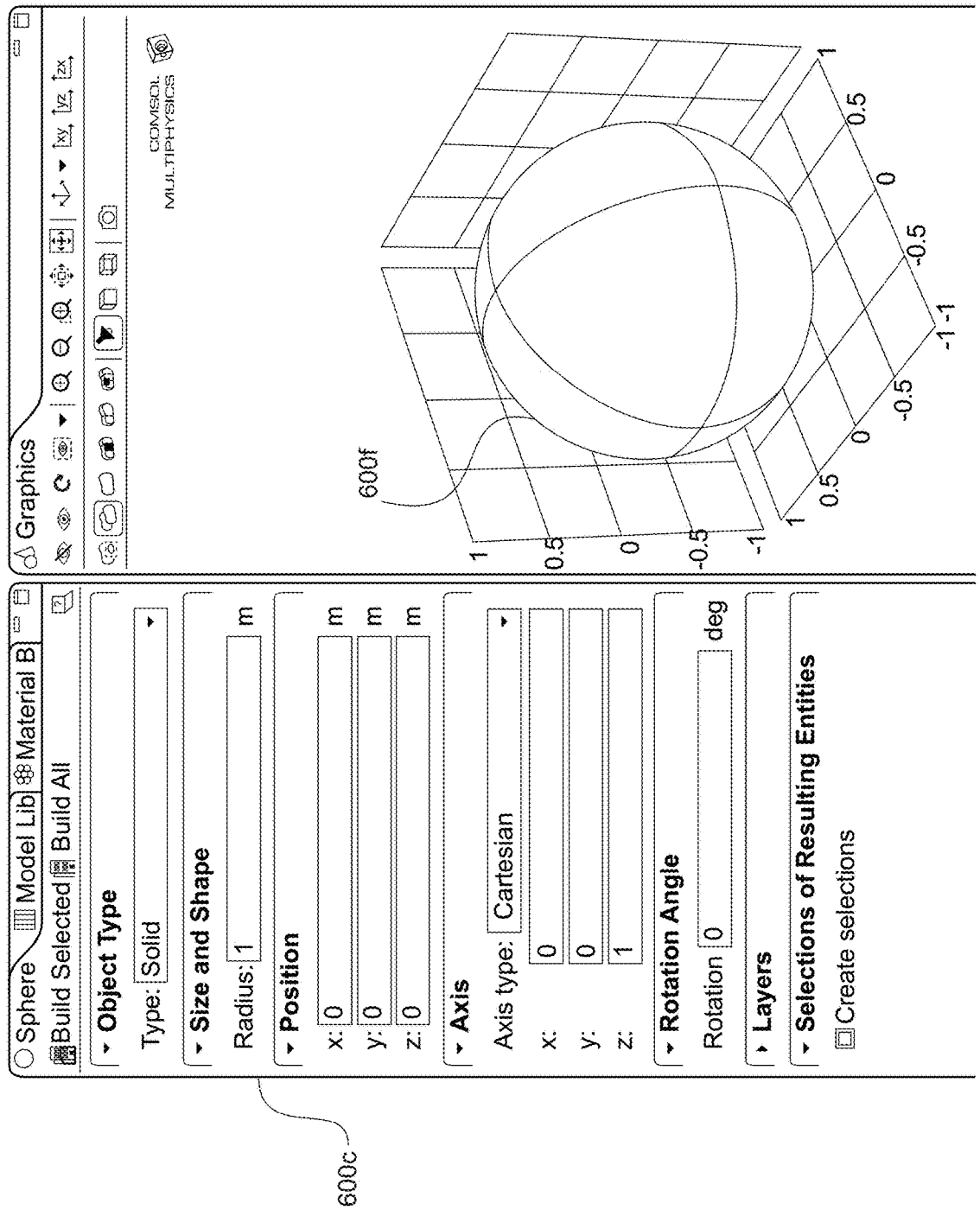
Figure 7:
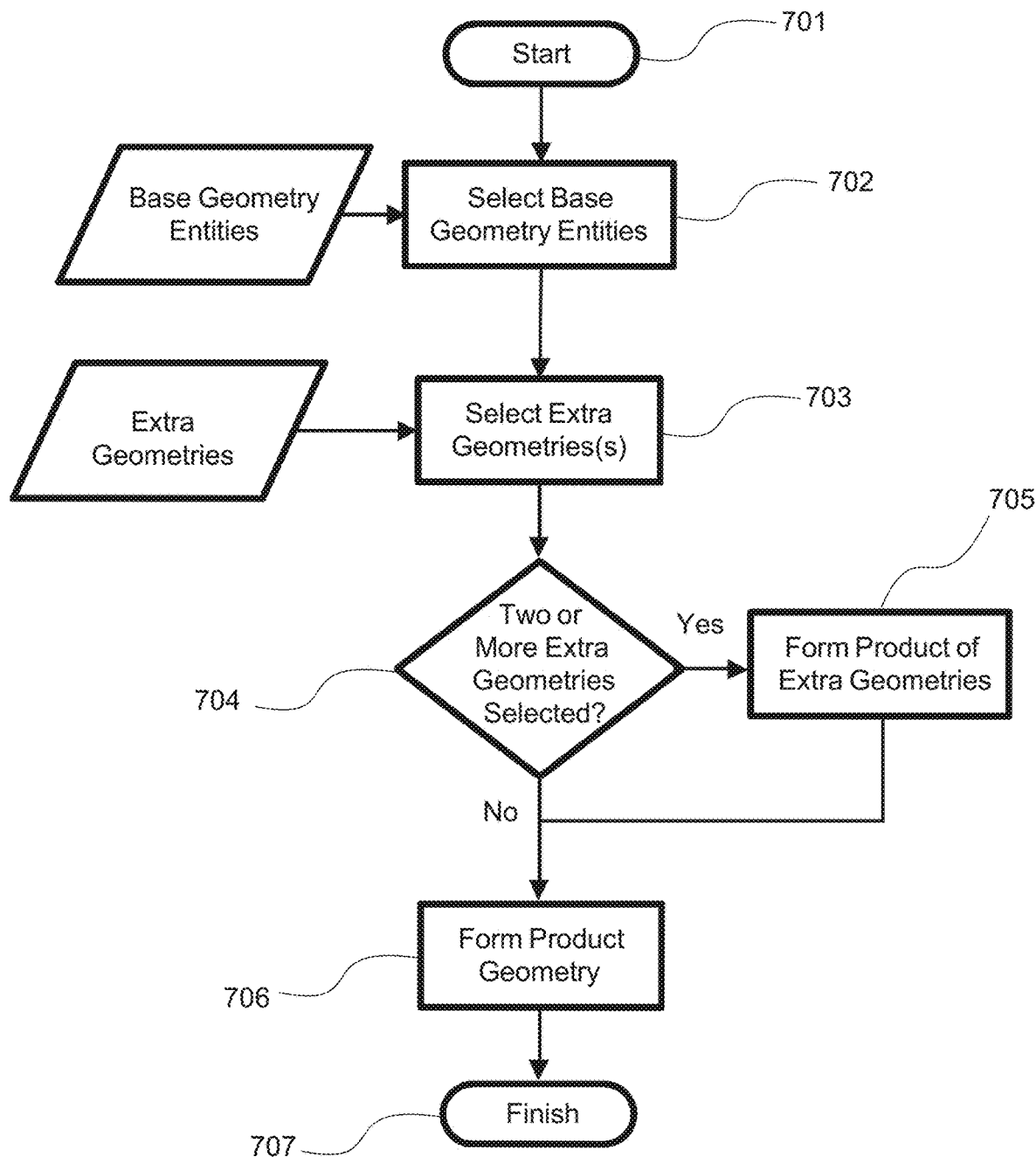
FIG. 7 illustrates an exemplary a flowchart for creating a product geometry, according to some aspects of the present disclosure.

Referring now to FIGS. 6A-6B, exemplary menus, tools, and graphical representations are illustrated for creating extra geometries, according to some aspects of the present disclosure. A GUI 600 is illustrated in FIG. 6A that can, for example, be accessed or displayed in response to a user selecting the geometry child node 500d from FIG. 5A. As a preliminary matter, a base geometry can be created or can be otherwise available in a geometry node 610. Selecting the geometry node 610 can confirm the presence of a predetermined base geometry or allow the creation of the base geometry. The base geometry can be created similar to the creation of extra geometries, which are now described. An extra geometry can be constructed from geometric primitives 600a and operations 600b, exemplary aspects of which are included in FIG. 6A. The available geometry primitives may be dependent on the dimension of the extra dimensions feature. The geometric primitives and operations can be child nodes of the geometry node(s). A user can define the geometric primitives by selecting them, which may open a separate settings window 600c, such as the exemplary window illustrated in FIG. 6B, that allow for data to be received via specific fields displayed in the settings window, and in some aspects, be displayed graphically (see exemplary element 600f). It is also contemplated that in some aspects, the base geometry and extra geometry data can be imported 600d or received as file data stored in a memory device or by linking 600e to a CAD system.

As previously described above, in some aspects where a physics interface automatically defines extra dimensions features, the shape of an extra geometry may be predefined. For example, when adding a PML feature to a radio frequency model, adding a thickness to a shell in a shell model, or adding a porous particle catalytic bed to a reacting flow model, extra geometries in the form of line segments can be generated automatically by the respective physics interfaces. Some further examples include physics interfaces for modeling heat transfer by radiation in 3-D, or Boltzmann equations in 3-D, that generate spheres or surfaces of spheres as extra geometries. For some aspects, a user can also define some characteristics of the predefined shapes in a GUI, such as the thickness of a shell in the shell model example.

It is contemplated that base dimensions and extra dimensions include identifiers. In addition, geometries and geometric entities also include identifiers. Such identifiers can be used to make lists, code, and data-structures specifying sets of base geometry entities that may form a Cartesian product with sets of such identifiers of geometric entities in extra geometries. Such Cartesian products are product geometries for non-discretized geometries. Product geometries for non-discretized geometries can be used to form or construct Cartesian products of discretized geometries. For discretized base geometries and discretized extra geometries, a product geometry is the Cartesian product of the set of mesh element points of a selection of base geometry entities with the mesh element points of an extra geometry or with a Cartesian product of the sets of mesh element points of two or more extra geometries.

Referring now to FIGS. 7 and 8A-8D, an exemplary flowchart for creating a product geometry is illustrated along with exemplary menus, tools, and graphical representations for selections of base geometry entities and extra geometries are illustrated, according to some aspects of the present disclosure.

Figure 8A:
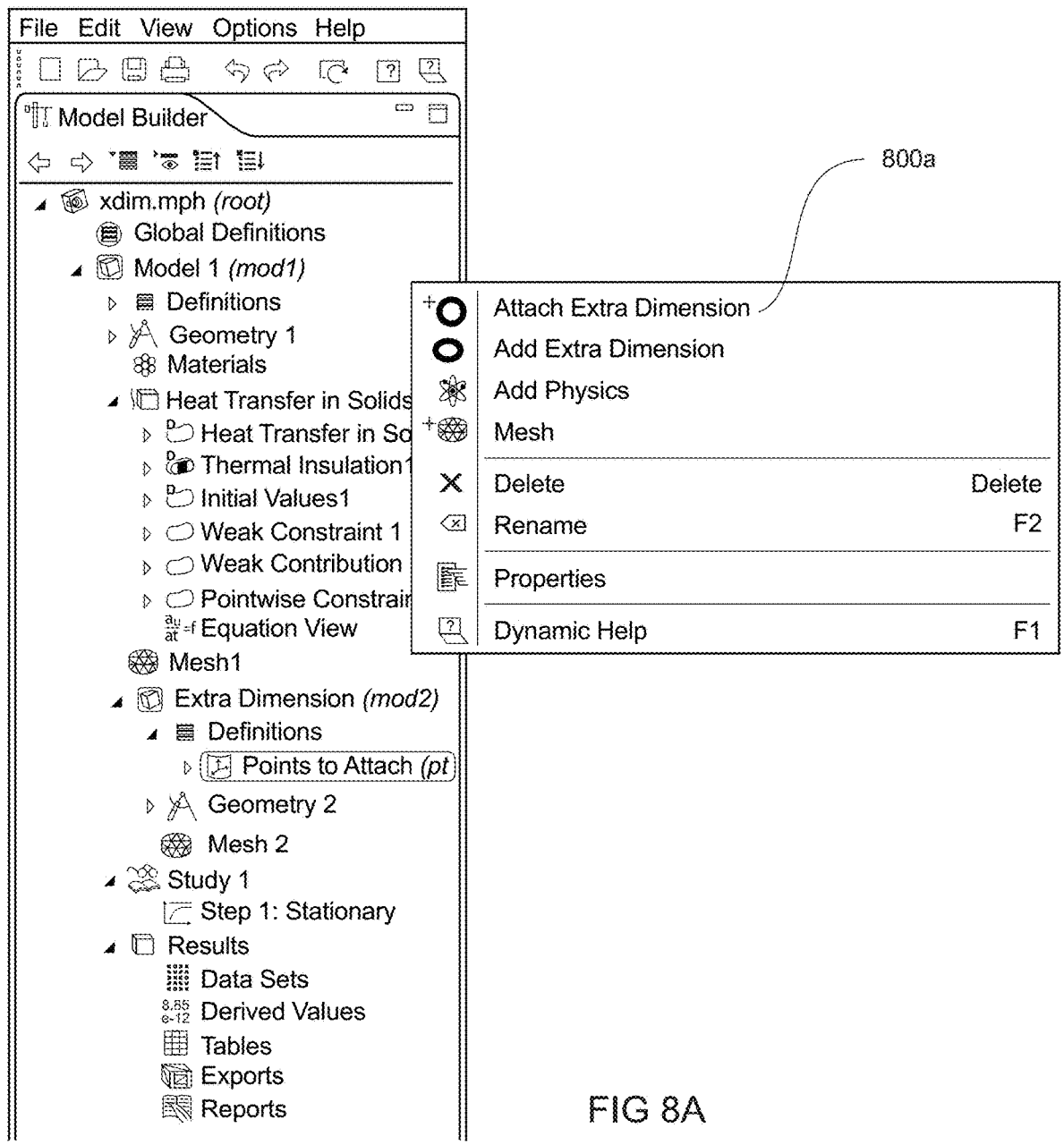
FIGS. 8A to 8D illustrate exemplary menus, tools, and graphical representations for selections of base geometry entities and extra geometries, according to some aspects of the present disclosure.
Figure 8B:
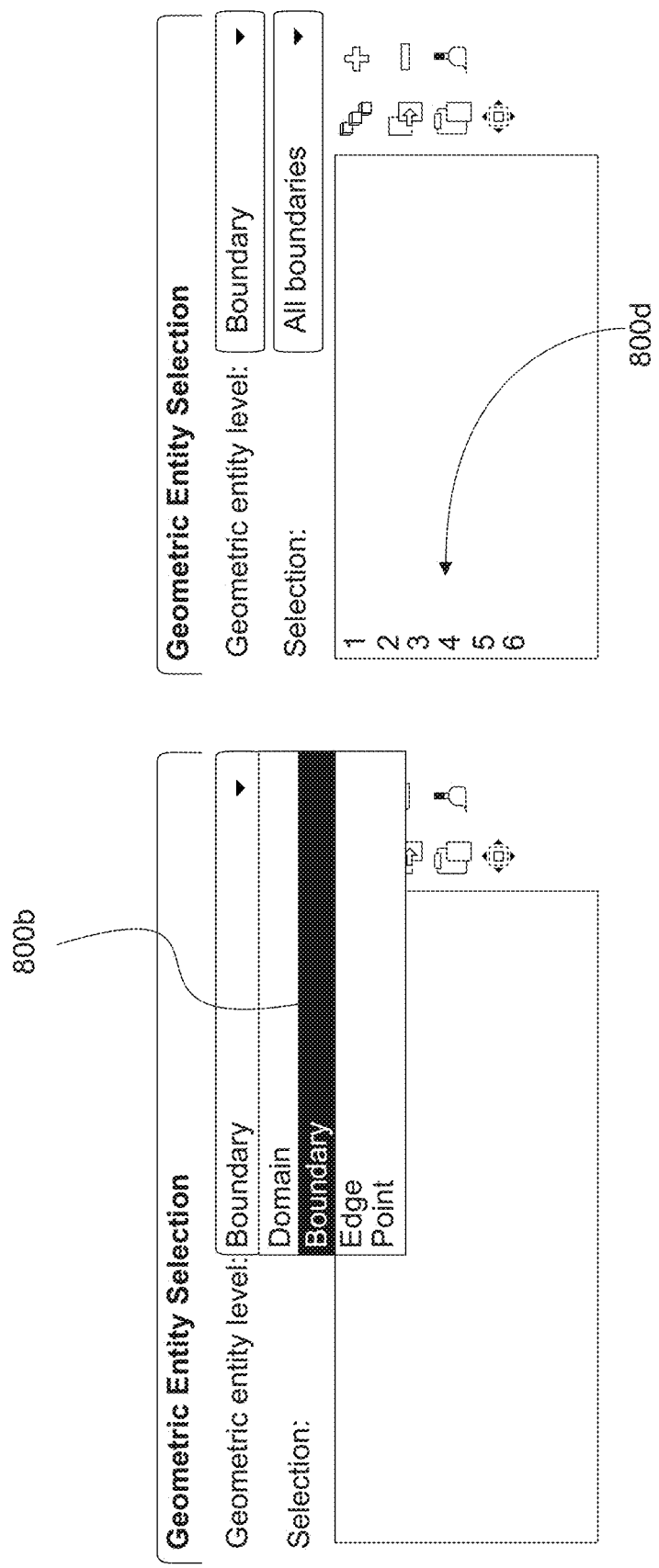
Figure 8C:
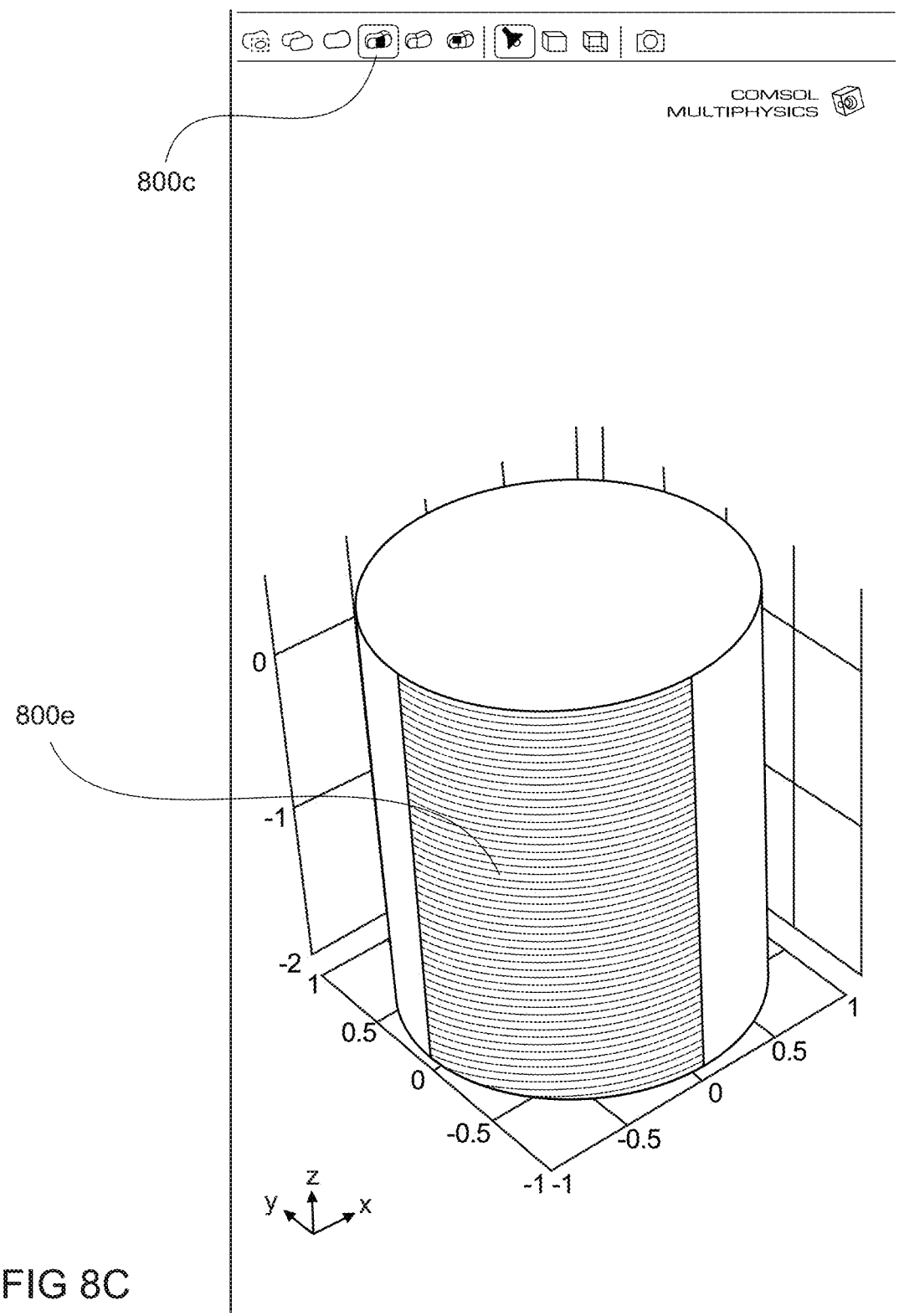
Figure 8D:
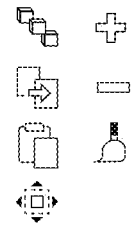

In some aspects the process is initiated at step 701 by selecting an option to attach extra dimensions, such as icon 800a illustrated in FIG. 8A. At step 702, a selection or determination of base geometry entities is made. This step can be implemented through a first selection of a geometry entity level, through for example a displayed list of options 800b (e.g., domain, boundary, edge, point) or selectable icons 800c, as illustrated in FIGS. 8B and 8C. Then, base geometry entities of the selected geometric entity level can be displayed in a list 800d or can be displayed as a graphical representation of a base geometry entity. It is contemplated that in some aspects while only base geometry entities of the selected geometry entity level may be displayed in step 702, all base geometry entities directly adjacent to the selected entities in the geometry, which are of a lower geometric entity level, can further be automatically selected by the modeling system. For example, in some aspects, for a 3-D geometry, if "domains" is the displayed geometry entity level, and a domain is chosen, all boundaries, edges, and vertexes directly adjacent to the domain are also selected. As another example, for some aspects, if a displayed geometry entity level is "edges" and an edge is selected, only the two entity levels that are the directly adjacent vertexes are automatically selected in addition to the selected edge.

Next, at step 703, a selection of extra geometries is implemented. In some aspects, this step can be implemented by selecting one or more extra dimensions from a list 800f, such as the one illustrated in FIG. 8D, or from graphical representations of extra geometries, such as exemplary graphical representation in element 800e in FIG. 8C or the graphical representation in element 600f illustrated previously in FIG. 6B.

Next at step 704, a determination is made if two or more extra dimensions have been selected in step 703. If the determination is true, a Cartesian product of the two or more extra geometries is automatically constructed or computed in step 705. The Cartesian product of extra geometries can also be referred to as a product of extra geometries. If the determination is false, only one extra dimension has been selected and the method proceeds to step 706.

Next, at step 706, a product geometry is formed or computed as a Cartesian product of the selection made in the step 702 with the selection made in step 703 or with the Cartesian product formed in step 705. In some aspects, the product geometry can be formed by coupling a list, including pointers (or identifiers) to base geometry entities selected in step 702, to a second list, including pointers to the selection of extra geometries made in the third method step 703.

Finally, at step 707, the process for creating a product geometry is completed, and the product geometry from step 706 can be stored or added to a list, code, or data structure.

It is contemplated that in some aspects if extra dimensions features have been generated automatically by a physics interface and extra geometries have been generated, instructions for the process of forming product geometries are predefined. For example, a product geometry between a 3-D geometry describing a shell and a 1-D geometry (e.g., a line) describing a thickness direction can be formed automatically.

In some aspects, it can be desirable to define variables, expressions, operations, and materials on at least a portion of a product geometry. The portions of a product geometry can be referred to as a products of selections. A product of selections is conceptually similar to a product geometry, but there are some differences. A product geometry is formed as a product of geometric entities in a base geometry and geometric entities in extra geometries. A product of selections differs in that it is a Cartesian product of a selected portion of the geometric entities of the base geometry and selected portions of the geometric entities of the extra geometries. A portion of a product geometry formed by a Cartesian product between a set of base geometry entities and a set of extra geometry entities can also be referred to as a product of entities. It is contemplated that a modeling system can be operable to include a process or instructions for creating a product of selections in various physics interfaces and features. It is also contemplated that a product of selection tool can be a feature itself in a physics or multiphysics simulation system.

Referring now to FIGS. 9 and 10A-10E, an exemplary a flowchart for creating a product of selections along with exemplary menus and graphical representations for the product of selections tool are illustrated, according to some aspects of the present disclosure.

Figure 10A:
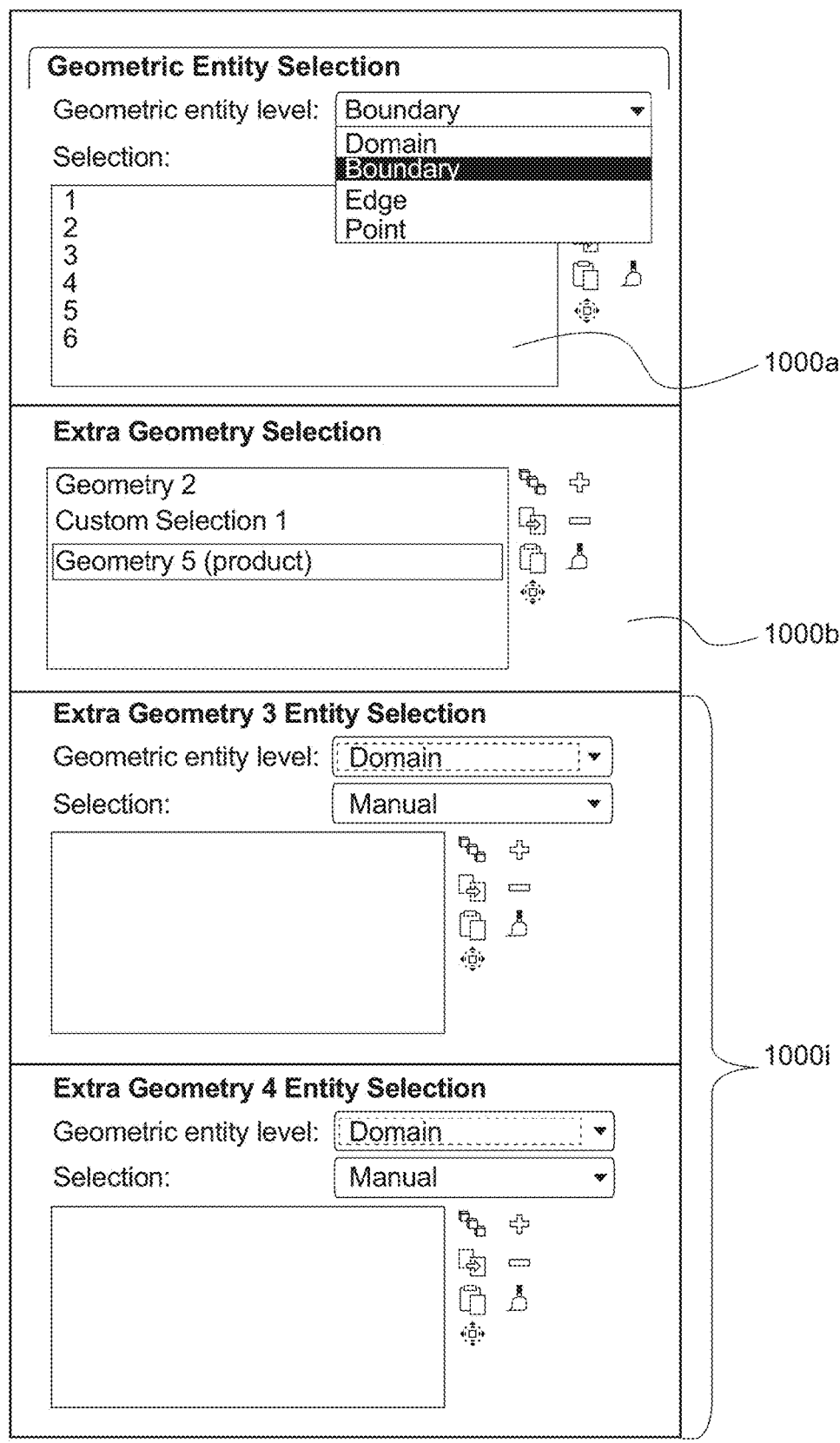
FIGS. 10A to 10E illustrate exemplary menus and graphical representations for the product of selections tool, according to some aspects of the present disclosure.
Figure 10B:
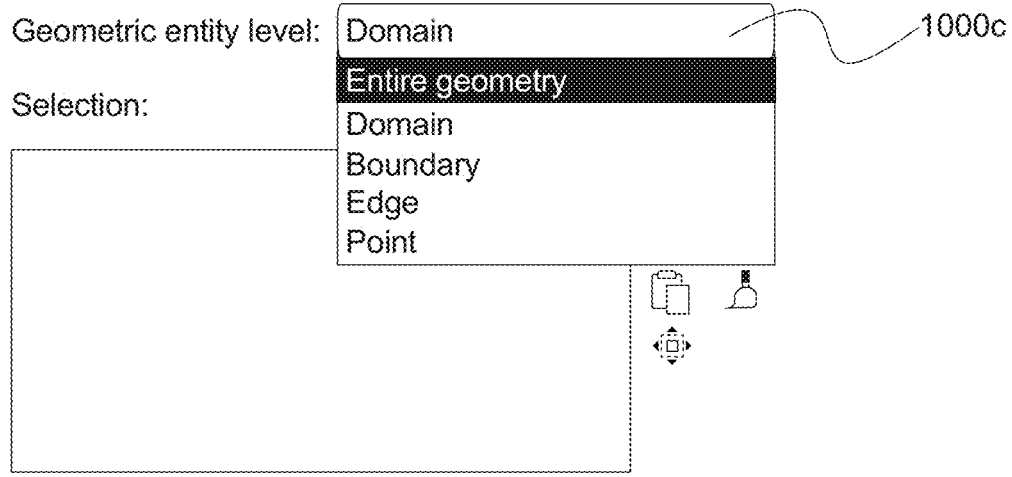
Figure 10C:
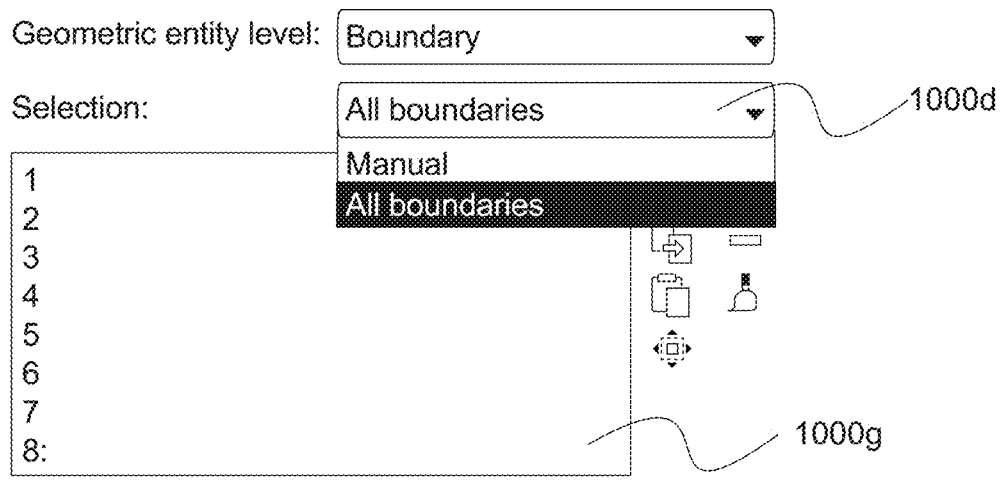
Figure 10D:
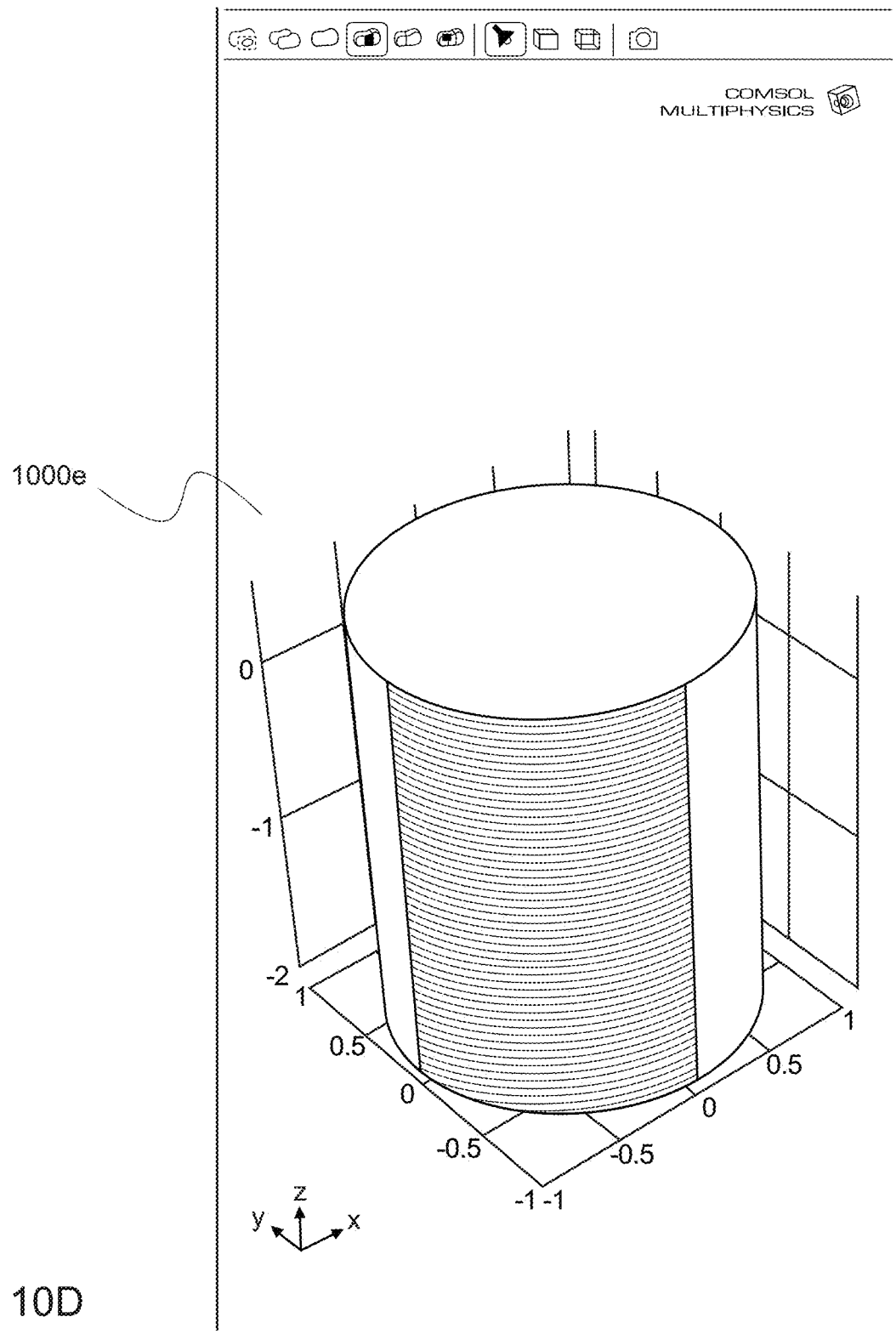
Figure 10E:
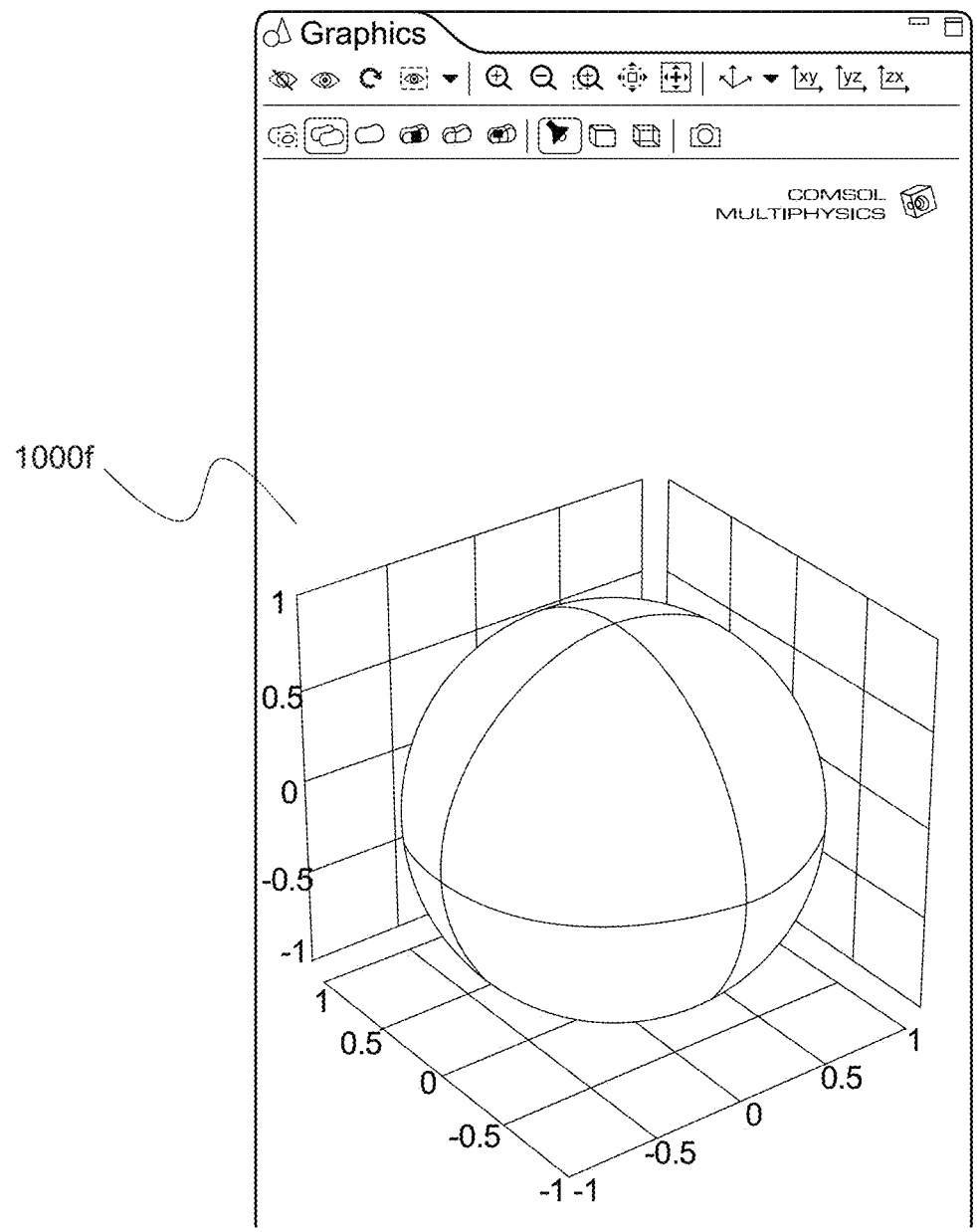

At step 901, it is contemplated that base geometry entities are displayed, such as in a list 1000a as illustrated in FIG. 10A or as a graphical representation of the base geometry, as illustrated by elements 1000e and 1000f in FIGS. 10D and 10E. In some aspects, the geometry entity level of the displayed base geometry entities can be selected, and the base geometry entities forming a product geometry can further be highlighted to a user, for instance using a bolder font or a different color.

At step 902, a selection is made from among one or more base geometry entities displayed in the list or in the graphical representations displayed in step 901. Next, at step 903, the extra geometries forming a product geometry with geometric entities in the base geometry are displayed. In some aspects of the present disclosure, the extra geometries can be displayed in a list 1000b, as illustrated for example in FIG. 10A, along with the products of extra geometries that are also displayed as list items. In some aspects, it is contemplated the extra geometries can also be displayed in graphical representations (e.g., cylinder at 1000e, sphere at 1000f).

Next, at step 904, a selection is made from among the extra geometries displayed in step 903. In some aspects, this selection is made via exemplary selections made from a displayed or a graphical representations displayed in a GUI. (see, for example, elements 1000b, 1000e, 1000f in FIGS. 10A, 10D, and 10E). It is contemplated that in some aspects of the process, if a selection of extra geometries is made, such that the Cartesian product between the base geometry entities selected in step 902 and the selected extra geometries includes a product of entities that is not a portion of the product geometry, any base geometry entity that is part of such a product of entities will be automatically removed from the selection in the second method step 902. It is also contemplated in some aspects that the generation of such product entities can generate an error message. In addition, it is contemplated in certain aspects, to only allow selections of extra geometries whose Cartesian product with the selection in step 902 forms at least a portion of the product geometry. It is further contemplated that in some aspect such geometric entities are highlighted (e.g., bolded font, different color), such as on a display so as to be readily visible to a user of the modeling system.

Next, at step 905, extra geometry sections are generated. For example, in the GUI displayed in FIG. 10A, extra geometry sections (e.g., 1000i) are automatically generated and appended to the GUI based on the extra geometries selected in step 904. In the exemplary sections 1000i in FIG. 10A, one section is generated for each extra geometry from the selections made in method step 904. For example, if a selection was made in the step 904 of a Cartesian product between two extra geometries, two sections, one for each extra geometry, can be generated. If a single extra geometry was selected in step 904, then in some aspects only one section is generated.

It is contemplated that in some aspects of the process for creating or forming a product of selections, step 905 can include a choice of geometric entity levels that can include several choices, such as an entire (extra) geometry, domains, boundaries, edges, and points. An exemplary aspect of an interface for receiving selections of these choices or options 1000c is illustrated in FIG. 10B. Furthermore, for at least some of the geometric entity level selections, a second set of selection options can be displayed to a user in step 906. The options can include a "manual" option and another option for (all) domains, (all) boundaries, (all) edges, or (all) points in accordance with the option selected for the geometric entity level. If "manual" is chosen, selection can be received for geometric entity numbers displayed on a list of entities or from a graphical representation thereof (which in some aspects, may be displayed in step 906). An exemplary aspect of an interface for receiving selections of these choices or options 1000d, 1000g is illustrated in FIG. 10C. In addition to being displayed as lists of geometric entity numbers or options, such as entire geometry, all domains, all boundaries etc., in step 906, the extra dimension geometric entities may be displayed in a GUI. For example, in exemplary FIG. 10D, one single boundary entity has been shaded for clarity, while three adjacent boundaries are not, to identify the extra dimension geometric entit(ies).

Next, at step 907, extra geometry entities, which may have been displayed in step 906, can be selected using the sections generated in step 905. In some aspects, a user can choose an entire (extra) geometry, as illustrated in FIG. 10B, which would select all domains, boundaries, edges, and points in the context of an exemplary 3-D geometry. For other exemplary geometries, FIG. 2 provides indications of the extent of a result of a select all choice. It is contemplated that in some aspects if a user instead chooses domain, boundary, edge, or point from menu 1000c, a second choice may be made from a second drop down list 1000d and the user can select all geometric entities of a specific geometric entity level or a manual option. If a user chooses the manual option, a third choice can be made in another list 1000g or in a graphical representation of the extra geometry, where specific geometric entities can be selected. It is contemplated that the selection process of step 907 is performed for each section generated in step 905. It is further contemplated that a set of geometric entities is further be selected for each section.

Next, at step 908, a product of selections is formed. In some aspects, the product of selections is formed as a Cartesian product between the set of geometric entities selected from the base geometry in the step 902 and the set of extra geometry entities in step 907. It is contemplated that the product of selections can be formed from a list including pointers (or identifiers) to base geometry entities selected in step 902 and then coupled using a second list including pointers to the selection of extra geometry entities made in step 907.

As discussed above, it is contemplated that is can be desirable to define variables, operations, expressions, and materials on products of selections. These processes are described in more detail below. Defining variables, operations, expressions, and materials on a product of selections can involve including a list defining a product of selections, or a pointer to such a list, in a data structure describing variables, operations, expressions, and materials.

Figure 11:
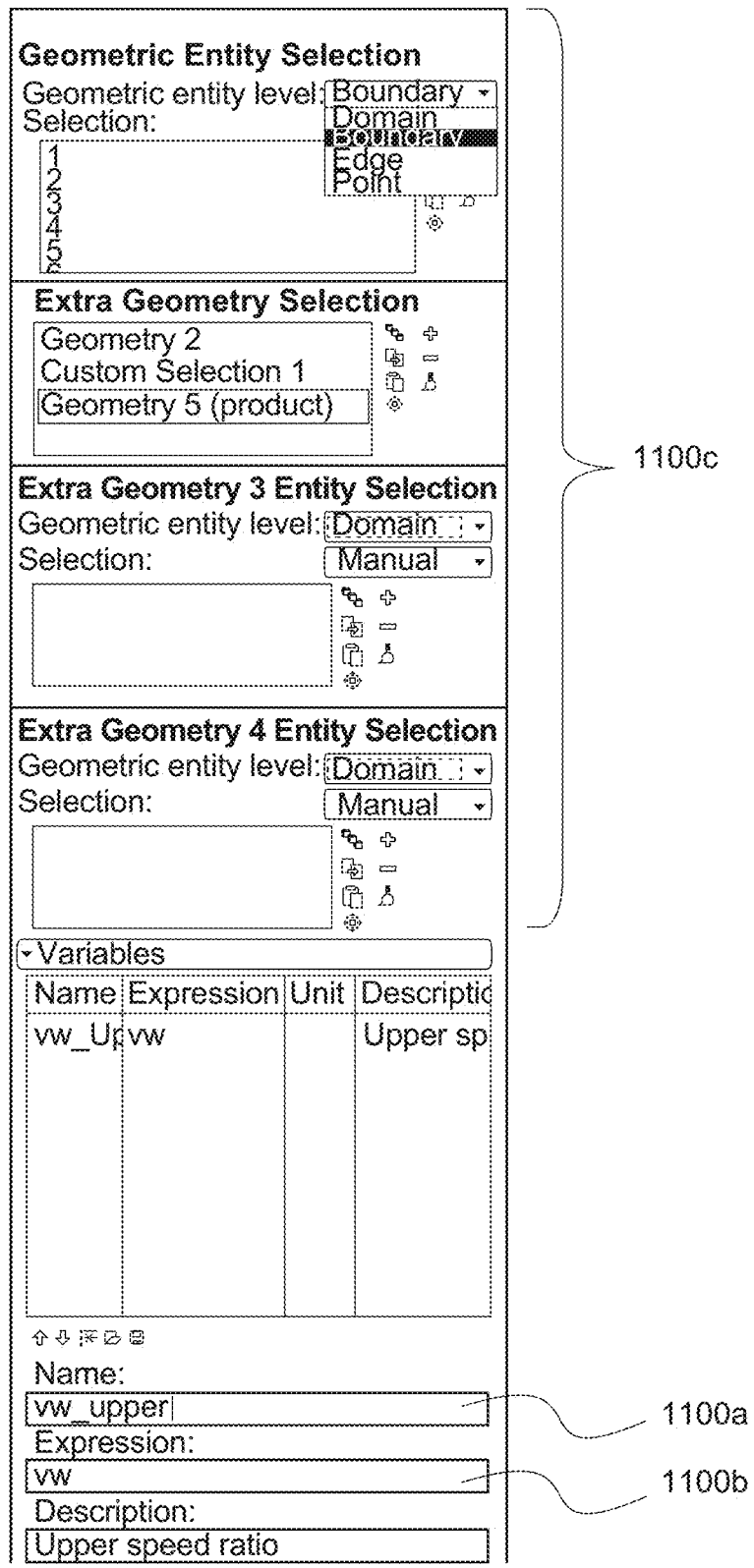
FIG. 11 illustrates an exemplary settings window for defining variables for products of selections, according to some aspects of the present disclosure.

Referring now to FIG. 11, an exemplary settings window for defining variables on a product of selections is illustrated, according to some aspects of the present disclosure. In some aspects, a settings window can be accessed by selecting a definitions node of a base model including a base geometry, forming a product geometry with one or more extra geometries, and selecting variables. Other aspects for accessing a setting window are also contemplated. In some aspects, a variable can be defined by entering a name (e.g., 1100a) for the variable and an expression (e.g., 1100b). A product of selections can then be constructed or formed using a product of selections tool exemplified by interface 1100c. An outcome of the formation of the product of selections can include that a variable with the variable name (e.g., 1100a) and the expression (e.g., 1100b) is then automatically defined on the product of selections. Variables can also be defined on extra geometries in a similar fashion by selecting variables in a definitions context menu under an extra dimension feature (e.g., 500a in FIG. 5A). In some aspects, it is contemplated that variable can be defined on an extra geometry without being defined on a product geometry or a product of selections including base geometry entities. In such cases a variable may be assigned using a variable's child node under the extra dimension node including such an extra geometry.

Figure 12A:
FIGS. 12A to 12B illustrate exemplary menus and a settings window for defining an operation on a product of selections, according to some aspects of the present disclosure.
Figure 12B:
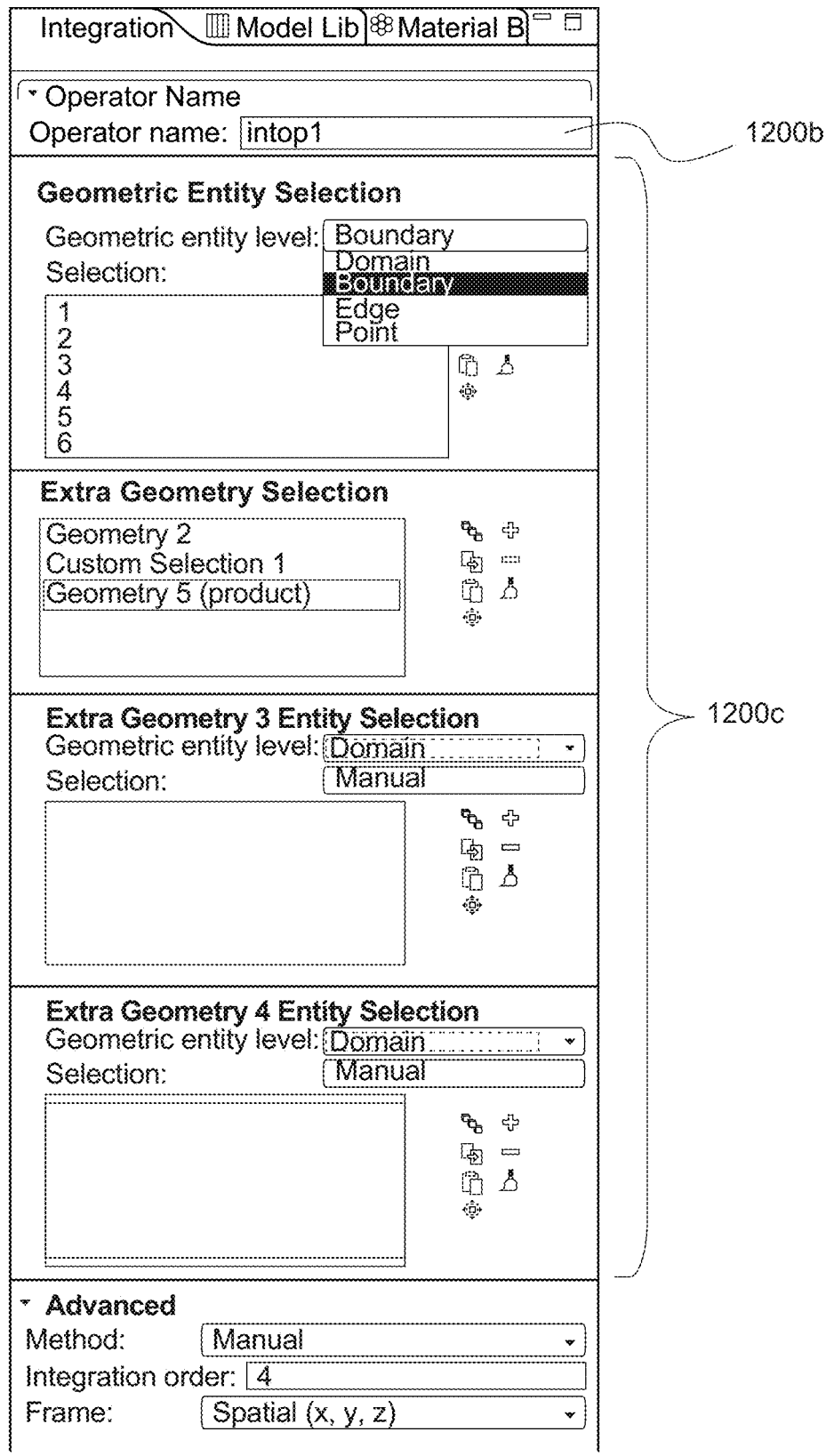

Referring now to FIGS. 12A-12B, exemplary menus and a settings window for defining an operation on a product of selections are illustrated, according to some aspects of the present disclosure. In some aspects, such as the exemplary settings window and menus of FIGS. 12A-12B, an integration operation is defined on a product of selection. It is contemplated that other operations can be similarly defined, such as for minimum, maximum, and average operations. In some aspects, a settings window can be accessed by selecting a definitions node under a base model and selecting model couplings, and integration (e.g., 1200a), as exemplified by FIG. 12A. It is contemplated that an operation name, such as the integration name, can be defined by a user (e.g., intop1 at element 1200b) or be automatically generated by a multiphysics system. The integration on a product of selections can be defined by using a product of selections tool or interface exemplified thereby (e.g., 1200c). It is further contemplated that the operation name (e.g., integration) can be used in other features such as variables. For instance intop1(u) is the integral over the variable, u, on the product of selection defined using a product of selections tool.

It is further contemplated that in some aspect, a user can integrate in extra geometries. For example, a user can select extra dimension integration from a definitions context menu of an extra dimensions feature. The user can then define an integration operator with a name. The user may define the integration operator on one or more extra geometries or parts thereof by selecting geometric entities in a list or graphical representation of one or more extra geometries. It is also contemplated that the user can define an integration order of the integration operator. One or more such integration operators may be used to form expressions. An example of such an expression is xd3.intop2(u), which may be used to integrate over the variable, u, over some part of extra geometries in extra dimension 3, xd3. intop2 is the name of the integration operator, xd3 signifies that intop2 is the name as defined in extra dimension 3. xd3 may not be necessary if the name intop2 is unique. u may denote a variable representing a physical quantity.

To integrate over a product of extra geometries using strings, it is contemplated that two or more integration operators are used. An example of such an expression is: xd2.intop1(xd3.intop2(u)). Here xd2.intop1 refers to integration in extra geometries or parts thereof in extra dimension 2 and xd.3intop2 refer to integration in extra geometries or parts thereof in extra dimension 3 and u is a variable.

It is contemplated that other operators for finding the average, maximum, or minimum value of a variable may work in a similar fashion using operator names such as avg1, max1 or min1.

Operators for pointwise evaluation of variables are also contemplated in some aspects. These operators can be used in strings in a similar fashion to what is described above with the additional specification of the dimensionality of the entity in which to evaluate. For example, to evaluate the variable u on a boundary (1-D) of a 2-D extra geometry in an extra dimension with an identifier xd3 and global coordinates (0.3, 0.4), the following exemplary string may be used: xd3.atxd1(0.3,0.4,u). Here, xd3 specifies that the operation on u is with respect to the variable named u in xd3. atxd is the name of the operator which evaluates a variable in a point. atxd1 specifies that the evaluation is on a 1-D extra geometric entity (hence the 1 after atxd). 0.3,0.4 gives the coordinate pair and, u, the variable to be evaluated.

In some aspects, to make a pointwise evaluation in a product of extra geometries, more than one atxd operator is used. For example, given the product of extra geometries between a 1-D extra geometry in an extra dimensions xd4 and a 2-D extra geometry xd2, the following string may be used to find the value of u (in the point (0.7,0.9) in xd4 and the point (0.5) in xd2) on the product of entities formed between the boundary of xd2 and the xd4 domain: xd2.atxd1(0.7,0.9,xd4.atxd1(0.5,u)).

Figure 13A:
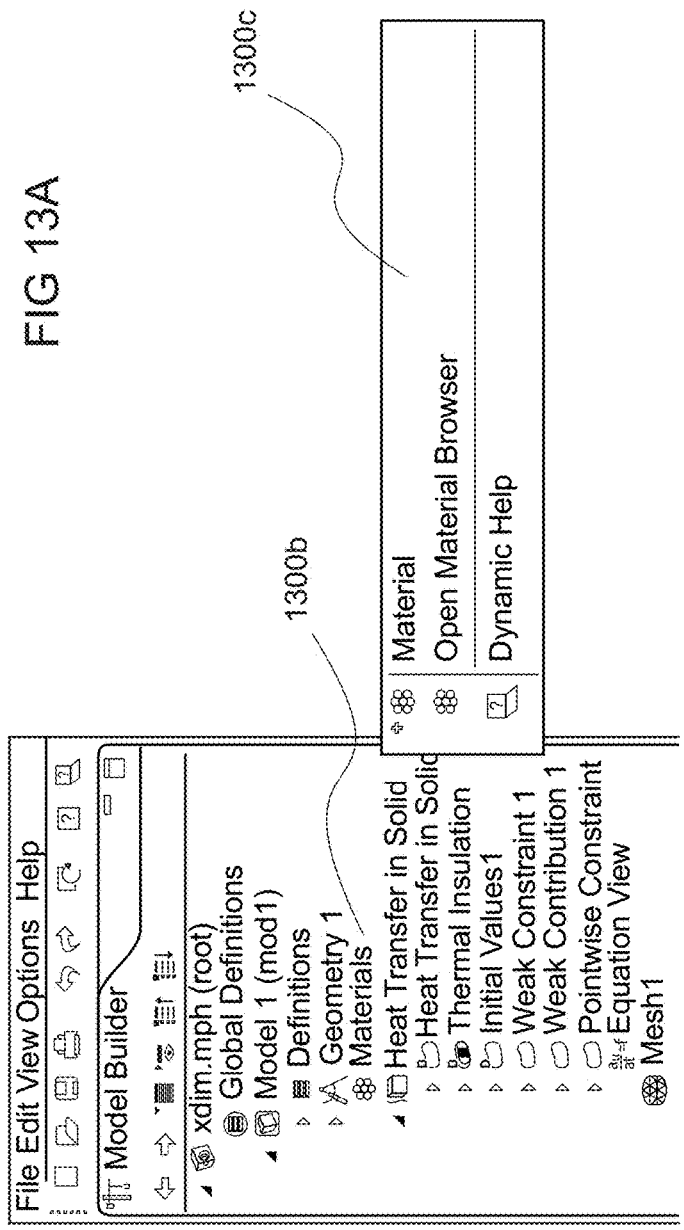
FIG. 13A to 13C illustrate exemplary menus and a settings window for defining material properties on a product of selections, according to some aspects of the present disclosure.
Figure 13B:
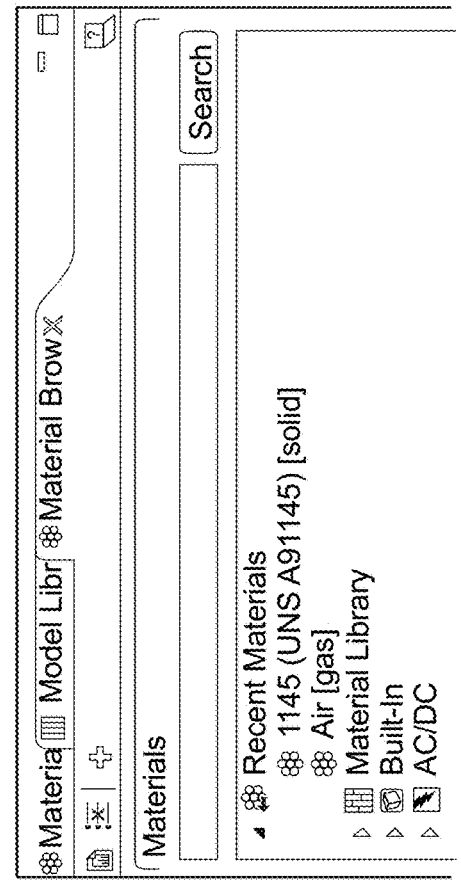
Figure 13C:
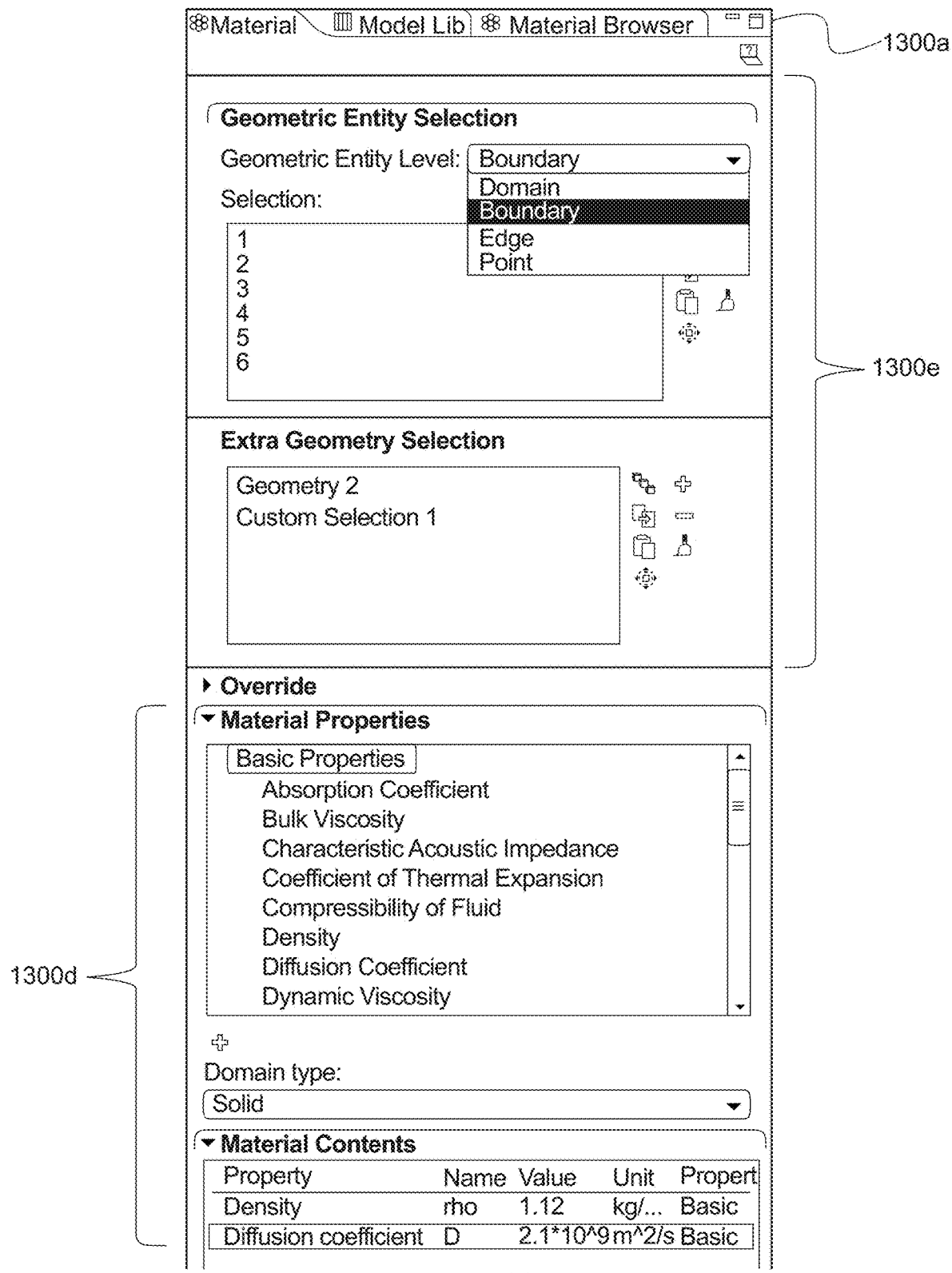

Referring now to FIG. 13A-13C, exemplary menus and a settings window for defining material properties on a product of selections are illustrated, according to some aspects of the present disclosure. In some aspects, a settings window (e.g., 1300a) can be accessed by selecting a materials node (1300b) and further selecting material (e.g., 1300c). Once in the settings window, a user can define various material properties (e.g., 1300d). A product of selections can be constructed using a product of selections tool as exemplified by interface 1300e. The material properties set in the interface (e.g., 1300d) can automatically be defined on the product of selections. Alternatively, it is also contemplated that a predefined material can be used on a product of selections by accessing a material browser, selecting a predefined material, selecting the node for the predefined material, accessing a settings window including a product of selections tool, and then defining a material on a product of selections. A selected material can include an identifier, which may be used when defining materials on products of selections in other ways, such other ways are described elsewhere.

It is also contemplated that in some aspects materials and other properties can be defined using a specific tool for defining a material and other properties on geometric entities in extra geometries. For example, when forming products of entities with entities in base geometries, the material and other properties defined on the entities in the extra geometries may be automatically defined on the product of entities. Several such tools may be combined in one feature, where each tool is located in a part of a settings window of the feature. It is also possible that the tools may be separate features. Such tools may be referred to as "materials sections tools".

Figure 14B:

Referring now to FIGS. 14A-14B, exemplary materials settings windows are illustrated for defining properties on a geometry that may be an extra geometry forming a product geometry, according to some aspects of the present disclosure. It is contemplated that such a settings window can include different parts for different kinds of materials sections. Examples of such parts include layered structures, pipes, beam cross sections, and inhomogeneous materials.

It is contemplated that layered structures can be used for examples describing multi-layer shells. A multi-layered shell can include several layers in a specific order. Each layer may have certain properties such as material, layer thickness, and in some instance layer orientation. Each layer can be identified by one or more identifiers. Several such layers can form a layer section that may be identified by a user editable identifier. The layered structures materials section can include user editable fields and drop down lists. Exemplary aspects of such fields from FIG. 14A include number of layers 1400*a*, layers section identifier 1400*b*, layer order 1400*c*, layer thickness 1400*d*, layer material 1400*e*, layer orientation 1400*f*, and layer identifiers 1400*g*.

It is contemplated that in some aspects the number of layers field a user can define the number of layers that are in a layer section. The number affects the number of fields and drop down list that can be made available. For instance if 3 is typed in the number of layers field the system may automatically create 3 sets of fields and drop down list, each set of fields and drop down lists describing one layer.

It is contemplated that in some aspects the layers section identifier can include a user editable identifier for a set of layers.

It is contemplated that in some aspects the layer order can describe the position of an individual layer among other layers. Such a position may be described by a number, for instance 1, designating a lowest layer, and 2, the layer above the lowest layer etc.

It is contemplated that in some aspects layer thickness can describe the thickness of an individual layer. This may be described as a fraction of a total thickness of all layers, as a physical quantity, or as an expression of physical quantities.

It is contemplated that in some aspects layer material can include a user editable field where a user may identify a material by its unique identifier. It is also contemplated that a user may identify a material in some other way or there may be several sub fields where a user could designate one or more material properties.

It is contemplated that in some aspects layer orientation can include a list with selections such as isotropic, or anisotropic, where a section in a settings window may allow the definition of the orientation of the layer in relation to a coordinate system.

It is contemplated that in some aspects layer identifiers may include the name of a layer or descriptors. A user may add more identifiers as needed. Layer identifiers may be used elsewhere in the software to refer to all layers including such identifiers.

In some aspects, a layered structures materials section can includes a layer number menu where a user can select a layer, as exemplified by element 1400*j* in FIG. 14B. An example of such a layered structures materials section is exemplified by element 1400*i*. In another part of the layered structures materials section, layer thickness, layer material, layer orientation, and layer identifiers can be specified for the selected layer. In this example, the user defines the layer in a certain position rather than defining layers and their position.

It is further contemplated that an extra geometry can be automatically constructed or formed using information received from the described fields. For example, a line segment can be constructed, where the line segment is divided into several sub-line segments, and each sub-line segment having a length defined by the layer thickness field. The order of the line segments can be defined by the layer order fields and the material.

In some aspects, it is contemplated that an exemplary pipe materials section can include user editable fields and lists. Examples of such fields and lists include pipe shape, surface roughness, layers, and pipe identifiers. Pipe shape can describe the cross section of the pipe. The cross-sections can include predefined shapes such as circular with a user defined radius, square or rectangular with user defined sides, other two-dimensional shapes that may be defined by a set of parameters, user defined cross section with a user defined cross sectional area and wetted perimeter, or a user defined cross-section which may be imported or constructed using geometry tools in a multiphysics modeling system. A drop down list may include the possibility to describe surface roughness of pipes using several common roughness parameters, or the roughness may be defined as a physical quantity.

It is contemplated that layers can be described by lists and user editable fields such as those described for layered structures. It is also possible that a layer can be referred to by an identifier. Pipe identifiers can include the name of a pipe material section or descriptors. A user may add more identifiers if needed. Pipe identifiers may be used elsewhere in the system to refer to all pipes including such identifiers.

In some aspects, beam cross sections are contemplated that can include fields such as cross-sectional area, moment of inertia about local z-axis, distance to shear center in local z direction, moment of inertia about local y-axis, distance to shear center in local y direction, or torsional constant. Bending stress evaluation points can be chosen, for example, from section heights or from specified points using list that depend on which one of the following two sets of fields that may be present. If based on section heights, the list can include, section height in local y-direction, section height in local z direction, torsional section modulus, max shear stress factor in local y direction, and max shear stress in local z direction. If based on specific points, the list can include list of points in cross section, torsional section modulus, max shear stress factor in local y direction, and max shear stress factor in local z direction.

In some aspects, a materials section tool for inhomogeneous materials is contemplated that can include edit fields and lists. Examples of such edit fields and lists include fractions and material for each fraction. The materials section tool can include operations for saving materials sections to a file in a memory or loading materials sections from a file to a memory accessible to the modeling system.

Figure 15A:
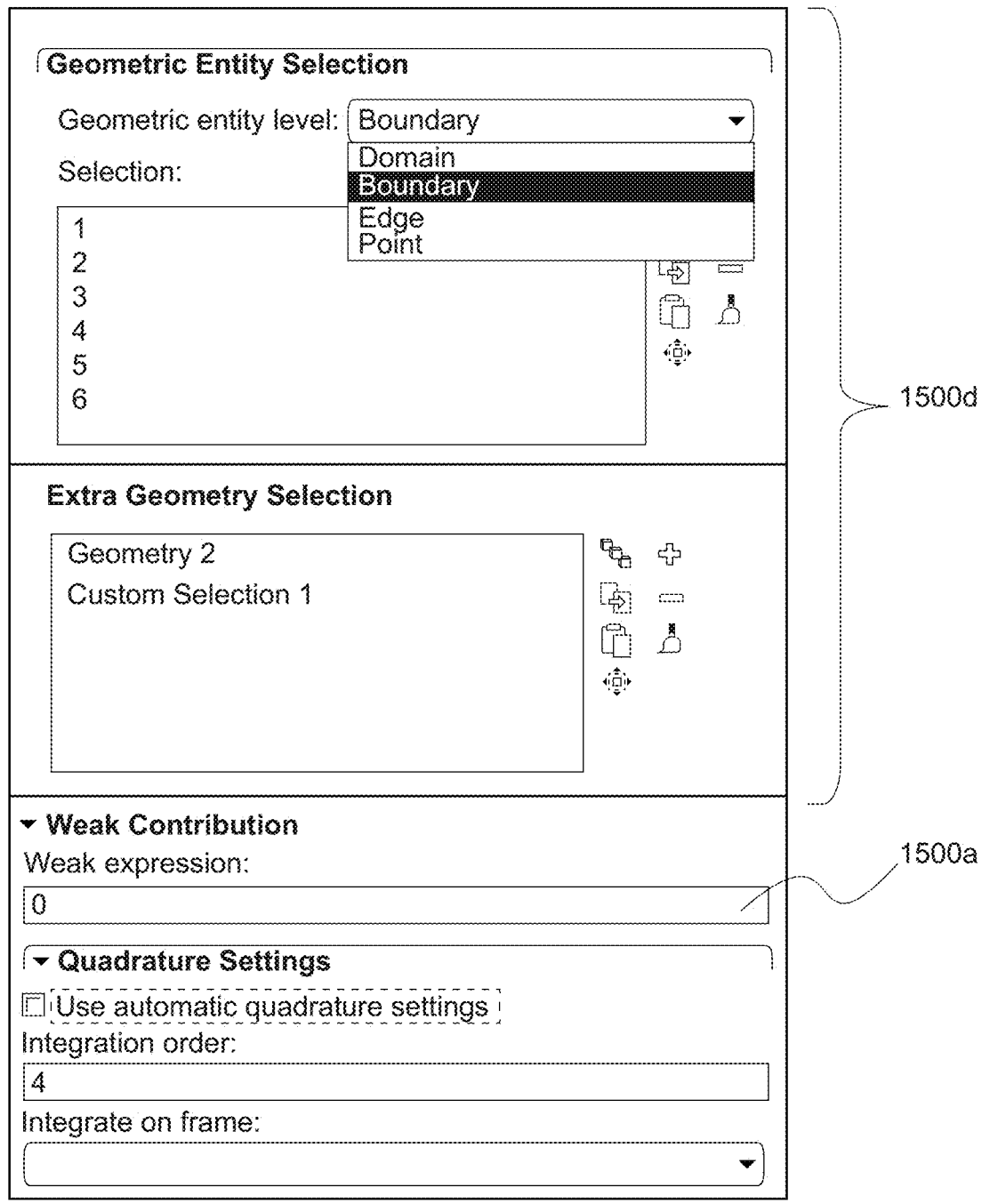
FIGS. 15A to 15C illustrate exemplary menus and a settings window for adding weak contributions to a product of selections, according to some aspects of the present disclosure.
Figure 15B:
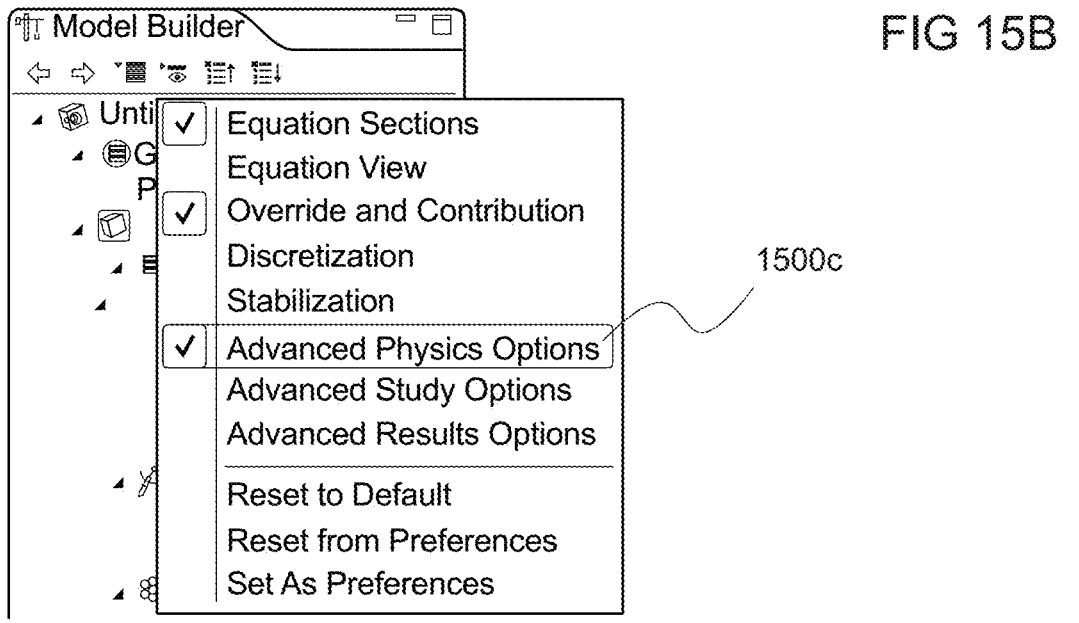
Figure 15C:
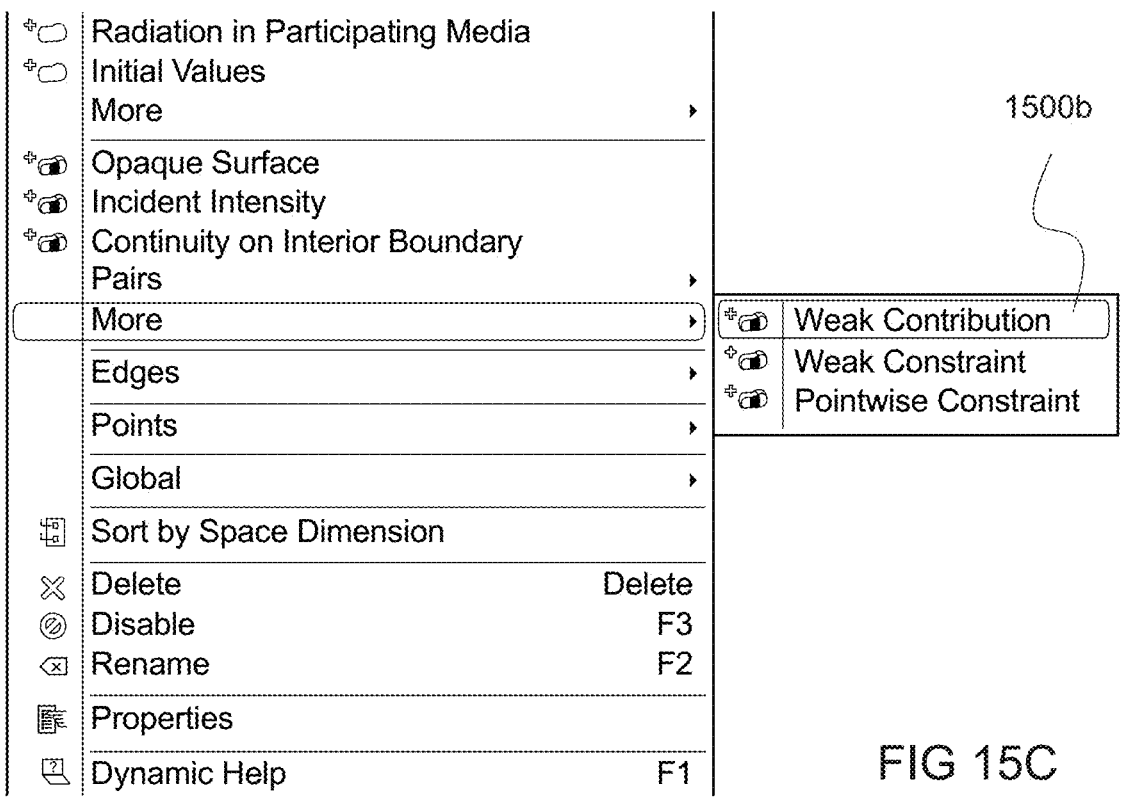

Referring now to FIGS. 15A-15C, exemplary menus and a settings window for adding weak contributions to a product of selections is illustrated, according to some aspects of the present disclosure. In some aspects, a user can add a weak contribution to a portion of a product geometry using the product of selections tool (see, e.g., FIG. 9). If the user specifies the weak contribution as a weak equation and also defines and uses an auxiliary dependent variable (shown elsewhere), such a dependent variable can then be created on a product of selections. The ability to define weak contributions (or weak constraints, or point-wise constraints or auxiliary dependent variables) on product geometries can be a desirable operation that offers computational advantages. The exemplary settings windows illustrated in FIG. 15A can be accessed by selecting a physics interface node. In some aspects, as illustrated in FIG. 15C, further selections are contemplated including an option for selecting "more", "edges", "point", or "global" options and selecting an add weak contribution option 1500b. In addition, it is contemplated that in some aspects an advanced physics option 1500c is selected, as illustrated in FIG. 15B. The settings window exemplifies a product of selections interface 1500d associated with a product of selections tool (see, e.g., FIG. 9) which may be used to define a weak expression entered in a weak expressions field 1500a on a product of selections.

Figure 16A:
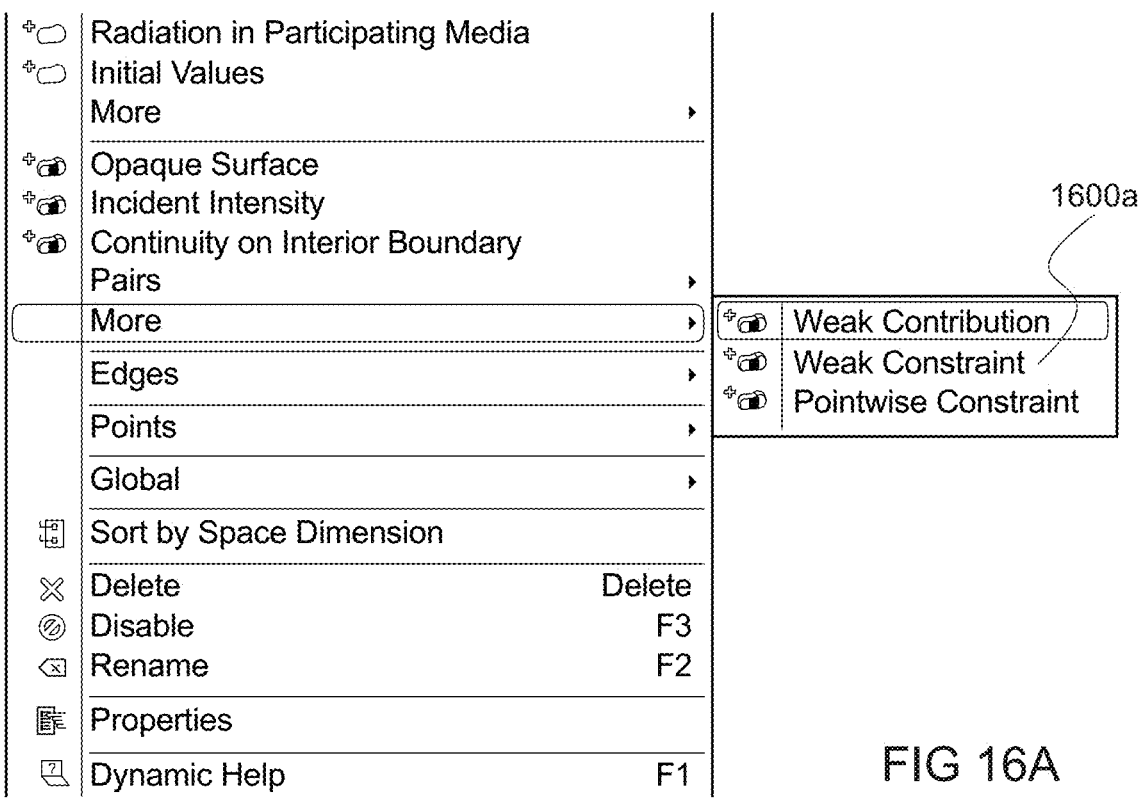
FIGS. 16A to 16B illustrate exemplary menus and a settings window for adding a weak constraint to a product of selections, according to some aspects of the present disclosure.
Figure 16B:
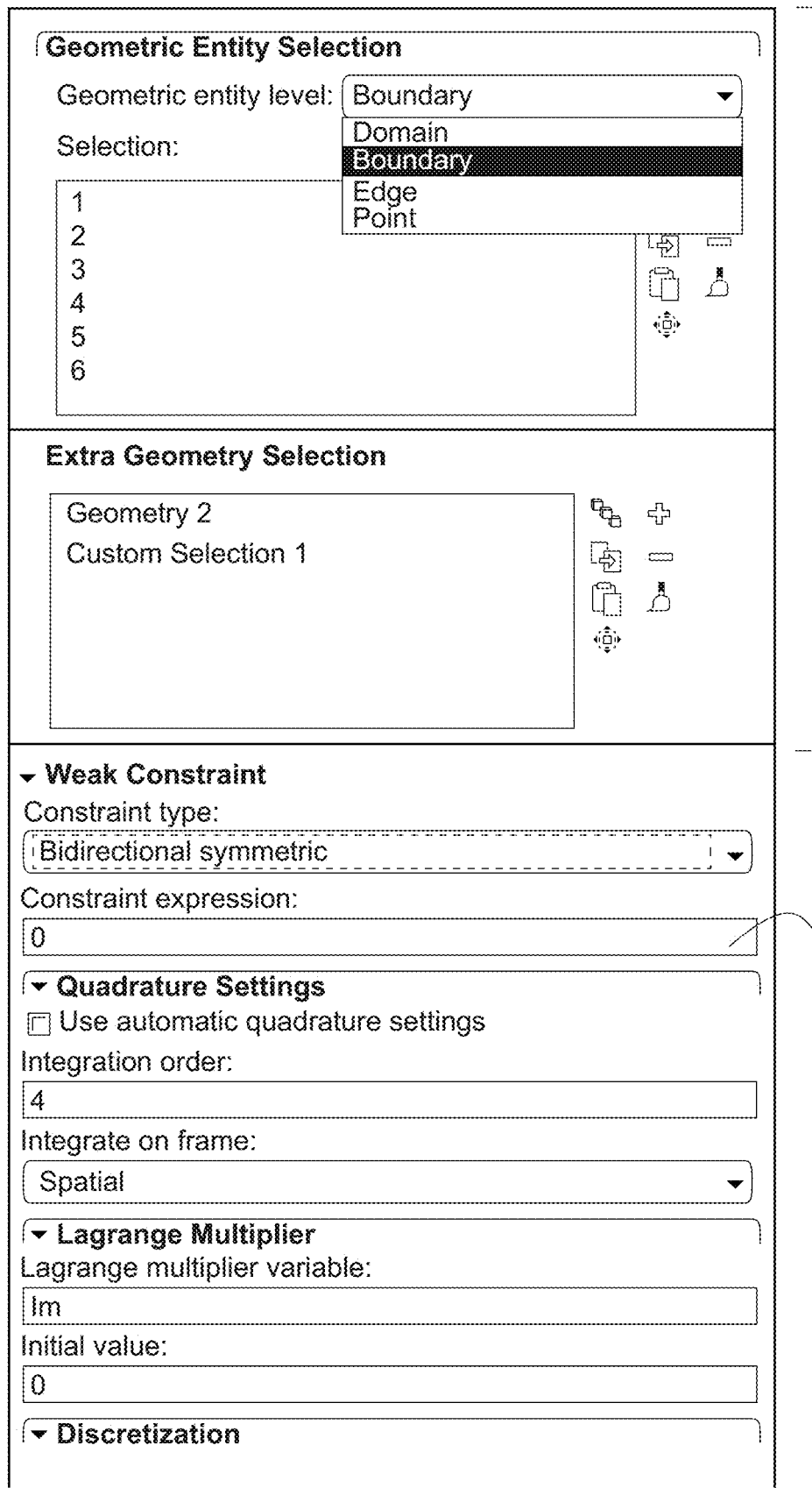

Referring now to FIGS. 16A-16B, exemplary menus and a settings window for adding a weak constraint to a product of selections are illustrated, according to some aspects of the present disclosure. The settings window exemplified by FIGS. 16A-16B can be accessed by selecting a physics interface node. In some aspects, further selections from a menu include selecting "more", "edges" or "point" and selecting add weak constraint 1600a, which can then open a settings window. The settings window exemplified in FIG. 16B includes a product of selections interface 1600b associated with a product of selections tool for defining a weak constraint entered in the constraint field 1600c on a product of selections.

Figure 17A:
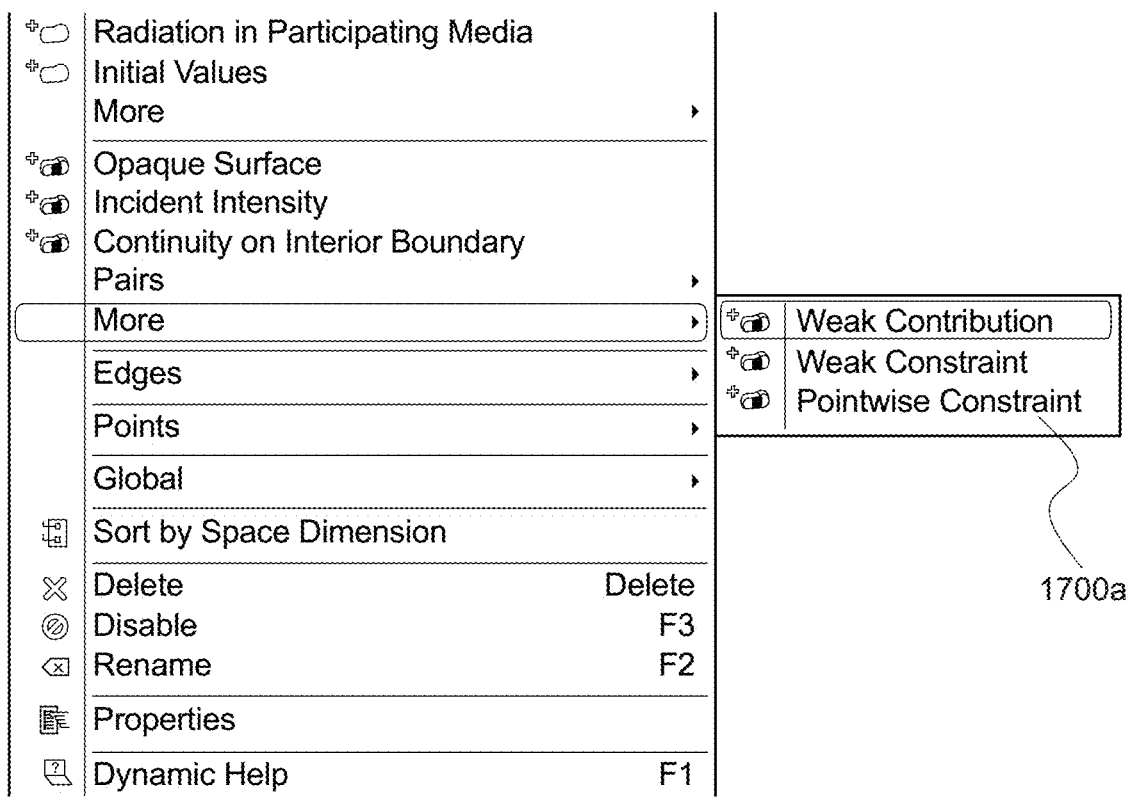
FIGS. 17A to 17B illustrate an exemplary menus and a settings window for adding a pointwise constraint to a product of selections, according to some aspects of the present disclosure.
Figure 17B:
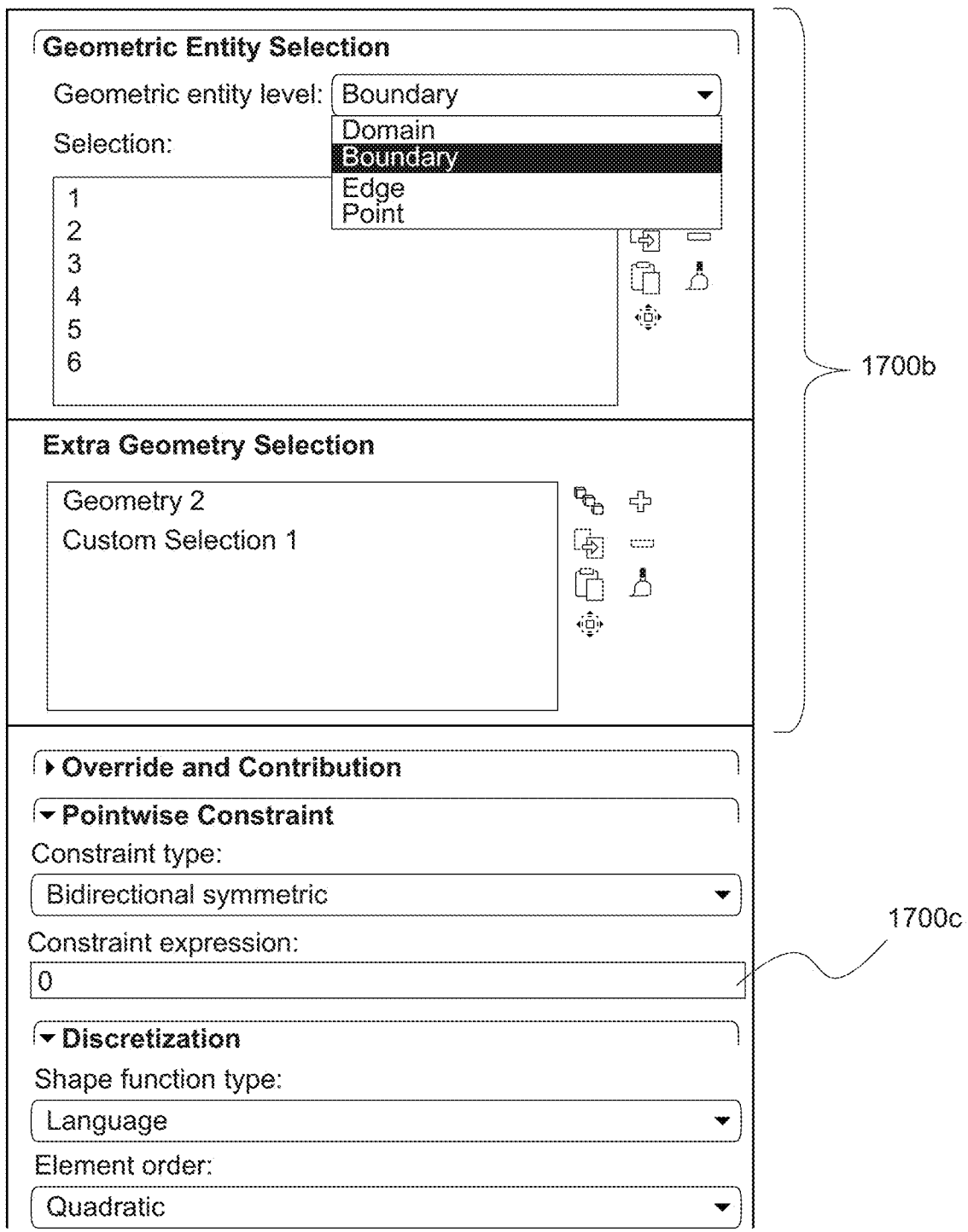

Referring now to FIGS. 17A-17B, exemplary menus and a settings window for adding a point-wise constraint to a product of selections is illustrated, according to some aspects of the present disclosure. The settings window exemplified by FIGS. 17A-17B can be accessed by selecting a physics interface node. In some aspects, further selections from a menu include selecting "more", "edges" or "point" and selecting add pointwise constraint 1700a, which can then open a settings window. The settings window exemplified in FIG. 17B includes a product of selections interface 1700b associated with a product of selections tool for defining a pointwise constraint entered in the constraint field 1700c on a product of selections.

Figure 18A:
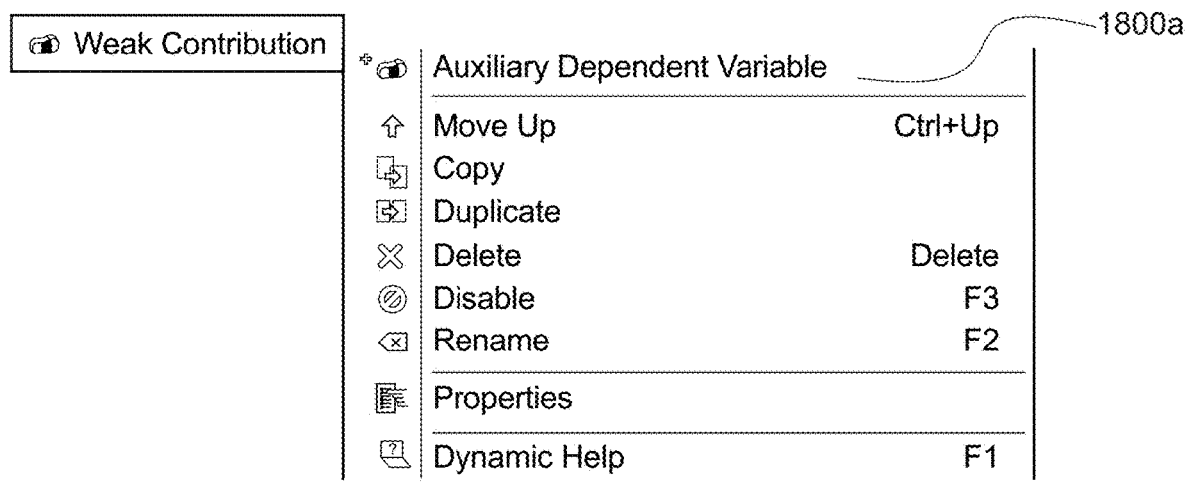

Referring now to FIGS. 18A-18B, exemplary menus and a settings window for adding an auxiliary dependent variable to a product of selections is illustrated, according to some aspects of the present disclosure. An auxiliary dependent variable may be added by selecting an auxiliary dependent variable node 1800a. Adding an auxiliary dependent variable as well as a weak equation can be desirable for allowing a user to define weak equations on a product of selections. The field variable name 1800b can be the name of the dependent variable. An initial value and an initial time derivative may also be set, as exemplified in FIG. 18B. A user may also use a product of selections interface 1800c associated with a product of selections tool (see, e.g., FIG. 9) to define the auxiliary dependent variable on at least a portion of the product selections on which the weak contribution is defined. Typically, the portion can include all the product of selections on which the weak contribution is defined. In some aspects, a product of selections tool of the auxiliary dependent variable may not define an auxiliary dependent variable outside of the product of selections on which the weak contribution is defined. In addition, a user may define the shape function type and element order used when the auxiliary dependent variable is discretized.

Figure 9:
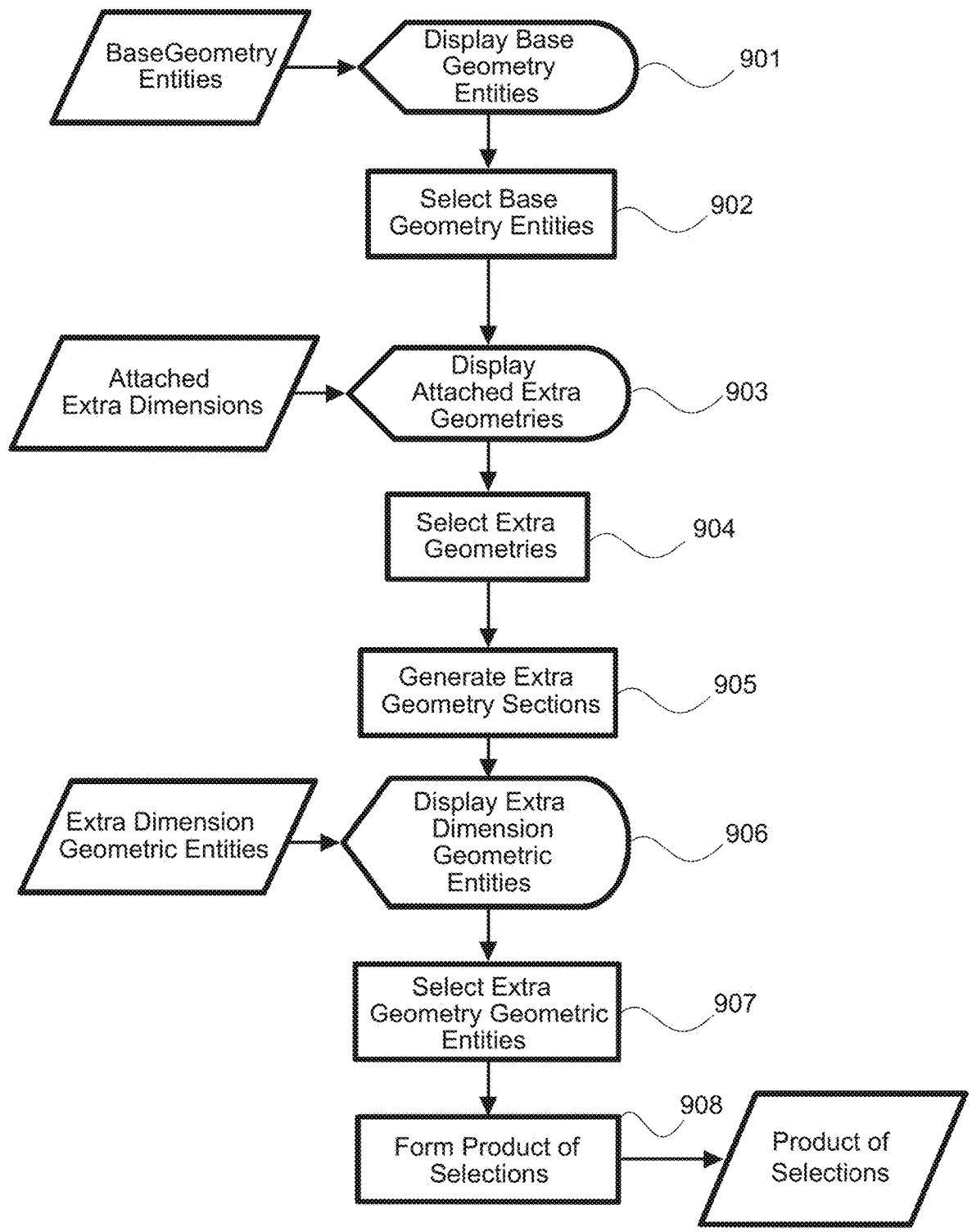
FIG. 9 illustrates an exemplary a flowchart for creating a product of selections, according to some aspects of the present disclosure.

It is contemplated that in some aspects of the simulations methods and systems described herein that initial values on products of selections described, for example, in FIG. 9 and thereafter, are set and that the setting of the initial values is implemented through physics interfaces, such as those of a multiphysics modeling system.

It is further contemplated that PDEs can be applied to form a system of user editable coupled PDEs, whether the PDEs are predefined on product geometries by physics interfaces or by a user. To solve the system of coupled PDEs, the PDEs can be discretized and DOFs defined on discretized product geometries. To determine the number and locations of DOFs, the base geometry and extra geometries are meshed, discretizing the base geometry and the extra geometries in mesh elements expressed by shape functions. A discretized product geometry is formed by the set of mesh points on the base geometry and the set of mesh points on extra geometries forming a Cartesian product. Such a Cartesian product includes tuples of mesh points on which the DOFs are defined. Once the base geometry and the extra geometries have been meshed, a product geometry has been formed, and DOFs have been assigned, then the model may be solved.

Figure 19:
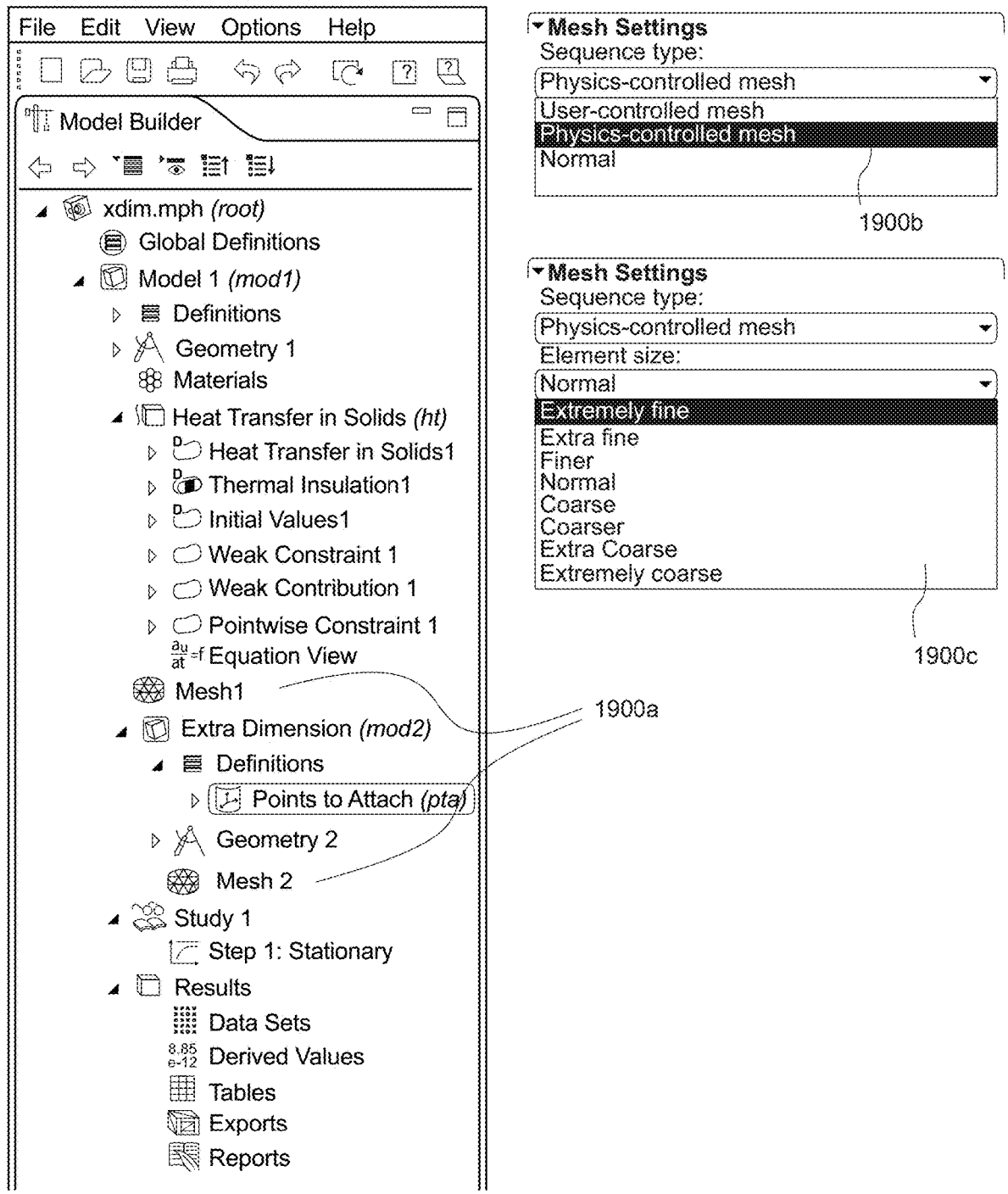
FIG. 19 illustrates an exemplary menus and a settings window for defining a mesh on a product of selections, according to some aspects of the present disclosure.

Referring now to FIG. 19, exemplary menus and a settings window for defining a mesh on a product of selections is illustrated, according to some aspects of the present disclosure. The mesh settings window for the base geometry and the extra geometries can be accessed by selecting mesh options 1900a (e.g. Mesh1, Mesh2 respectively) under the base model and under the extra dimensions, as exemplified in FIG. 19. A mesh can either be user defined or physics controlled (e.g., 1900b). If a user selects user controlled mesh, then various additional settings windows may become available in relation to child nodes of the mesh node. If the mesh is physics controlled the user may further select an element size (e.g., 1900c).

In some aspects, PDEs can be discretized according to the following process exemplified as a 2-D problem for simplicity. In some aspects, a starting point for a discretization process is a weak formulation of the problem.

Discretization of the constraints identified by Equation 1 can start with the constraints on the boundaries, B.

$$0 = R^{(2)} \text{ on } \Omega \, 0 = R^{(1)} \text{ on } B \qquad \text{Equation 1} \quad 0 = R^{(0)} \text{ on } P$$

For each mesh element in B (e.g., each mesh edge in B), the Lagrange points of some order k are considered and denoted by $x^{(1)}_{mj}$, where m is the index of the mesh element. Then the discretization of the constraint is $$0 = R^{(1)}(x_{mj}^{(1)}) \qquad \text{Equation 2}$$

where the constraints hold pointwise at the Lagrange points.

The Lagrange point order k can be chosen differently for various components of the constraint vector $R^{(1)}$, and it can also vary in space. In some aspects of modeling system, such as multiphysics modeling systems, data structures denote the k as cporder. The constraints on domains Ω and points P can be discretized in the same way. All the pointwise constraints can be collected in one equation 0=M where M is the vector including all the right-hand sides.

A multiphysics modeling system can approximate the dependent variables with functions in the chosen finite element space(s). This means that the dependent variables are expressed in terms of the degrees of freedom as $$u_l = \sum_i U_i \varphi_i^{(l)} \quad \text{Equation 3}$$

where $\varphi_i^{(l)}$ are the shape functions for variable $u_l$ and letting U be the vector with the degrees of freedoms $U_i$ as its components. This vector can be called the solution vector because it is include the what is desired to be computed. M depends only on $U_i$ so the constraints can be written 0=M(U).

The difference between the discretizing of PDEs on a normal geometry and a PDE on a product geometry can be in how the shape functions are expressed. The shape functions can be defined on a base geometry and an extra geometry. While the above expression may still be used $\varphi_i^{(l)}$ should be seen as being composed of the shape functions on the base geometry $\psi_a^l$ and the shape functions on the extra geometry $\theta_b^l$. In some aspects, shape functions can form a product where:

$$u_l = \Sigma_a \Sigma_b U_{ab} \psi_a^l \theta_b^l \quad \text{Equation 4}$$

In the more general case we may view $\varphi_i^{(l)}$ of Equation 3 as a function of $\psi_a^l$ and $\theta_b^l$.

Now the weak equation is considered:

$$0 = \int_\Omega W^{(2)} dA + \int_B W^{(1)} ds + \sum_P W^{(0)} - \int_\Omega v \cdot h^{(2)T} \mu^{(2)} dA - \int_B v \cdot h^{(1)T} \mu^{(1)} ds - \sum_P v \cdot h^{(0)T} \mu^{(0)} \quad \text{Equation 5}$$

where $\mu^{(i)}$ are the Lagrange multipliers.

To discretize the weak equation, the dependent variables are expressed in terms of the DOFs as described earlier. Similarly, the test functions can be approximated with the same finite elements (this is the Galerkin method):

$$v_l = \sum_i V_i \varphi_i^{(l)} \quad \text{Equation 6}$$

Because the test functions occur linearly in the integrands of the weak equation, it can be enough to specify that the weak equation holds when the test functions are chosen as shape functions:

$$v_l = \varphi_i^{(l)} \quad \text{Equation 7}$$

When substituted into the weak equation, this gives one equation for each i.

Now the Lagrange multipliers can be discretized. Let $$\Lambda^{(d)}_{mj} = \mu^{(d)}(x^{(d)}_{mj}) \omega^{(d)}_{mj} \quad \text{Equation 8}$$

where $x_{mj}^{(d)}$ are the Lagrange points defined earlier, and $\omega^{(d)}_{mj}$ are certain weights, as discussed elsewhere in more detail. The term $$\int_B \varphi_i \cdot h^{(1)T} \mu^{(1)} ds \quad \text{Equation 9}$$

is approximated as a sum over all mesh elements in B.

The contribution from mesh element number m to this sum is approximated with the Riemann sum $$\sum_j \varphi_i(x_{mj}^{(1)}) \cdot h^{(1)T}(x_{mj}^{(1)}) \mu^{(1)}(x_{mj}^{(1)}) w_{mj}^{(1)} = \sum_j \varphi_i(x_{mj}^{(1)}) \cdot h^{(1)T}(x_{mj}^{(1)}) \Lambda_{mj}^{(1)} \quad \text{Equation 10}$$

where $\omega^{(1)}_{mj}$ is the length (or integral of ds) over the appropriate part of the mesh element. The integral over $\Omega$ and the sum over P can be similarly approximated.

The above operation can yield the following discretization of the weak equation:

$$0 = L - N_F \Lambda \quad \text{Equation 11}$$

where L is a vector whose ith component is $$\int_\Omega W^{(2)} dA + \int_B W^{(1)} ds + \sum_P W^{(0)} \quad \text{Equation 12}$$

evaluated for $$v_i = \varphi_i^{(l)} \quad \text{Equation 13}$$

$\Lambda$ is the vector including all the discretized Lagrange multipliers $$\Lambda_{mj}^{(d)}.$$

$N_F$ is a matrix whose ith row is a concatenation of the vectors $$\varphi_i(x_{mj}^{(d)}) h^{(d)}(x_{mj}^{(d)})^T \quad \text{Equation 14}$$

For problems using ideal constraints, NF is equal to the constraint Jacobian matrix N, which is defined as $$N = \frac{\partial M}{\partial U} \quad \text{Equation 15}$$

To sum up, in some aspects, the discretization of the stationary problem is $$0 = L(U) - N_F(U) \Lambda \quad \text{Equation 16} \quad 0 = M(U)$$

It is contemplated that an objective of the above operation is to solve this system for the solution vector U and the Lagrange multiplier vector $\Lambda$. L is called the residual vector, M is the constraint residual, and $N_F$ is the constraint force Jacobian matrix. M is redundant in the sense that some pointwise constraints occur several times. Similarly, $\Lambda$ is redundant. Equations solvers remove this redundancy.

The integrals occurring in the components of the residual vector L (as well as K, as discussed elsewhere herein) are computed approximately using a quadrature formula. Such a formula can compute the integral over a mesh element by taking a weighted sum of the integrand evaluated in a finite number of points in the mesh element. The order of a quadrature formula on a 1-D, triangular, or tetrahedral element is the maximum number k such that it exactly integrates all polynomials of degree k. For a quadrilateral element, a formula of order k integrates exactly all products $p(\xi_1)q(\xi_2)$, where p and q are polynomials of degree k in the first and second local coordinates, respectively. A similar definition can be applied for hexahedral and prism elements. The accuracy of the quadrature can increase with the order, while the number of evaluation points also increases with the order, as well. As a rule of thumb, in some aspects the order may be twice the order of the shape function for the finite element being used. In some aspects, multiphysics data structures can refer to the order of the quadrature formula as gporder, where gp denotes Gauss points. In certain aspects, the maximum available order of the quadrature formula (the gporder value) may be (i) 41 for 1-D, quadrilateral, and hexahedral meshes; (ii) 30 for triangular and prism meshes; and (iii) 8 for tetrahedral meshes.

Discretization of a time-dependent problem may be similar to a stationary problem $$0 = L(U, \dot{U}, \ddot{U}, t) - N_F(U, t) \wedge \quad \text{Equation 17} \quad 0 = M(U, t)$$

where U and $\wedge$ now depend on time t.

Now, considering a linearized stationary problem, the linearization "point" $u_0$ corresponds to a solution vector $U_0$. The discretization of the linearized problem is $$K(U_0)(U-U_O) + N_F(U_O) \wedge = L(U_0) \quad \text{Equation 18} \quad N(U_O)(U-U_0) = M(U_0)$$

where K is called the stiffness matrix, and $L(U_0)$ is the load vector. For problems given in general or weak form, K is the Jacobian of $-L$:

$$K = \frac{\partial L}{\partial U} \quad \text{Equation 19}$$

The entries in the stiffness matrix can be computed in a similar way to the load vector, namely by integrating certain expressions numerically. This computation is called the assembling the stiffness matrix.

If a problem is linear, then its discretization can be written $$KU + N_F \wedge = L(0) \quad \text{Equation 20} \quad NU = M(0)$$

Similarly, for a time-dependent model the linearization involves the damping matrix $$D = \frac{\partial L}{\partial \dot{U}} \quad \text{Equation 21}$$

and the mass matrix $$E = \frac{\partial L}{\partial \ddot{U}} \quad \text{Equation 22}$$

When E=0, the matrix D is often called the mass matrix instead of the damping matrix.

Discretization of an eigenvalue problem is $$\lambda^2 E(U_O)U - \lambda D(U_O)U + K(U_o)U + N_F(U_0) \wedge = 0 \quad \text{Equation 23} \quad N(U_O) U = 0$$

where $U_0$ is the solution vector corresponding to the linearization "point." If the underlying problem is linear, then D, K, and N do not depend on $U_0$, which yields:

$$KU + N_F \wedge = \lambda DU - \lambda^2 EU \quad \text{Equation 24} \quad NU = 0$$

In some aspects, weak constraints provide an alternative way to discretize the Dirichlet conditions, as opposed to the pointwise constraints described earlier. The idea is to regard the Lagrange multipliers $\mu^{(d)}$ as field variables and thus approximate them with finite elements. This concept also introduces corresponding test functions $v^{(d)}$. Multiplying the Dirichlet conditions with these test functions and integrating gives the following system, in the case of a stationary problem in 2-D:

$$0 = \int_\Omega W^{(2)} dA + \int_B W^{(1)} ds + \sum_P W^{(0)} - \int_\Omega v \cdot h^{(2)T} \mu^{(2)} dA - \quad \text{Equation 25}$$

$$\int_B v \cdot h^{(1)T} \mu^{(1)} ds - \sum_P v \cdot h^{(0)T} \mu^{(0)}$$

$$0 = \int_\Omega v^{(2)} \cdot R^{(2)} dA$$

$$0 = \int_B v^{(1)} \cdot R^{(1)} ds$$

$$0 = \sum_P v^{(0)} \cdot R^{(0)}$$

These weak equations can be combined to form a single equation. This treatment of the Lagrange multipliers as ordinary variables can produce a weak equation without constraints. This can be useful if the Lagrange multipliers are of interest in their own right.

It is contemplated that combining pointwise and weak constraints unique situations can arise. For example, if both types of constraints are present for some variable, and the constraints are in adjacent domains, the resulting discretization may not work. Instead, it is contemplated that pointwise constraints can be obtained from the weak constraints formulation by using the shape functions $$\delta(x - x_{mj}^{(d)}) \quad \text{Equation 26}$$

for the Lagrange multipliers and their test functions, that is, let $$\mu^{(d)} = \sum_{mj} \Lambda_{mj}^{(d)} \delta(x - x_{mj}^{(d)}) \quad \text{Equation 27}$$

where $\delta$ is Dirac's delta function.

In some aspects, physics interfaces in modeling systems can be operable to predefine dependent variables on product geometries. This is can be a desirable aspect as exemplified below.

An exemplary aspect of the present disclosure can include a structural shell interface where a user describes the thickness direction of a shell as an extra dimension and a surface constituting a base geometry. In general, a shell element discretization is suited for structures which are thin in one direction. The displacement, stresses, and strains may be described by displacement and rotation physical quantities located on the mid-surface of the shell. Such a mid-surface may be described using a base model including a three-dimensional surface constituting a base geometry. The three-dimensional surface may be curved in a three dimensional space. For linear elastic problems, this may be the only information needed for solving a structural problem, since the shell theory assumptions allows for an analytical representations of the variations of all structural quantities in the thickness direction.

An extra dimension can be introduced when some physical quantity varies along the thickness and when this variation may not be handled analytically. It may also be introduced as a convenience for describing a variation in material in the shell for instance for multi layered shells. The thickness direction is then described as a line segment which is an extra geometry. The extra geometry may form a product geometry with the base geometry and the relevant physical quantities may then be defined on the product geometry. There are two situations where such an approach may be used for structural shells. The first is where stiffness contributions from different levels in the shell cannot be analytically integrated through the thickness. This would for example be the case for a nonlinear elastic or hyperelastic materials. In this case an extra dimension can be used to integrate nonlinear functions through the thickness, that is, the extra geometry. The second is where state variables are computed and stored at different levels in the shell thickness direction. This would be the situation for e.g. elastoplastic and creep materials. The concept is examined more in detail below in the context of creep materials.

For a material which experiences creep, the rate of the creep strain tensor ($\dot{\epsilon}_c$) can be described as $$\dot{\epsilon}_c = f(\sigma, T, t) \qquad \text{Equation 28}$$

Here, $\sigma$ denotes the stress tensor, T the temperature, and t the time. The function $f$ is usually strongly nonlinear. The creep strain tensor is symmetric, and will thus have six independent components. Since the stress state, and possibly also the temperature, will vary through the thickness of the shell, the creep strain rate will have a strong variation with the local coordinate through the thickness ($\zeta$).

The constitutive law used for computing the stresses is $$\sigma = D:(\epsilon - \epsilon_c) \qquad \text{Equation 29}$$

where : denotes inner product. D is the fourth order elastic constitutive tensor and $\epsilon$ is the total strain tensor which is computed from the displacements and rotations at the midsurface of the shell. To compute the stress and the Jacobians for the stiffness matrix, creep strain should be available through the thickness. The expressions, variables and parameters may be expressed in a symbolic form in a GUI in a physics or multiphysics simulation system. Furthermore, predefined expressions can be user editable.

Other physical quantities such as temperature and heat flux may also be described in physics interfaces using PDEs. In these PDEs, physical properties may be expressed as functions of physical quantities in PDEs defined on the product geometry. These PDEs may form a coupled system of PDEs, together with the PDEs describing the structural problem (including, for example creep strain). The PDEs of such a coupled system may be user editable.

The extra geometry, which is in the thickness direction, may be discretized and form a product geometry with the discretized base geometry. The PDEs describing the structural problem may be discretized together with PDEs describing other physical quantities and may then be expressed as degrees of freedom on the discretized product geometry. The shape functions selected for the structural problem can have any type of continuity in the direction along the thickness.

The structural problems may be solved independently or together with equations for other physical quantities using a numerical solver. A user may thus be able to model creep strain independently or coupled to other physical quantities (described in other physics interfaces) in a shell interface by describing the thickness direction using an extra geometry, said extra geometry forming a product geometry with the base geometry.

It may be desirable to model multi-layer shells using an extra geometry to construct product geometries. In particular, it may be beneficial to describe the thickness direction using either a materials section feature, including functionality for describing layered structures, or by including such edit fields in for example a settings window for a shell physics interfaces.

Another exemplary aspect includes a structural beam interface. The same considerations as for shells apply. The difference is that the standard beam formulation introduces displacements and rotations along a line or a curve. A 2-D extra geometry can be specified for representing the beam cross section and nonlinear functions or state variables may be described in the cross section.

For the structural beam aspect, a base geometry can be constructed as a line segment or curve segment, which may be curved or twisted in a 3-D space. The extra geometry representing the cross section may be loaded from a file, obtained from a library of beam cross sections, or constructed using the tools for creating geometries described elsewhere. It is also possible that the cross section is described by referring to a beam cross-section defined in a materials section described elsewhere. A product geometry is formed between the base geometry and the extra geometry. Various user editable expressions describing physical quantities, for instance the creep strain tensor are defined on the product geometry, in the form of PDEs, possibly forming a coupled system with other PDEs. The model is discretized analogously to the shell example and solved either independently or as the coupled system using a numerical solver. A user may thus be able to model creep strain independently or coupled to other physical quantities (described in other physics interfaces) in a structural beam interface by describing the cross section using an extra geometry, said extra geometry forming a product geometry with the base geometry.

Yet another exemplary aspect is a packed bed reactor which can be modeled using a base geometry and forming a product geometry with an extra geometry. The packed bed reactor is one of the most common reactors in the chemical industry, for use in heterogeneous catalytic processes. Such a reactor may include a container filled with catalyst particles. These particles may be supported by a structure, like tubes or channels, or they can be packed in one single compartment in the reactor. Some of the complexities of modeling mass and energy transport in a reactor lies in the description of the porous structure, which gives transport of different orders of magnitudes within the particles and between the particles. In most situations, the structure between particles is described as macroporous structure and the particle radius can be of the order of magnitude of 1 mm. When a pressure difference is applied across the bed, convection arises in the macroporous bulk of the reactor. The pores inside the catalyst particles form the microstructure of the bed and transport in this microstructure takes place mainly in the form of diffusion. By applying an extra dimension approach, a time dependent model can provide the mass and reaction distributions in the reactor and within each catalyst pellet in the reactor. This makes it possible to evaluate the utilization of catalyst load, optimal pellet size, or inlet temperature.

A model can be defined for a reactor where the pressure drop, convection, and diffusion takes place in three-dimensions. Assuming that the particles are spherical, only the transport and reactions along the radius may be specified in a model. Different dimensionalities with respect to the reactor and pellets would use a similar approach.

Referring now to FIGS. 20-29, an exemplary aspect of the simulation methods for modifying a geometry of a model according to the present disclosure are illustrated in the context of propylene and carbon monoxide being oxidized in catalytic particles.

FIG. 20 includes exemplary equations and parameters describing modeled reactions, according to some aspects of the present disclosure. Equations of reactions are provided for the catalyzed oxidation of carbon monoxide to carbon dioxide 2000a and the catalyzed oxidation of propylene to water and carbon dioxide 2000b. The reaction rate for equation 2000a is provided at element 2000c and the reaction rate for equations 2000b is provided at element 2000d. Rate constants may be calculated using the Arrhenius equation 2000e. Values for the activation energy E and the frequency factor A are provided in table 2000f.

FIG. 21 includes exemplary equations describing physical properties of species in the reactor bulk, according to some aspects of the present disclosure. For example, the total concentration and flow velocity may be described by the continuity equation 2100a, where c is the total concentration which is the concentration of all species including the solvent 2100h, t is the time, u is the reactor flow velocity, and s a sink/source term reflecting that while atoms are not created or destroyed, the number of molecules may vary due to reactions. The pressure gradient in the reactor is related to the flow velocity through Darcy's law 2100b, where P denotes pressure, k is the permeability of the packed bed reactor, and η is the viscosity of the gas flowing through the reactor. The total molecular flux is the sum of the flux of each species $N_i$ 2100c. The species flux in the reactor may include a diffusion and a convection contribution as provided in 2100d, where $D_i$ is the diffusion tensor and $c_i$ is the concentration of species i. The convection and diffusion equation is provided in 2100e, where $R_i$ is a source term, reflecting the contribution by reactions and transport within the catalyst particles. Boundary conditions at the reactor inlet are provided in 2100f. At the outlet of the reactor convective mass transport is dominant and can give a second boundary condition 2100g, where n is the outward vector unit normal.

Referring back to the convection and diffusion equation 2100e, the source term, $R_i$, depends on the transport inside the catalyst particles. The molar flux at the outer surface of the particles multiplied by the available outer surface area of the particles per unit volume can provide a proper source term. It can be desirable to apply an extra dimension to model the catalyst particles to obtain the source term $R_i$.

FIG. 22 includes exemplary equations describing physical properties of species in the porous particles of a modeled reactor, according to some aspects of the present disclosure. It is contemplated for the exemplary model of the species in the bulk reactor that inside the particles there is no convection contribution, only diffusion. The contribution to the species concentration is provided in 2200a. $c_{pi}$ is the concentration of i in the catalyst particle. $D_{pi}$ is the diffusion tensor (in this example a scalar) for species i within the particle while $R_p$ is the reaction rate for the heterogeneous reaction in the particle. A boundary condition stating that net outward diffusion at the center of the particle is 0 is provided in 2200b, and a boundary condition stating that the species concentration within the particle is equal to the reactor bulk species concentration, adjusted by the porosity $\epsilon$ of the particle is provided in 2200c. An expression for the source term $R_i$ is provided in 2200d. The expression in 2200d for the exemplary model is valid at the particle surface, where the independent radius variable r equals the particle radius, $r_p$. $A_p$ denotes the pellet surface to volume ratio.

It is contemplated that for this exemplary model a product geometry between a base geometry for the reactor and an extra geometry for catalyst particles can provide a way to accurately model the interface between the concentrations on the outside of the pellets and those on the inside. In this exemplary model, the physics interface for transport of diluted species can be used to model the packed bed reactor. Such a physics interface may include processes for automatically constructing extra dimensions, for particle radius, and forming a product geometry automatically.

Figure 23A:
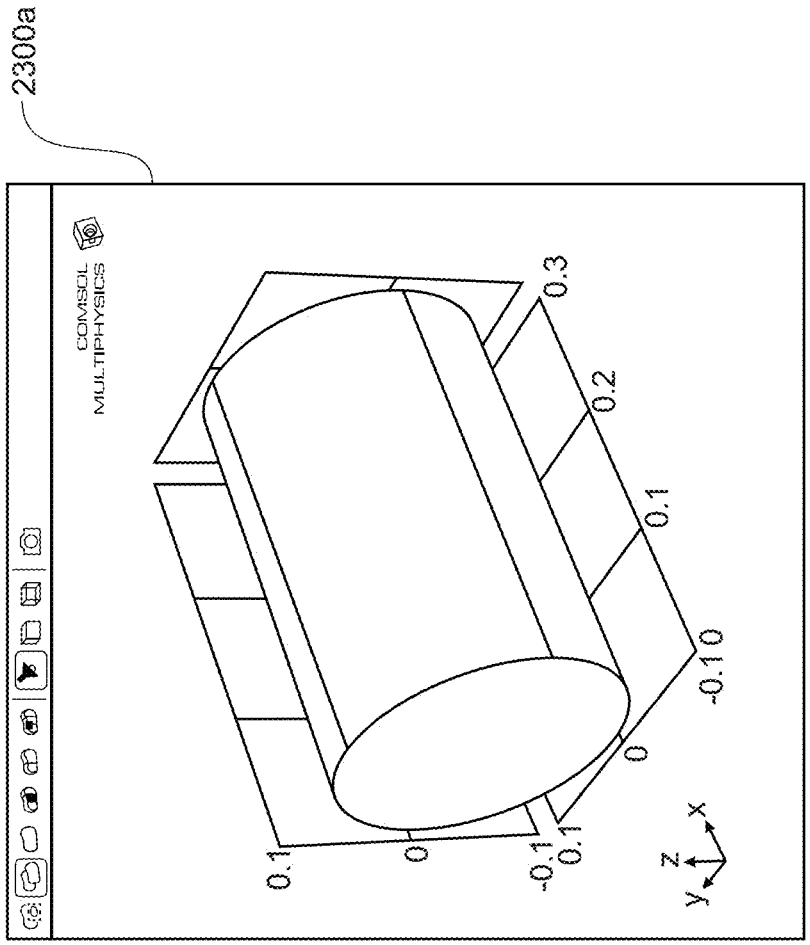
FIGS. 23A to 23C illustrate exemplary menus and settings windows for creating geometries describing a bulk reactor as a base geometry and particles as an extra geometry, according to some aspects of the present disclosure.
Figure 23B:
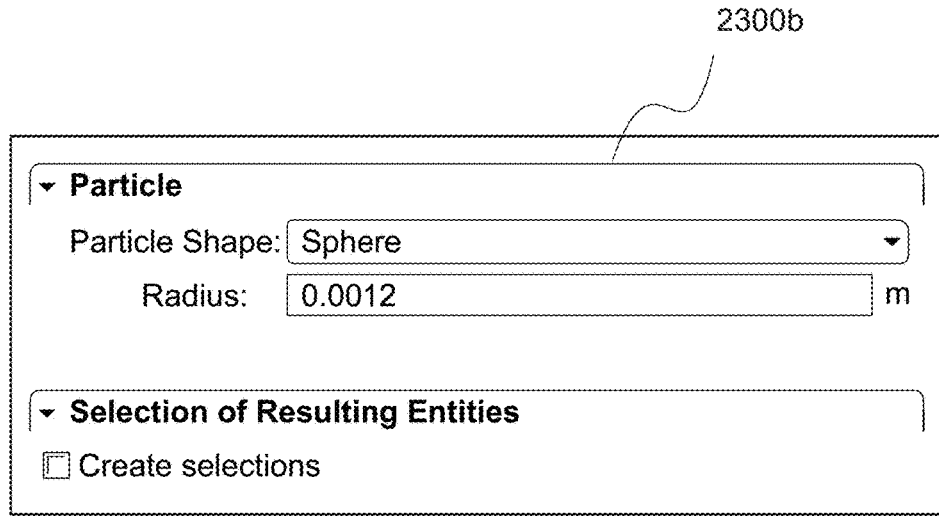
Figure 23C:
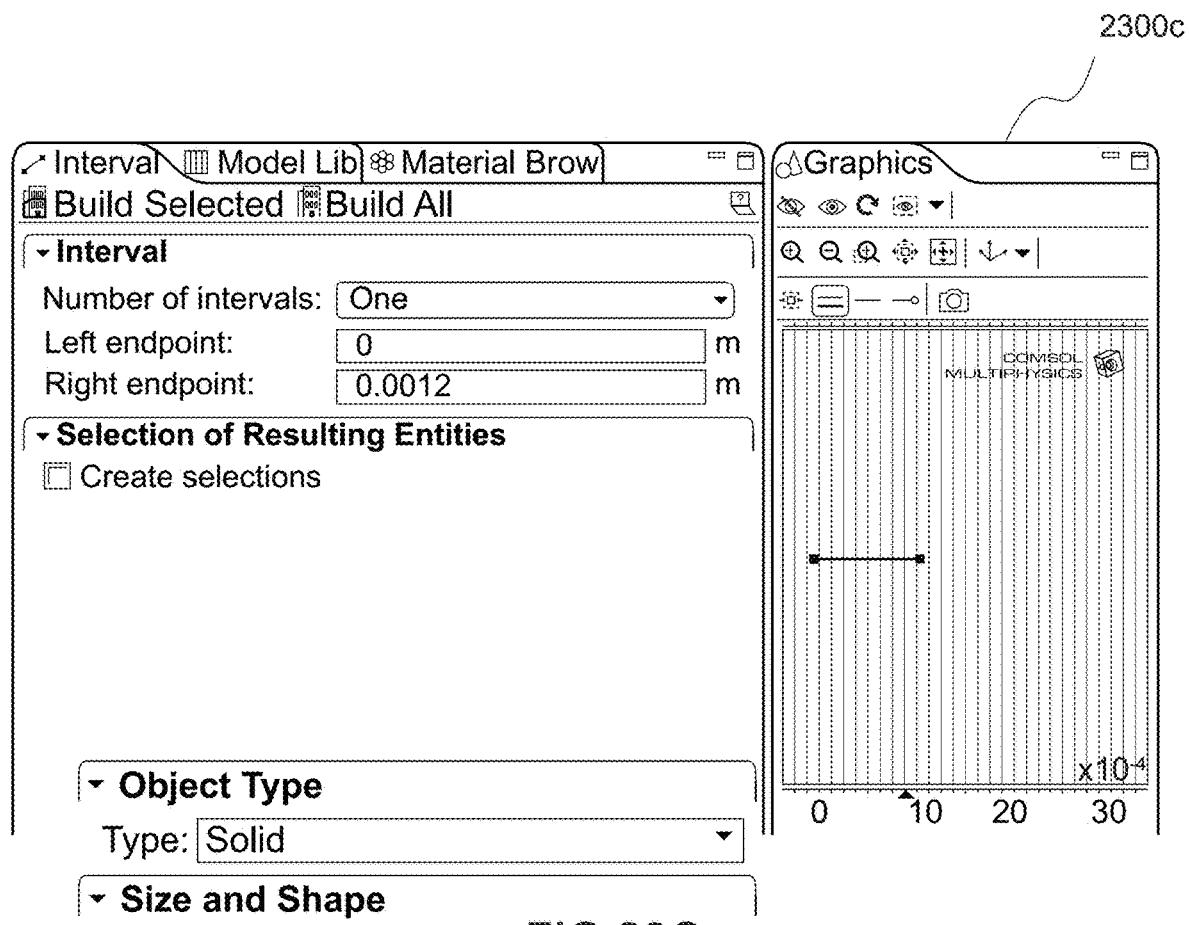
Figure 24B:
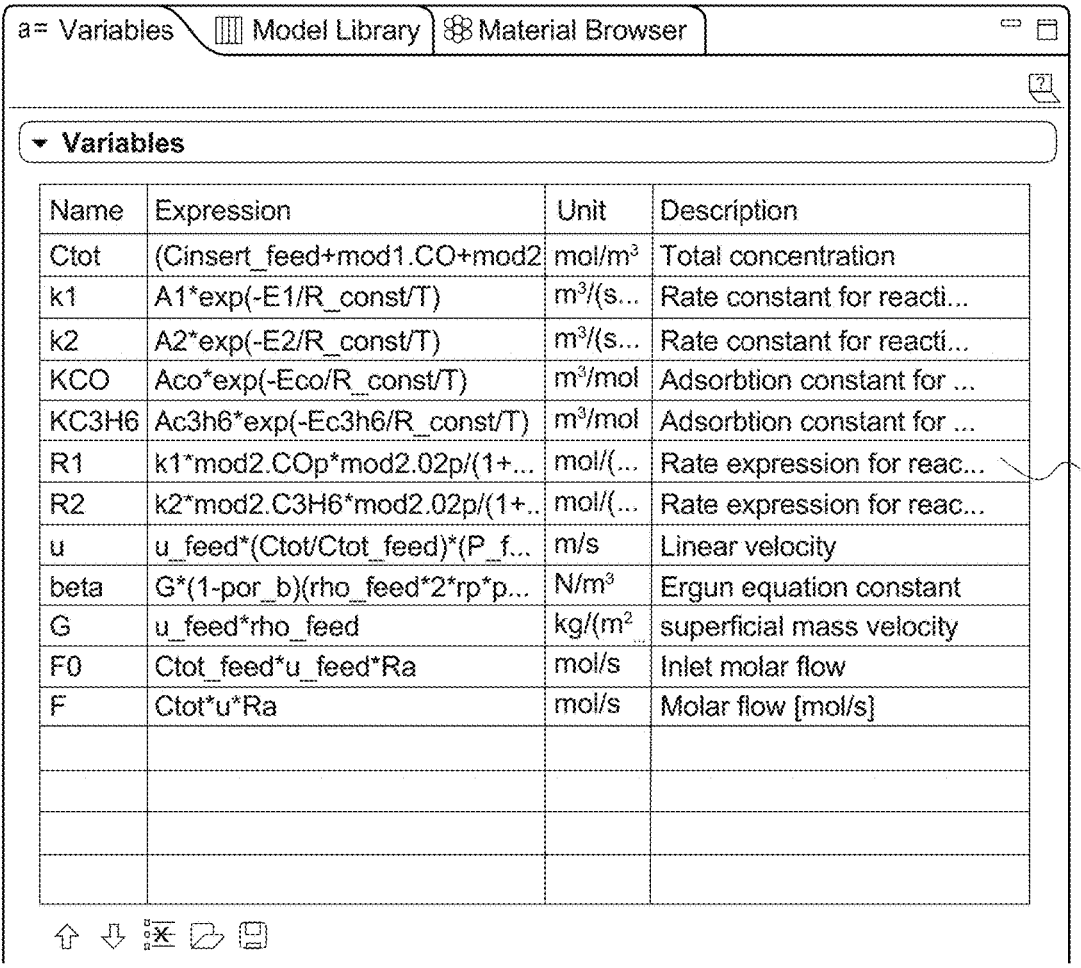
Figure 27:
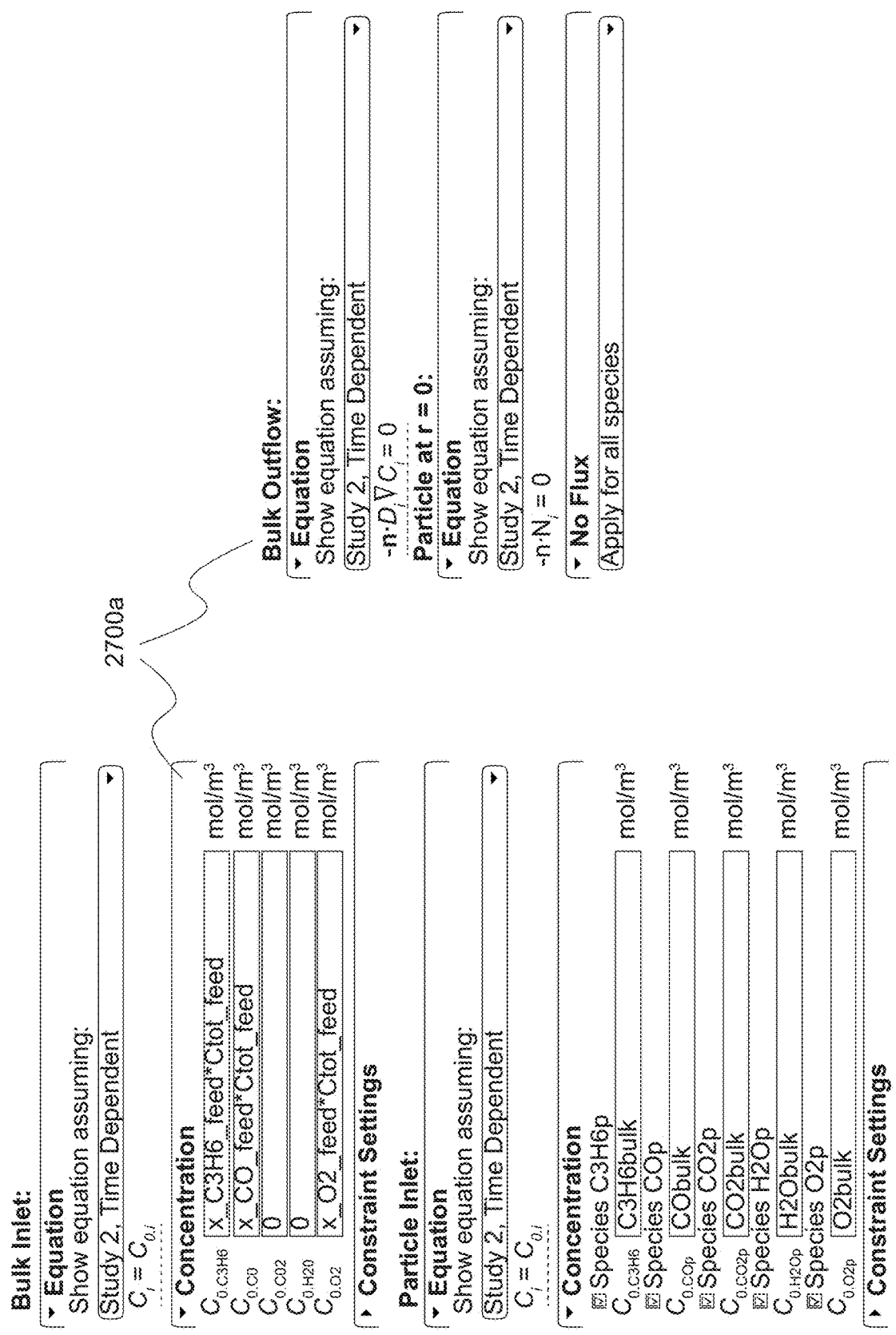

FIGS. 23A-23C illustrate exemplary menus and settings windows for creating geometries describing a bulk reactor as a base geometry and particles as an extra geometry, according to some aspects of the present disclosure. For example, a user of the modeling system draws a shape 2300a to represent the reactor, and which may also represent the base geometry. The user can then set the radius 2300b for the catalytic particle in a settings window of a physics interface. The system can then automatically construct a line segment dependent on the radius as an extra geometry. In some aspects, a graphical representation of the particle can alternatively be constructed in a geometry settings window 2300c. A product geometry can then be formed between the base geometry and the extra geometry.

FIGS. 24-30 illustrate exemplary settings windows and results for modeling a reactor including porous particles described as an extra geometry, according to some aspects of the present disclosure. In FIGS. 24A-24B, parameters can be set by a user by entering the data into edit fields 2400a, or by loading them into a memory from a file. The reaction rates are then defined along with certain other variables 2400b, which can also be defined on the product geometry.

It is contemplated that physics interfaces, such as the interface illustrated in FIG. 25, can include several child nodes 2500a, where each child node can include one or more settings windows. These settings windows can include sections for specifying input for the bulk of the reactor, and sections for specifying input for the catalytic particles. Two sets of diffusion tensors 2500b, 2500c, or scalar diffusion coefficients for isotropic materials, can be defined, one set for the reactor 2500b and one set for the catalytic particles 2500c. In the same settings window, convection can also be defined. A modeling software can then automatically assigns the diffusion coefficient and convection expressions for the reactor to the base geometry and the diffusion coefficient for the particles to the extra geometry.

In some aspects, another settings window, such as settings window 2600a in FIG. 26, can be accessed where initial concentrations can be defined on each geometry. It is also contemplated that boundary conditions 2700a and reactions 2800a in the particles as well as the flux 2800b from the particles into the reactor bulk can also be defined as exemplified by the setting windows of FIGS. 27 and 28.

The expressions and variables can be assigned on the product geometry as predefined by the physics interfaces. It is contemplated that the generated PDEs, which may be expressed in weak form (e.g., 2900a in FIG. 29), can further be user editable. The user can then mesh the base geometry representing the reactor. The extra dimension can be automatically meshed in accordance with predefined settings in the physics interfaces. In some aspects, the extra dimension mesh can be user defined. Two meshes can then be generated. One mesh is generated for the base geometry and one for the extra geometry. A compute icon 3000a can then be selected, as exemplified in FIG. 30, to solve the model. The modeling system can solve the equations for the dependent variables, representing physical quantities such as concentration and temperature in the reactor bulk and in the catalytic particles. The user may construct various plots 3000b as exemplified in FIG. 30, or tables to view representations of the solution.

Another exemplary aspect of the simulation methods for modifying the geometry of a model according to the present disclosure are illustrated in the context of absorption and scattering of radiation in a participating media are illustrated, according to some aspect of the present disclosure. Referring now to FIG. 31, for a given wavelength, the intensity of radiation in position s and in direction Ω can be determined by applying the equation provided at 3100a, where κ, β, and σs denote absorption, extinction, and scattering coefficients, respectively. I(Ω, s) denotes the radiation intensity at the position s position in the Ω direction. For radiation in heat transfer, the first term of the equation at 3100a relates to the blackbody radiation intensity which is represented by the expression provided at 3100b, where n refers to the refractive index. The second term of the equation at 3100a refers to extinction and the third term to scattering. It can be desirable to introduce extra dimensions to model the system represented by the equations because of the high dimensionality of a phase space. Given a three dimensional geometry, there are three dimensions for defining s. The direction Ω may be described by two angles adding two dimensions and an additional dimension can be added for wavelength, and the additional dimension may be used for radiation with multiple wavelengths.

A user modeling the above example can construct a base geometry that describes the three-dimensional space. An extra geometry may be predefined in the physics interface as a sphere, spanned by the two angles rotation, with an independent variable along the radius representing the wavelength of radiation. The extra geometry may or may not be displayed in the GUI depending on the settings of the modeling system. The physics interface can include settings windows for model inputs that may be typed in edit fields or selected from lists. Such input may be for instance, temperature field variable, absorption coefficients, scattering coefficients, and scattering type describing the phase function of the scattering. Some inputs may be given by defining a material on the base geometry or on parts of the base geometry. Examples of such inputs are absorption and scattering coefficients. Materials used in the model may be defined in certain aspects only on the base geometry, and the modeling system may automatically handle the formation of product geometries. Radiation can be described as editable PDEs. Other physical quantities may be described either in the physics interface for radiation or in other physics interfaces. Such physical quantities can also be expressed as editable PDEs and may form a system of coupled PDEs with the PDEs describing radiation. The PDEs of the radiation interface may be discretized and solved either independently or as the coupled system of partial differential equations using finite element solvers. A user may thus model radiation in participating media, either independently or coupled to other physical quantities, by describing the direction of radiation and possibly wavelength of the radiation using an extra geometry. The extra geometry can form a product geometry with the base geometry describing the space in which radiation is modeled.

Yet another exemplary aspect is a physics interface for simulating a gas. The physics interface can be referred to as a Boltzmann interface. Such models may define the time dependent Boltzmann equation for describing the spatial distribution and velocity distribution of the particles of a gas. The Boltzmann equation gives the probability of finding particles within a volume element dx centered at position x and within a certain velocity range dv centered on a velocity v within a given time range. Similar to the case of radiation, the phase space has a dimensionality of six for a gas modeled in a 3D geometry. A position in space may be described by a base geometry while the velocity may be described by extra dimensions. The base geometry may be three-dimensional, describe by three space coordinates, while the extra dimensions for the velocity may be described by the volume of a sphere, with one independent variable (the radius) describing the speed of the particles, and two other independent describing the angular dependency of the speed (the sphere spanned by rotating the two angles), together giving the velocity of a particle in a given direction.

When modeling a system where there is a sufficient range in the difference between the masses of the particles, it can be desirable to create several extra geometries. Each extra geometry can describe particles within a certain mass range, and thereby introduce an independent variable also for mass. It is also contemplated that a variation in mass can be introduced as yet another extra dimension.

A user can construct a base geometry describing a space including the particles. The Boltzmann interface may construct one or more extra geometries automatically, the dimensionality of the extra geometries dependent on the base geometry. The extra geometries can form a product geometry with the base geometry automatically as predefined by the Boltzmann interface. The user may give inputs to the Boltzmann interface, the inputs being specified for example by typing in edit fields or making selections in lists. The user may give inputs for instance relating to particle types, temperature, pressure and number of particles. Physical quantities in the Boltzmann interface may be predefined by user editable expressions in the form of PDEs.

It is contemplated that other physical quantities can be described either in the Boltzmann interface or in other physics interfaces. Such physical quantities can be expressed as editable PDEs or ODEs and may form a system of coupled PDEs together with the PDEs describing the spatial and velocity distribution of the gas. The PDEs of the Boltzmann interface may be discretized and solved either independently or as the coupled system of partial differential equations using a numerical solver. A user may thus model a time dependent spatial and velocity distribution of a gas either independently or coupled to other physical quantities by describing the velocity distribution using extra geometries with the extra geometry forming a product geometry with the base geometry describing the spatial distribution.

A further exemplary aspect of the present disclosure is an automatic operation for attaching PMLs to a geometry using extra geometries. A PML may exist on the boundaries of a wave equation to model that the wave is absorbed with no reflection on the boundary. For simplicity, a user of the modeling system can construct a rectangle in a physics interface modeling some type of wave propagation phenomenon. Two parallel boundaries of the rectangle can be referred to as being directed in the x-direction and the other two boundaries of the rectangle as being directed in the y-direction. The user may select the boundaries of the rectangle and define the boundaries of the rectangle as perfectly matched layers. The modeling system can then automatically construct two extra geometries in the form of line segments, for example denoted XDx and XDy. The modeling system can further create several product geometries. XDx may form two 2-D product geometries with the boundaries directed in the x-direction. XDy may form two 2-D product geometries with the boundaries directed in the y direction. XDx and XDy may form a product of extra dimensions. The product of extra dimensions can form four 2-D product geometries with the vertexes of the rectangle. An example of a coordinate stretching transformation is $$\xi^1 = \text{sign}(\xi - \xi_0)|\xi - \xi_0|^n \frac{L}{\delta \xi^n}(1 - i) \qquad \text{Equation 30}$$

where the PML scaling factor and n can be determined by the modeling system and may further be user editable along with $\xi$ and $\xi_0$. A coordinate stretching transformation can further be applied to the product geometries.

According to some aspects, a simulation method is executed in a computing system with one or more processors configured to modify a geometry of a model of a physical system including physical quantities represented in terms of a combined set of equations. The simulation method comprising the acts of defining geometry data representing a geometry of a physical system represented by a first combined set of equations. The geometry data is associated with a first model of the physical system. Extra geometry data representing one or more extra geometries for a modified model based on the first model is defined, via one or more processors. A first set of geometric entity data representing one or more geometric entities of the geometry of the physical system from which to extend the one or more extra geometries is determined via at least one of the one or more processors. At least a portion of the extra geometry data representing at least one of the one or more extra geometries is added, via at least one of said one or more processors, to the determined first set of geometric entity data representing one or more geometric entities by forming product geometry data representing a product geometry for the modified model. The extra geometry data representing the one or more extra geometries is at least a part of the product geometry data. Non-discretized equation data representing a non-discretized second combined set of equations for at least a portion of the product geometry data is generated via at least one of the one or more processors. Optionally a graphical representation of at least a portion of the product geometry data is generated. The graphical representation is configured for display on a graphical user interface.

It is contemplated that the simulation method described above can further include in some aspects one or more of the following features. At least a portion of the product geometry data can be stored as graphical representations configured for later display on one or more display devices. The method can also include generating a graphical representation of at least a portion of the product geometry data, with the graphical representation configured for display on one or more display devices. The graphical representation can include at least a portion of the product geometry data. The one or more extra geometries can be a part of an extra dimension. The simulation method can further include the act of determining, via at least one of said one or more processors, a second set of geometric entity data representing one or more geometric entities of the one or more extra geometries, and determining product selection data representing a product of selections computed as a Cartesian product between at least a portion of the first set of geometric entity data representing one or more geometric entities of the geometry and at least a portion of the second set of geometric entity data representing one or more geometric entities of the one or more extra geometries. The non-discretized equation data representing the non-discretized second combined set of equations can be user editable to allow editing of the second combined set of equations. The updated combined set of equations can be a combined set of non-discretized differential equations. The non-discretized second combined set of equations can be a combined set of non-discretized partial differential equations configured as input data for a partial differential equation solver.

It is further contemplated that the simulation method described above can also include in some aspects one or more of the following features. At least one of the one or more geometric entities can be a vertex, an edge, a boundary, or a domain. The simulation method can further include the act of defining material property data representing a material property for at least one of the one or more extra geometries. The simulation method can also include the act of defining material property data representing a material property for at least a portion of the product geometry data after forming the product geometry data representing the product geometry for said modified model. The geometry of the physical system can be one-dimensional and the one or more extra geometries are two-dimensional. The geometry of the physical system can also be three-dimensional and the one or more extra geometries can be one-dimensional. The geometry of the physical system and the one or more extra geometries can both be three-dimensional. The determining of the first set of geometric entity data representing one or more geometric entities on the geometry of a physical system can be based on user selections received via a graphical user interface. Similarly, the determining of the second set of geometric entity data representing one or more geometric entities of the one or more extra geometries can be based on user selections received via a graphical user interface. Defining of the geometry data representing the geometry of the physical system can include extracting the geometry data from data representing the first model of the physical system. Defining of the extra geometry data representing one or more extra geometries can occur at least in part via selections of extra geometry properties received via a graphical user interface.

According to some aspects, a simulation system or apparatus is contemplated for adding extra geometries to a base geometry of a model of a physical system represented in terms of a combined set of differential equations. The system includes one or more physical memory devices, one or more display devices, one or more user input devices, and one or more processors are configured to or adapted to execute instructions stored on at least one of the one or more physical memory devices. The instructions cause at least one of the one or more processors to perform steps including defining base geometry data representing a base geometry of a physical system. The base geometry data is associated with a first model of the physical system, which is represented by a combined set of differential equations. Extra geometry data is defined representing one or more extra geometries for a modified model based on said first model. A first set of geometric entity data is determined representing one or more entities of the base geometry from which to extend the one or more extra geometries. At least a portion of the extra geometry data representing at least one of the one or more extra geometries is added to the determined first set of geometric entity data representing one or more entities of the base geometry by generating product data representing a product geometry for the modified model. The extra geometry data is at least a part of the product data. Equation data is generated representing an updated combined set of differential equations for the modified model that includes at least a portion the product data. The equation data and the product data can be stored in at least one of the one or more physical memory devices.

It is contemplated that the simulation system or apparatus described above can further include in some aspects one or more of the following features. At least a portion of the product data can be stored as graphical representations configured for later display on the one or more display devices. The instructions can also cause at least one of the one or more processors to further perform a step comprising generating a graphical representation of at least a portion of the product data, where the graphical representation is configured for display on at least one of the one or more display devices. At least a portion of the product data can be stored as graphical representations configured for later display on the one or more display devices. The instructions can further cause at least one of the one or more processors to perform a step comprising generating a graphical representation of at least a portion of the product data where the graphical representation configured for display on at least one of the one or more display devices. The graphical representation can include the at least a portion of the product geometry data. The determining of the first set of geometric entity data representing one or more geometric entities on the geometry of a physical system can be based on user selections received via a graphical user interface. The defining of the geometry data representing the geometry of the physical system can include extracting the geometry data from data representing the first model of the physical system. The defining of the extra geometry data representing of one or more extra geometries can occurs at least in part via selections of extra geometry properties received via a graphical user interface.

It is further contemplated that the simulation system or apparatus described above can also include in some aspects one or more of the following features. The one or more extra geometries can be a part of an extra dimension. The system or apparatus can further include the act of determining, via at least one of the one or more processors, a second set of geometric entity data representing one or more geometric entities of the one or more extra geometries, and determining product selection data representing a product of selections that can be computed as a Cartesian product between at least a portion of the first set of geometric entity data representing one or more geometric entities of the geometry and at least a portion of the second set of geometric entity data representing one or more geometric entities of the one or more extra geometries. The non-discretized equation data representing the non-discretized second combined set of equations can be user editable to allow editing of the second combined set of equations. The updated combined set of equations can be a combined set of non-discretized differential equations. The non-discretized second combined set of equations is a combined set of non-discretized partial differential equations configured as input data for a partial differential equation solver. At least one of the one or more geometric entities can be a vertex, edge, boundary, or a domain. The system or apparatus can further include the act of defining material property data representing a material property for at least one of the one or more extra geometries. The system or apparatus can further include defining the material property data representing a material property for at least a portion of the product geometry data after forming the product data representing the product geometry for the modified model. The geometry of the physical system can be one-dimensional and the one or more extra geometries can be two-dimensional. The geometry of the physical system can also be three-dimensional with the one or more extra geometries being one-dimensional. The geometry of the physical system and the one or more extra geometries can further both be three-dimensional.

According to some aspects, a simulation computing apparatus or system for adding extra geometries to a model of a physical system is contemplated. The apparatus or system includes a physical computing system comprising one or more processors, one or more user input devices, a display device, and one or more memory devices. At least one of the one or more memory devices includes executable instructions for modifying a geometry of a model of a physical system represented in terms of a combined set of equations. The executable instructions cause at least one of the one or more processors to perform, upon execution, acts comprising receiving a base geometry of said physical system in response to one or more first inputs received via the one or more user input devices. The base geometry is associated with a model of the physical system which is represented in terms of a combined set of equations. One or more second inputs are received via at least one of the one or more user input devices. The second inputs define one or more extra geometries associated with the base geometry. One or more first geometric entities of the base geometry and one or more second geometric entities of the extra geometry are determined. At least one of the one or more extra geometries are added to the base geometry by computing a product geometry of the determined one or more first geometric entities and the one or more second geometric entities. The one or more extra geometries are at least a part of the product geometry. An updated combined set of equations is generated including representations of at least a portion of the product geometry. A graphical representation is generated of at least a portion of the product geometry. The graphical representation is configured for display on the display device.

It is contemplated that the simulation computing apparatus or system described above can further include in some aspects one or more of the following features. The updated combined set of equations can be a combined set of non-discretized differential equations. At least a portion of the product geometry can be stored as graphical representations configured for later display on the one or more display devices. The graphical representation can include at least a portion of the product geometry. The one or more extra geometries can be a part of an extra dimension. The computing of the product geometry can be implemented as a Cartesian product between at least a portion of the one or more first geometric entities of the base geometry and one or more second geometric entities of the one or more extra geometries. The updated combined set of equations can be user editable to allow editing of the second combined set of equations. The updated combined set of equations can be a combined set of non-discretized partial differential equations configured as input data for a partial differential equation solver. At least one of the one or more first geometric entities can be a vertex, an edge, a domain, or a boundary. The system or apparatus can also define a material property for at least one of the one or more extra geometries. In addition, the system or method can define a material property for at least a portion of the product geometry after computing the product geometry. The geometry of the physical system can be one-dimensional and one or more extra geometries can be two-dimensional. The geometry of the physical system can also be three-dimensional with the one or more extra geometries being one-dimensional. The geometry of the physical system and the one or more extra geometries can both be three-dimensional. The determining of the one or more first geometric entities on the base geometry of a physical system can be based on user selections received via a graphical user interface. The defining of the base geometry of the physical system can include at least partially extracting the base geometry from data representing the model of the physical system. The defining of one or more extra geometries can occur at least in part via selections of extra geometry properties received via a graphical user interface.

Exemplary aspects of physics simulation computing systems are now described where modeling or simulation operations can be improved to include modifying a geometry, such as by adding and defining extra geometries (e.g., for one or more PMLs), for a model of a physical system. The contemplated computing systems may be operable for executing one or more computer-implemented methods, including engineering analysis systems and methods, stored on computer readable media (e.g., temporary or fixed memory, magnetic storage, optical storage, electronic storage, flash memory, other storage media).

It is contemplated that modeling or simulation computing systems can include networked computers, processors, or processing units. In certain embodiments, modeling or simulation system processing units may be operating directly on a physics simulation system user's computer (e.g., a host or client), and in some implementations, a physics simulation system processing unit may be operating remotely (e.g., a remote server system). For example, a user may provide various input parameters at one modeling or simulation computer or terminal located at a certain location. Those parameters may be processed locally on the computer or the parameters may be transferred over a local area network or a wide area network, to another simulation processing unit, located elsewhere on the network that is configured to process the input parameters. The second processing unit may be associated with a server connected to the Internet (or other network) or the second processing unit can be several processing units connected to the Internet (or other network), each handling select function(s) for developing and solving a problem on the simulation system. It is further contemplated that the results of the processing by the one or more processing units can then be assembled at yet another server or processing unit. It is also contemplated that the results may be assembled back at the terminal or computer where the user is situated. The simulation terminal or computer where the user is situated can then display the solution of the modeling or simulation system to the user via a display (e.g., a transient display) or in hard copy form (e.g., via a printer). Alternatively, or in addition, the solution may be stored in a memory associated with the terminal or computer, or the solution may be stored on another server that the user may access to obtain the solution from the modeling and/or simulation system. Additional non-limiting aspects of physics simulation systems contemplated for modeling physical systems are described below in the context of exemplary FIGS. 32A-32C and FIG. 33.

Figure 32A:
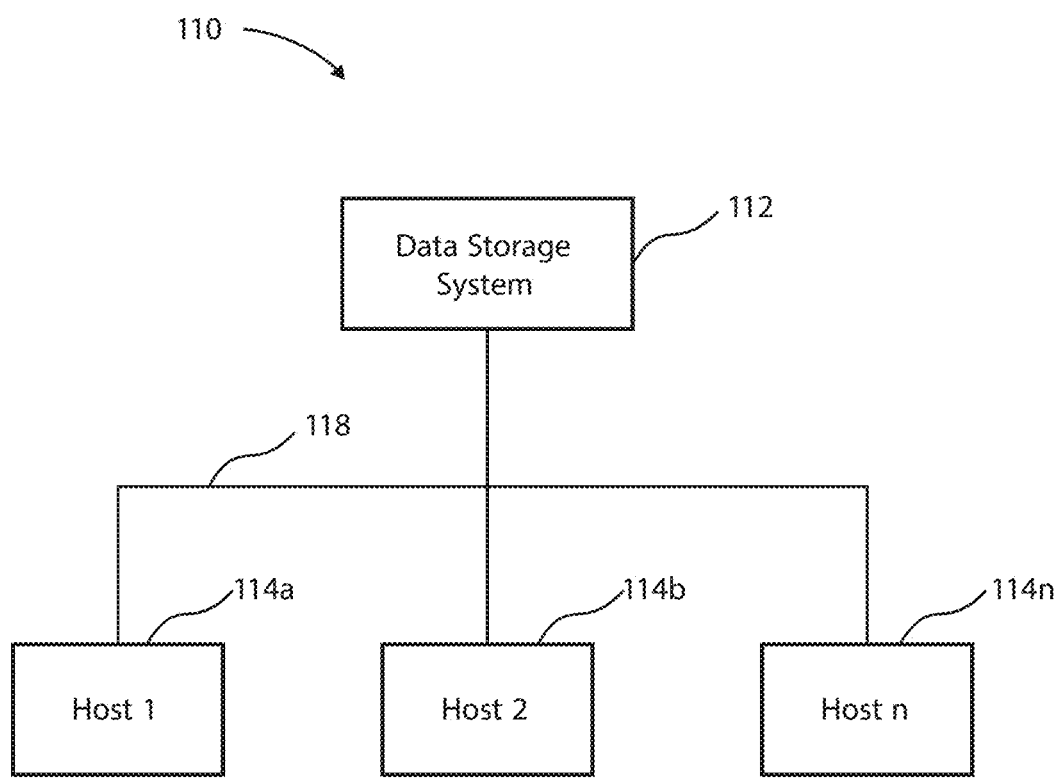
FIGS. 32A to 32C illustrate exemplary aspects of physics simulation computing systems for adding and defining one or more perfectly matched layers (PMLs), or other extra geometries, to a model of a physical system, according to some aspects of the present disclosure.
Figure 32B:
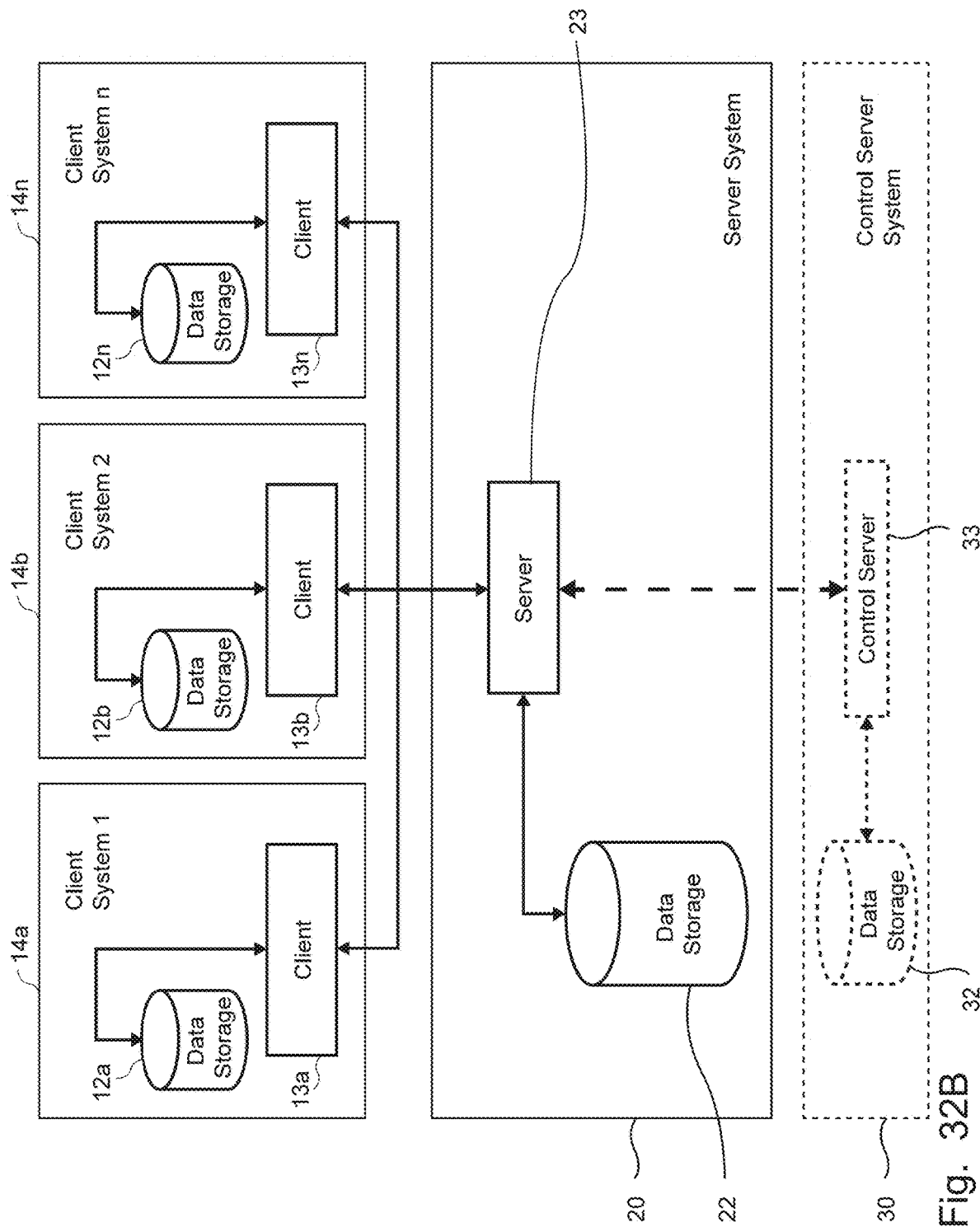
Figure 32C:
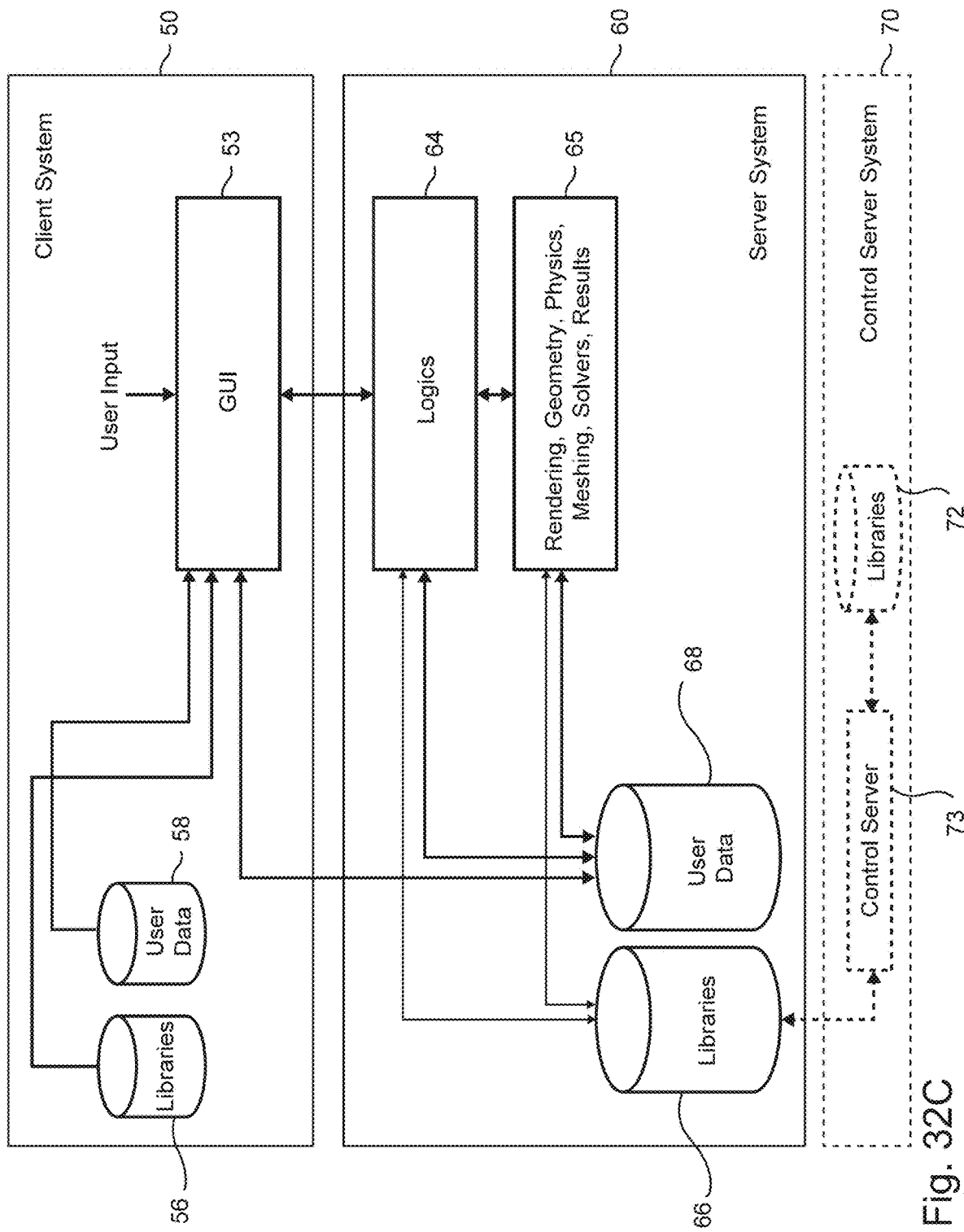

Referring now to FIGS. 32A-32C, exemplary aspects of physics simulation computing systems are illustrated that may be used with the exemplary methods described herein.

FIG. 32A illustrates configurations for a simulation computing system 110 that includes a data storage system 112 connected to host systems 114a-114n through communication medium 118. In some aspects, data storage systems may also be hosted locally on any one of the host systems 114a-114n. In system 110, the "n" hosts 114a-114n may access the data storage system 112, for example, in performing input/output (I/O) operations. The communication medium 118 for communicatively connecting the various system components may be any one of a variety of networks or other type of communication connections as known in the field of computer simulation and modeling of physical systems. For example, the communication medium 118 may be the Internet, an intranet, or other network connection by which the host systems 114a-114n may access and communicate with the data storage system 112, and may also communicate with others included in the system 110, including without limitation systems based on various forms of network communications (e.g., fiber optic, wireless, Ethernet).

Each of the host systems 114a-114n and the data storage system 112 included in the simulation computing system 110 may be connected to the communication medium 118 by any one of a variety of connections as may be provided and supported in accordance with the type of communication medium 118. Processing units may be included in the host computer systems 114a-114n or a data manager system may be any one of a variety of commercially available single or multi-processor system, such as an Intel-based processor, server, or other type of commercially available processor able to support incoming traffic in accordance with each particular embodiment and application.

It should be noted that the particulars of the hardware and systems included in each of the host systems 114a-114n, as well as those components that may be included in the data storage system 112 are described herein in more detail, and may vary with each particular embodiment. For example, each of the host computers 114a-114n, as well as the data storage system 112, may all be located at the same physical site, or, alternatively, may also be located in different physical locations. Examples of the communication medium that may be used to provide the different types of connections between the host computer systems, the data manager system, and the data storage system of the modeling and/or simulation computing system 110 may use a variety of different communication protocols such as SCSI, ESCON, Fiber Channel, SAS, SSD, or functional equivalents that are known to those skilled in the field of computer simulation and modeling of physical systems. Some or all of the connections by which the hosts and data storage system 112 may be connected to the communication medium 118 may pass through other communication devices, such as a Connectrix (e.g., enterprise to edge-related storage area network switches and associated algorithms) or other switching equipment that may exist, both physical and virtual, such as a phone line, a repeater, a multiplexer, a satellite, or systems that perform similar or equivalent communications operations.

Each of the host computer systems may perform different types of data operations, such as storing and retrieving data files used in connection with an application executing on one or more of the host systems. For example, a computer-implemented method may be executing on the host computer 114a and store and retrieve data from the data storage system 112. The data storage system 112 may include any number of a variety of different data storage devices, such as disks, tapes, solid-state memory, and the like in accordance with each implementation. As will be described in following paragraphs, methods may reside and be executing on any one of the host computer systems 114a-114n. Data may be stored locally on the host system executing the methods, as well as remotely in the data storage system 112 or on another host computer system. Similarly, depending on the configuration of each modeling and/or simulation computing system 110, methods as described herein may be stored and executed on one of the host computer systems and accessed remotely by a user on another computer system using local data. A variety of different system configurations and variations are possible then as will be described in connection with the embodiment of the system 110 of FIG. 32A and should not be construed as a limitation of the techniques described elsewhere herein.

Turning now to FIG. 32B, additional illustrative non-limiting exemplary aspects of physics simulation computing systems are described for modeling physical systems. Systems can include one or more client processing systems 14a, 14b . . . 14n. In some aspects, the client processing systems 14a-n include components corresponding to a simulation system for modeling physical systems, such as components (when executed on a processor present in client computer(s) 13a, 13b . . . 13n) to display a graphical user interface, receive user input, and display outputs of the simulation system that are results of the user input. The client processing system(s) 14a-n can further include software components that generate input commands, send user input data, and send generated input commands to a simulation server system 20 communicatively connected to the client processing system(s). The server system 20 includes a server processing unit 23. The client processing system(s) 14a-n can also receive output data and output commands from the server system where the output data and output commands correspond to the user input previously sent to the server system 20. The client processing system(s) 14a-n and the server system 20 can each include their own data storage components 12a, 12b . . . 12n, 22. It is further contemplated that client processing system(s) can further include components, that upon execution, implement output commands and display output data in a graphical user interface.

It is contemplated that a server system 20 can include components, that upon execution, receive input data and input commands from communicatively connected client processing system(s) 14a, 14b . . . 14n. In some aspects, the server system 20 can further include executable components for sending input data to and receiving data from a control server system 30 that includes a control server processor 33 and may also have data storage components 32. The control server computer can be used to control access to certain operations of a simulation system for modeling physical systems. The server system 20 can also include executable components for generating output data and output commands based on the received input data, input commands, and/or control data; and send these output data and output commands to any one of the client processing system(s) 14a-n. In some aspects, the server system 20 may further include executable components to verify if an input command may be executed, as determined by the received control data.

Simulation processing units, display devices, and/or memory devices are contemplated to be a part of the client processing systems 14a-n, server system(s) 20, and/or control server system(s) 30.

Turning now to FIG. 32C, further non-limiting exemplary aspects of physics simulation computing systems are described. The system can include a client processing system 50 that includes executable components for a graphical user interface 53, where user input may be received and output may be displayed. The client processing system can store user data generated through user input and output received from a server system 60. The client processing system may also locally store executable software component libraries which are used to display graphical user interface(s), receive input, generate input commands, execute output commands, and display output. User data can be stored on client user data storage component 158 or on a server system user data storage component 68. Similarly, library data can be stored locally on a client library storage component 56.

In one illustrative aspect, user input may be received via the GUI 53 of the client processing system 50 based on a user selecting an option via the GUI 53 to create an exemplary geometry, such as a cylinder geometry. The input and input commands may be sent to the communicatively connected server system 60. Output data and output commands received from the server system can then be executed on the client processing system 50 to render and display the exemplary cylinder geometry and to refresh the graphical user interface 53, based on the exemplary user input for a cylinder. Thus, the server system 60 can receive user input data and input commands from a client processing system 50 and use the received data and commands to generate output data and output commands that can be received by the client processing system 50. These output data and output commands determine what will be shown in the graphical user interface 53 in the client processing system 50 and are based on the user input.

The server system can include executable components that determine logics associated with a simulation system for modeling physical systems. For example, upon execution of logics component 64, which is similar to an application program interface component, the logics component 64 can receive input data and input commands from the client processing system 50 and determine how to process received input. The logics component 64 can determine which simulation software components for modeling physical systems should be used to process input data and execute input commands, and which components should be used to generate output data and output commands, based on the user input. The input data and input commands may be relayed by the logics component(s) 64, upon execution, to one or more of rendering, geometry, physics, meshing, assembling, solver, and results components, collectively referred to in FIG. 32C as component 65. The output data and the output commands from component 65 can then be relayed to the client processing system 50 by the logics components 64.

The server system 60 may store and access logics component libraries 66. The server system 60 may also store user data 68 used by the logics components 64. As discuss above, the server system 60 may also include aspects for rendering the graphical user interface in component 65, that builds the geometry, defines the physics, generates the mesh, assembles the numerical model, solves the numerical model, and generates the output data and output commands. Continuing on the illustrative example of the cylinder, a logics component 64 can receive user input in the form of input data and input commands for generating a cylinder and send these data and commands to a geometry component that is part of component 65. The geometry component executes the cylinder command and sends an output to the rendering component that is also a part of component 65. The logics component 64 may then receive the output from the rendering component and send rendering data, for the cylinder geometry together with its settings, to the client processing system 50 for display in the graphical user interface 53.

The server system 60 may also store and access library components 66 for rendering, building the geometry, generating the mesh, assembling the numerical model, solving the numerical model equations, and generating the results.

In some aspects, the graphical user interface 53 and the logics components 64 may send data and commands that may trigger a control check in the rendering, geometry, physics, meshing, assembling, solvers, and results components of component 65, which then may generate a request that is sent to a control server 70. The server system 60 may then receive data from control server system 70 that is used to determine if it should allow the execution of commands. The data sent to the server system 60 from the control server system 70 is generated by the control server 73 using a file that may be stored, for example in the libraries component 72, of the control server system 70.

Simulation processing units, display devices, and/or memory devices are contemplated to be a part of the client processing system 50, server system 60, and/or control server system 70.

Figure 33:
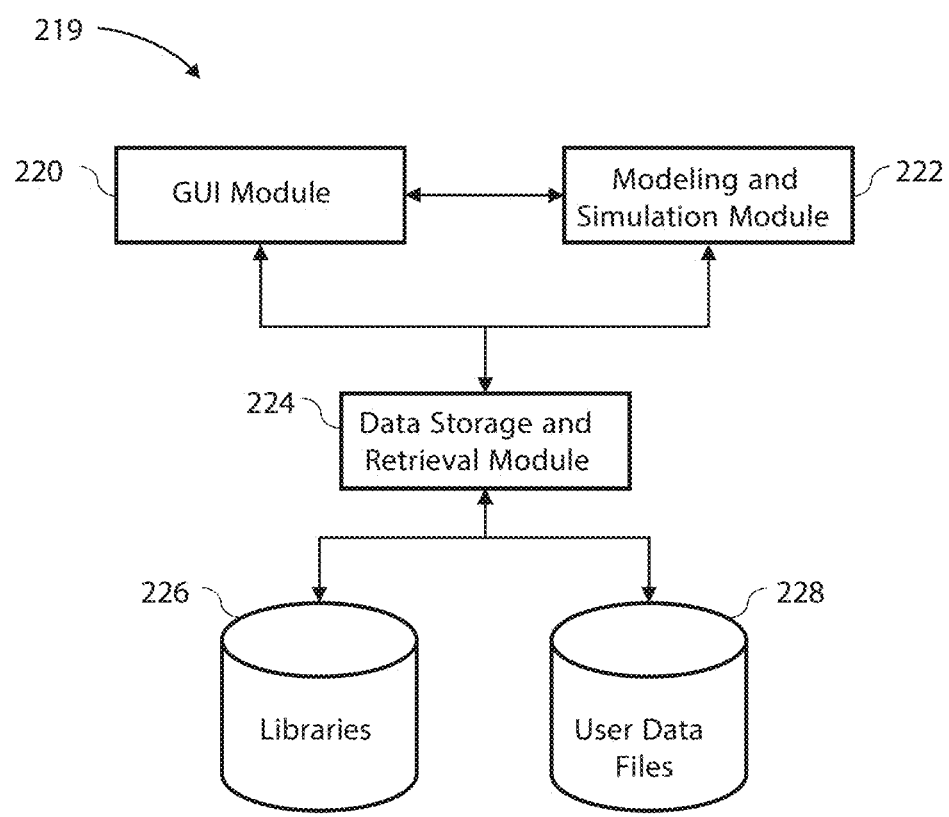
FIG. 33 illustrates an exemplary standalone physics simulation computing system, or one that may reside and be executed in one of the hosts of FIG. 32A, according to some aspects of the present disclosure.

Referring now to FIG. 33, an exemplary aspect of a simulation computing system 219 for modeling physical systems is illustrated that may reside, for example, on a single computer or in one of a plurality of host computer systems (such as host computers 114a-114n illustrated in FIG. 32A). The simulation computing system may be divided into several components. One exemplary aspect of the system may include a GUI module 220, a Modeling and Simulation module 222, and a Data Storage and Retrieval module 224. The GUI module 220 can provide for interactions with system users. The Modeling and Simulation module 222 can provide for managing and performing physics (including multiphysics) simulations. The Data Storage and Retrieval module 224 can provide for loading and saving the model in a file, and to load and store other types of files which may be used during the simulation or may be used as input or output to the simulation.

The GUI module 220 may communicate with the Modeling and Simulation module 222 by sending and receiving commands. As may also occur on the other modeling and/or simulation computing systems described herein, the act of sending and receiving commands may be performed through an application programming interface ("API") or other similar components. In one aspect of the system, the API may be object oriented, and mix data and function calls within the same structure. In another aspect of the system, the API may use a data structure that is separate from function calls.

It is contemplated that the GUI module 220 can include a plurality of modeling or simulation systems or subsystems. For example, the determination of finite elements using common geometry shape function spaces may operate in the GUI module and/or in other modules (interfacing or otherwise) such as the Modeling and Simulation Module 222 and/or the Data Storage and Retrieval Module 224.

It is contemplated that in certain aspects of the present disclosure components of a simulation system may reside on different host computing systems. For example, the GUI module 220 may reside on a personal computer host and the Modeling and Simulation module 222 may reside on a server computer host. It is further contemplated that the Data Storage and Retrieval module 224 may reside on either the personal computer host or the server computer host, or yet another separate computer host. If the computer hosts are not identical, the API can be configured to use a computer network to communicate between hosts. In one embodiment, an object-oriented API may be configured to send data and method calls over the computer network or in another embodiment send data and function calls between the components over a computer network. The API may also be able to handle a Data Storage and Retrieval module 224 which may be located either on the host of the GUI module 220 or the Modeling and Simulation module 222, or on a separate host. In each of those cases, the Data Storage and Retrieval module 224 may be configured to load and store files on each of those hosts.

It is contemplated that in certain aspects, the system 219 may include, or be configured with, operating systems such as Windows 10, Mac OS®, iOS, Android®, Chrome® OS, and the like, or system components other than what is described and represented in the modeling and/or simulation computing system 219 illustrated in FIG. 33. In the exemplary aspect illustrated in FIG. 33, Libraries 226 and the User Data Files 228 can be stored locally within the host computing system. It is further contemplated that in certain aspects, the Libraries 226 and/or User Data Files 228, as well as copies of these, may be stored in another host computer system and/or in the Data Storage System 112 of the computing system 110 in FIG. 32A. However, for simplicity and explanation in paragraphs that follow, it may be assumed in a non-limiting manner that the system 219 may reside on a single host computing system (see FIG. 32A) such as 114a with additional backups, for example, of the User Data Files and Libraries, in the Data Storage System 112.

In certain aspects of the present disclosure, portions of the simulation computing system 219, such as the GUI module 220, the Modeling and Simulation module 222, the Data Storage and Retrieval module 224, and/or the Libraries 226 may be included or executed in combination with other available system package(s). These components may operate on one of the host systems 114a-114n, and may include one or more operating systems, such as, Windows 10, Windows HPC Server, Unix®, Linux®, Mac OS®, iOS, Chrome® OS, Android®, and the like. It is further contemplated that the modules of the modeling system 219 may be written in any one of a variety of computer programming languages, such as, C, C++, C#, Java®, or any combination(s) thereof, or other programming languages.

It is contemplated that the GUI module 220 may display GUI windows in connection with obtaining data for use in performing modeling, simulation, and/or other problem solving for one or more processes and/or physics phenomena under consideration by a system user. The one or more processes and/or phenomena may be assembled and solved by the Modeling and Simulation module 222. That is, user data may be gathered or received by the system using modules, such as the GUI module 220, and subsequently used by the Modeling and Simulation module 222. Thereafter, the data may be transferred or forwarded to the Data Storage and Retrieval module 224 where the user-entered data may be stored in a separate data structure (e.g., User Data Files 228). It is contemplated that other data and information may also be stored and retrieved from a separate data structure, such as Libraries 226, which may be used by the Modeling and Simulation module 222 or in connection with the GUI module 220.

The various data files that may be associated with a simulation system, such as User Data Files 228 and the Libraries 226, may be stored in any one of a variety of data file formats in connection with a file system used in the host computing system or in the Data Storage System 112. In certain aspects, the system 219 may use any one of a variety of database packages in connection with the storage and retrieval of data. The User Data files 228 may also be used in connection with other simulation and modeling systems. For example, the User Data files 228 may be stored in a format that may also be used directly or indirectly as an input to any one of a variety of other modeling or simulation systems. In certain aspects, data may be imported and/or exported between different modeling systems. The format of the data may be varied or customized in accordance with each of the system(s) as well as in accordance with additional operations that each of the system(s) may include.

In some implementations, it is contemplated that the systems and methods described herein can be used in models combining a plurality of physics interfaces to create a multiphysics model for modeling different physical phenomena or processes. Properties of the physics interfaces can be represented by partial differential equations (PDEs) that may be automatically combined to form PDEs describing physical quantities in a coupled system or representation. It is contemplated that the PDEs may be provided to the solver either independently as one PDE or a system of PDEs, describing a single phenomenon or process, or as one or several systems of PDEs describing several phenomena or processes.

In some implementations, it is contemplated that physical properties can be used to model physical quantities for component(s) and/or process(es) being examined using the simulation system, and the physical properties can be defined using a GUI that allow the physical properties to be described as numerical values. In certain aspects, physical properties can also be defined as mathematical expressions that include one or more numerical values, space coordinates, time coordinates, and/or the actual physical quantities. In certain aspects, the physical properties may apply to some parts of a geometrical domain, and the physical quantity itself may be undefined in the other parts of the geometrical domain. A geometrical domain or "domain" may be partitioned into disjoint subdomains. The mathematical union of these subdomains forms the geometrical domain or "domain". The complete boundary of a domain may also be divided into sections referred to as "boundaries". Adjacent subdomains may have common boundaries referred to as "borders". The complete boundary is the mathematical union of all the boundaries including, for example, subdomain borders. For example, in certain aspects, a geometrical domain may be one-dimensional, two-dimensional, or three-dimensional in a GUI. However, as described in more detail elsewhere herein, the solvers may be able to handle any space dimension. It is contemplated that through the use of GUIs in one implementation, physical properties on a boundary of a domain may be specified and used to derive the boundary conditions of the PDEs.

Additional features of a simulation system for modeling physical systems, such as features that may be found in the Modeling and Simulation module 222, may provide for automatically deriving a system of PDEs and boundary conditions for a physics (including multiphysics in some implementations) model. This technique can include merging the PDEs of the plurality of phenomena or processes, and may produce a single system of coupled PDEs, also using coupling variables or operators to couple processes in different coordinate systems, and may perform symbolic differentiation of the system of PDEs with respect to all the dependent variables for later use by the solver.

It is contemplated that certain aspects of the present disclosure may include features improving operations of a simulation computing system for modeling one or more of a plurality of engineering and scientific disciplines (e.g., acoustics, chemical reactions, diffusion, electromagnetism, fluid mechanics, geophysics, heat transfer, optics, plasma physics, quantum mechanics, semiconductor physics, structural mechanics, wave propagation, and the like). Certain aspects of a simulation system may involve more than one of the foregoing disciplines and can also include representing or modeling a combination of the foregoing disciplines. Furthermore, the techniques that are described herein may be used in connection with one or more systems of PDEs.

It is contemplated that in certain aspects of the present disclosure, system(s) of PDEs may be represented in general, coefficient, and/or weak form. The coefficient form may be more suitable in connection with linear or almost linear problems, while the general and weak forms may be better suited for use in connection with non-linear problems. The system(s) being modeled may have one or more associated studies, for example, such as stationary, time dependent, eigenvalue, or eigenfrequency. In the aspects described herein, a finite element method (FEM) may be used to solve for the PDEs together with, for example, adaptive meshing, adaptive time stepping, and/or a choice of a one or more different numerical solvers.

It is contemplated that in certain aspects of the present disclosure, a finite element mesh may include simplices forming a representation of a geometrical domain. Each simplex can belong to a unique subdomain, and a union of the simplices can form an approximation of the geometrical domain. The boundary of the domain may also be represented by simplices of the dimensions 0, 1, and 2, for geometrical dimensions 1, 2, and 3, respectively.

It is further contemplated that a mesh representing a geometry may also be created by an outside or external application and may subsequently be imported for use into the modeling system(s) described in the present disclosure.

The initial value of the solution process may be given as numerical values, or expressions that may include numerical values, space coordinates, time coordinates and the actual physical quantities. The initial value(s) may also include physical quantities previously determined.

The solution of the PDEs may be determined for any portion of the physical properties and their related quantities. Further, any portion not solved for may be treated as initial values to the system of PDEs.

It is contemplated that it may be desirable for a user to select a space dimension, combinations of physics, and a type of study in, for example, a multiphysics modeling system, using a model wizard. The model wizard may take the user through these selection steps and it may also allow for the combination of one or more space dimensions, one or more physics, and one or more studies or study steps in a model.

It is contemplated that in some aspects the constructing of extra geometries when forming a perfectly matched layer on product geometries may be conceptually straightforward. However, implementation and generating a solution to such a model is typically complex including the complexities in determining wave dampening in the vicinity of corner shapes of geometrical representations of physical systems. The application of multiple extra geometries and constructing a plurality of product geometries typically may include mapping steps between product geometries. It would be desirable and advantageous to apply methods or system that minimize the need for such construction or mapping steps.

Methods for adding PMLs to geometrical representations of physical domains of various shapes, in 2D and in 3D, can be used that do not utilize product geometries, but rather add a PML to the physical domain in the same space. Such non-product geometry methods are referred to as traditional and generate a mesh representation of the PML that include mesh elements that are of the same dimensionality as the physical domain being modeled. The traditional method in a 2D domain for adding PMLs to geometrical representations will have a PML containing 2D mesh elements, and a 3D domain will have mesh elements that are 3D.

A product geometry approach is advantageous and desirable over traditional methods because the only additional mesh elements that have to be generated are the 1D mesh elements generated from a line segment extra geometry. The product geometry approach beneficially can reduce model size, memory requirements, and computational time. In addition, the product geometry approach can streamline the GUI that may be used for adding PMLs minimizing the amount of additional user actions required to add and define the PML. The resulting graphical representations of the solution is streamlined for the user by placing less focus on the PML and more focus on the graphical representation of the modeled object.

A product geometry approach for adding PMLs to geometrical representations of physical domains of various shapes also benefits by streamlining meshing of the PML. Furthermore, implementation of a parametrization of discretized PMLs is also streamlined over traditional non-product geometry approaches. For example, resulting PMLs in a product geometry approach may be added to boundaries of a large variety of geometrical domains, including but not limited to domains that are star convex. In addition, a product geometry approach is advantageous by allowing the addition of PMLs to modeling domains of many shapes, as described further below for a method of forming one product geometry from several boundaries with minimal user input where it would otherwise be much more complex to add PMLs using traditional methods. Streamlining of the user interaction with the simulation system is facilitated by GUI features developed to aid in adding a PML to a geometric representation.

Figure 38:
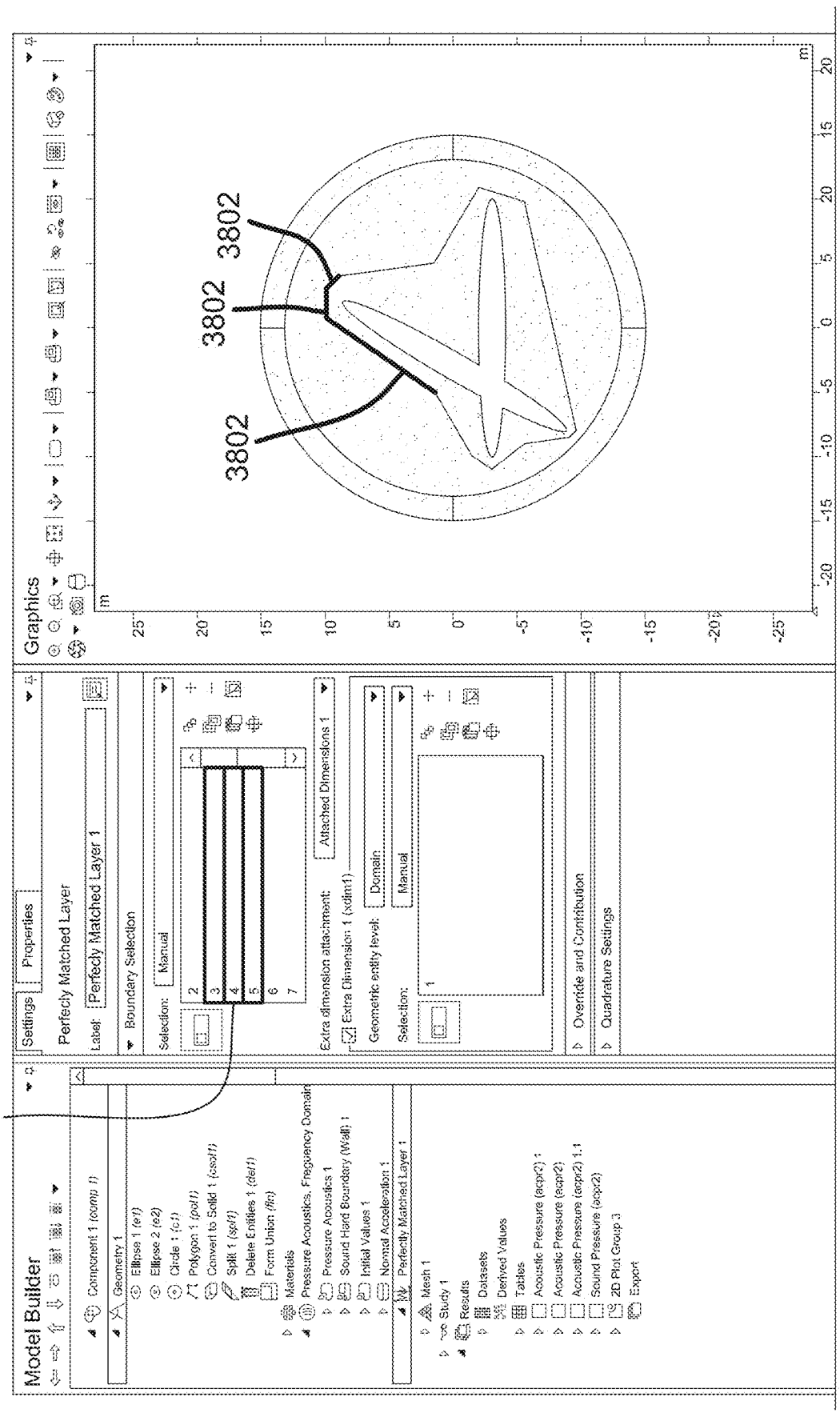
FIG. 38 illustrates an exemplary modeling settings window and corresponding graphical representation of a physical object being modeled for receiving selections of boundaries or boundary segments, according to some aspects of the present disclosure.

In some implementations, an extra geometry line segment is added to a base geometry including one or more selected boundaries. It is contemplated that when there is more than one selected boundary, this may include several connected segments of a boundary, as depicted in FIG. 38 by line segment 3802 which comprises three selected boundaries, the boundaries of the base geometry. The extra geometry line segment then forms a product geometry with the selected boundaries from the base geometry with the PML feature active on the product geometry.

It is contemplated that the damping direction is expressed by the system such that it is continuous along boundar(ies) of the base geometry associated with the line segment. This may be implemented in many ways, and a non-limiting example is shown elsewhere herein. In some aspects, where the stretching direction of the PML in the product geometry at adjacent points on the surface of the base geometry diverge rather than converge (and eventually cross) a PML would typically be expected to be applicable.

In some implementations, it is desirable for many of the steps for adding and defining one or more PMLs, including for constructing the product geometry used by the PML, to be executed with minimal user input. For example, a simulation method for a model of a physical system may automate, and thereby, minimize user inputs for the steps of adding line segment data, adding a point of attachment, meshing the line segment, forming a product geometry, or combinations thereof. In addition, settings for changing or customizing the line-segment length, and mesh or discretization related settings, may be available to the user, but the method may also rely on default settings within the simulation method. For example, the line segment may by default have a unit length of one.

It is contemplated that a computer-implemented simulation will require some user inputs for adding and defining PMLs to a model of a physical system. For example, it would be desirable for a simulation system user to identify which boundaries should have a PML attached to them where the boundaries define the parts of a base geometry used for forming a product geometry with the extra geometry.

Forming expressions for the modeled physics, including the dampening using a PML active on the product geometry, is performed via one or more processors using user inputs received through one or more GUIs. It is contemplated that although such expressions may be formed by a processor of the simulation computing system, such expressions (e.g., weak for expressions representing a wave-related phenomena of a model) may be editable by a user. For example, in some implementations, one or more PMLs, defined on a product geometry, may be added by a user adding PML-features to a model for simulating wave phenomena (e.g., including acoustics, others). The steps for adding PML features to a model may be associated with various GUI-entities that provide for the selection and input of the features. The various GUI-entities for adding PML features can include, without limitation, selection menus, selection lists, combo boxes, input fields, edit fields, or any combinations thereof. The GUI entities may be arranged within a GUI to be in proximity of each other, for instance in a settings window.

Turning to FIGS. 34-43, exemplary GUIs and method steps are depicted for adding and defining a product geometry, including a PML, to boundar(ies) of a computer model of a physical system. For exemplary GUI referring to wave-related phenomena, applicability to any wave-related phenomena physics is contemplated, including without limitation, acoustics, solid mechanics, and electromagnetic waves. Equations governing a described modeled physics are described elsewhere herein.

In some implementations, a PML is added to a geometrical representation of a model of a physical system. Data, such as coordinate data, describing the geometrical representation within the simulation computing system may be referred to as geometry data. It is contemplated that the geometry data may be in a discretized form as a mesh where the discretized form may in some implementation by further represented by shape functions as described elsewhere herein.

Figure 34A:
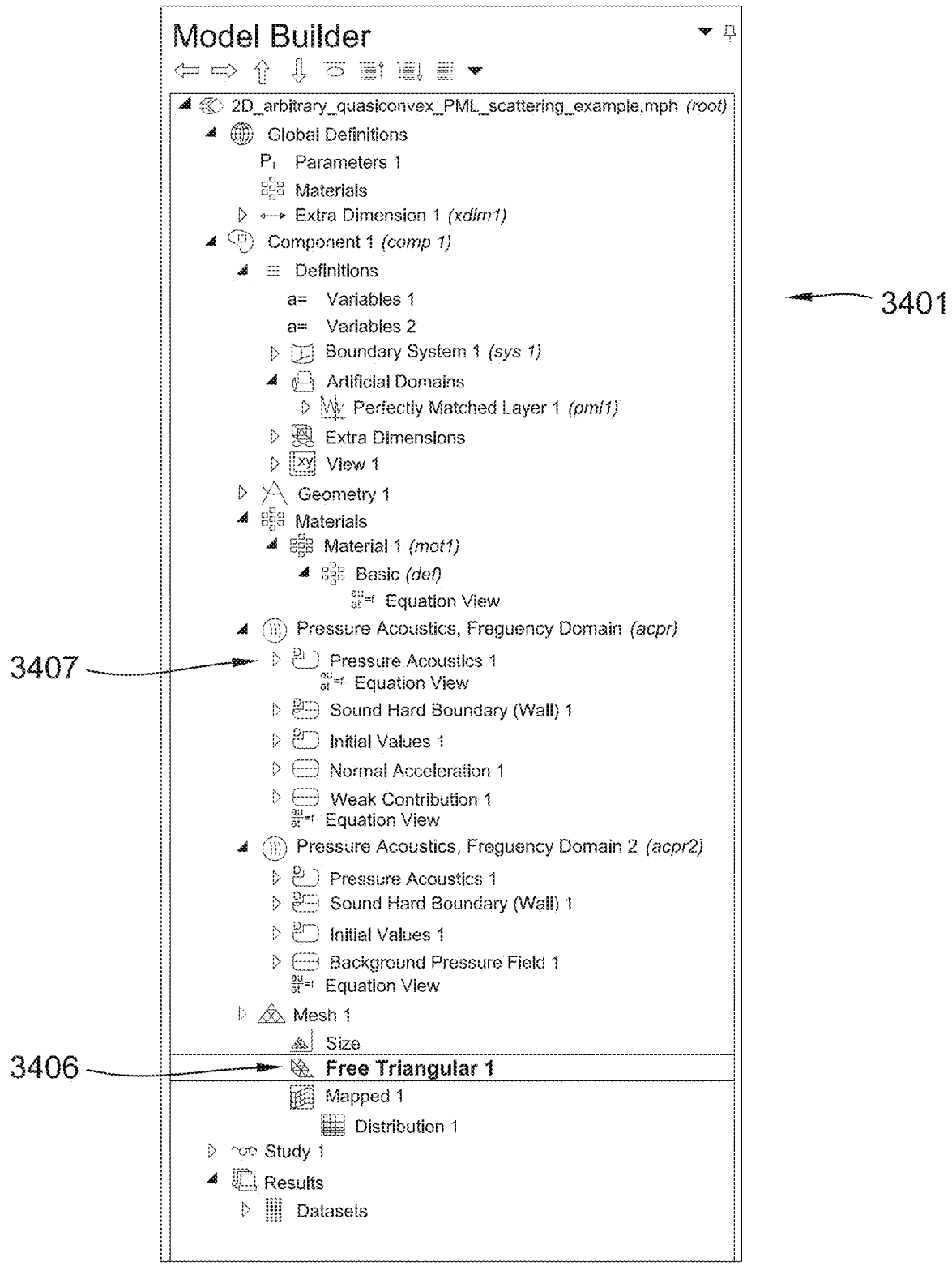
FIGS. 34A to 34C illustrate exemplary settings windows for receiving mesh settings for a geometrical representation of a modeled object including boundaries forming the base geometry, according to some aspects of the present disclosure.
Figure 34B:
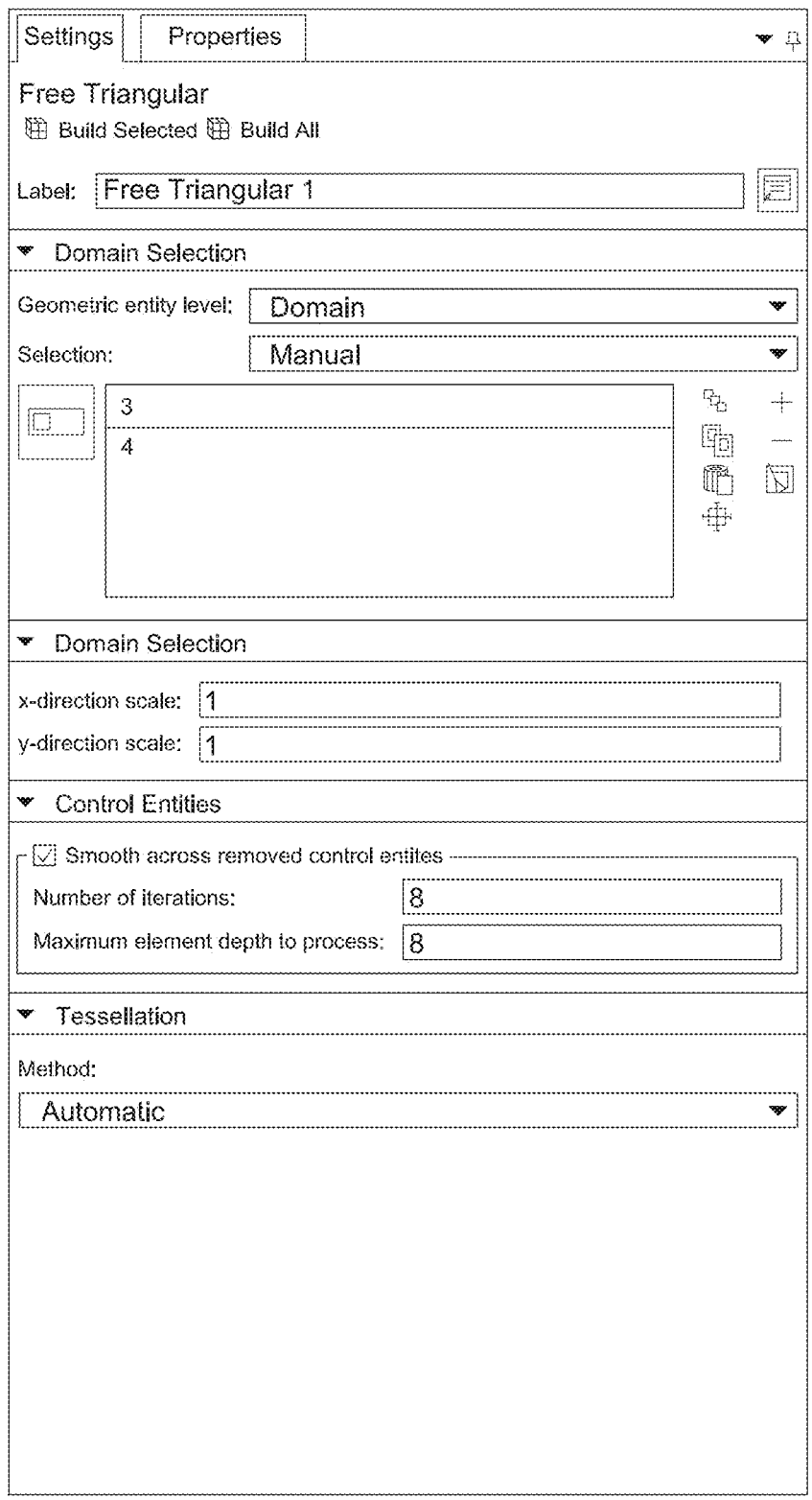
Figure 34C:
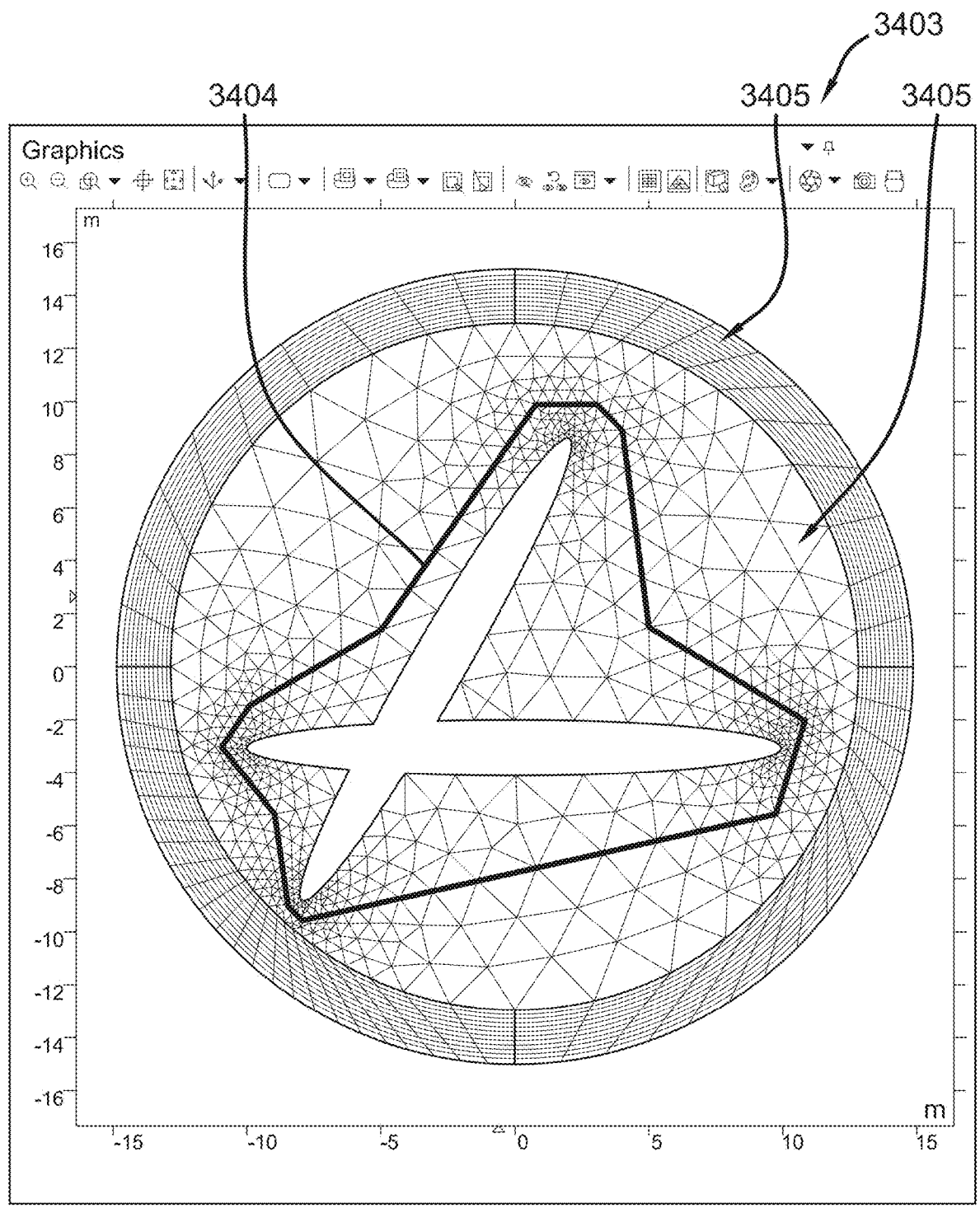

Referring now to FIGS. 34A to 34C, exemplary settings windows 3402 is depicted for receiving mesh settings for an exemplary geometrical representation of a modeled object including boundaries 3404 forming a base geometry for the model. The settings windows 3402 control user inputs for mesh settings that are incorporated into the model. From the Model Builder window 3401, selection of the Mesh 1 indicia 3406, Free Triangular 1, displays the settings window 3402 for that feature where the user inputs can be entered or selected. A graphics window 3403 provides a graphic representation of an exemplary partial mesh 3405 for the modeled object. The mesh may be created in many other ways where the setting window 3402 is but one non-limiting example. Furthermore, a mesh typically used in modeling may be finer than what is depicted in FIGS. 34A to 34C in which a larger mesh was depicted for clarity of in the graphic representation in graphics window 3403.

Figure 35A:
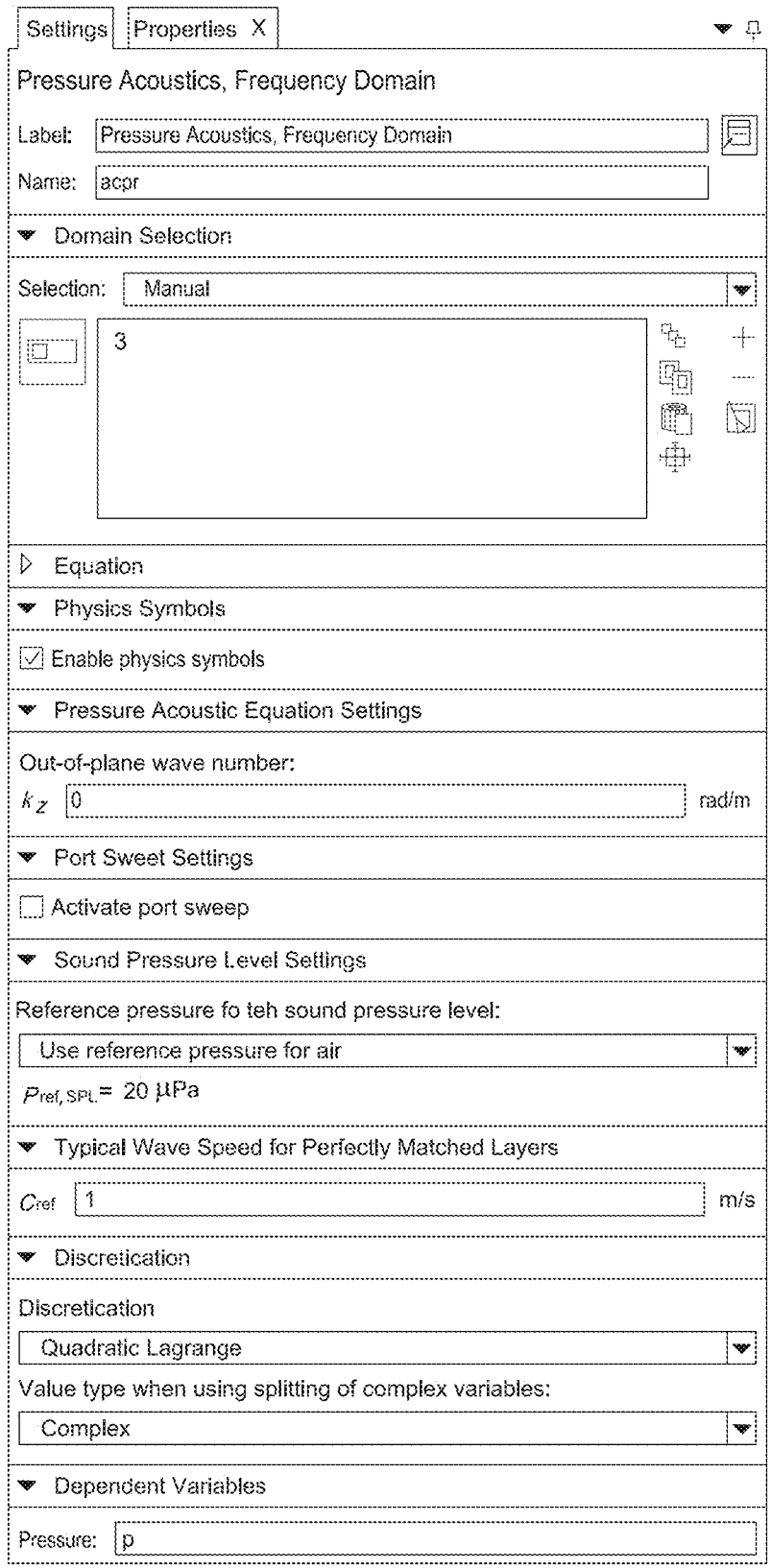
Figure 35C:
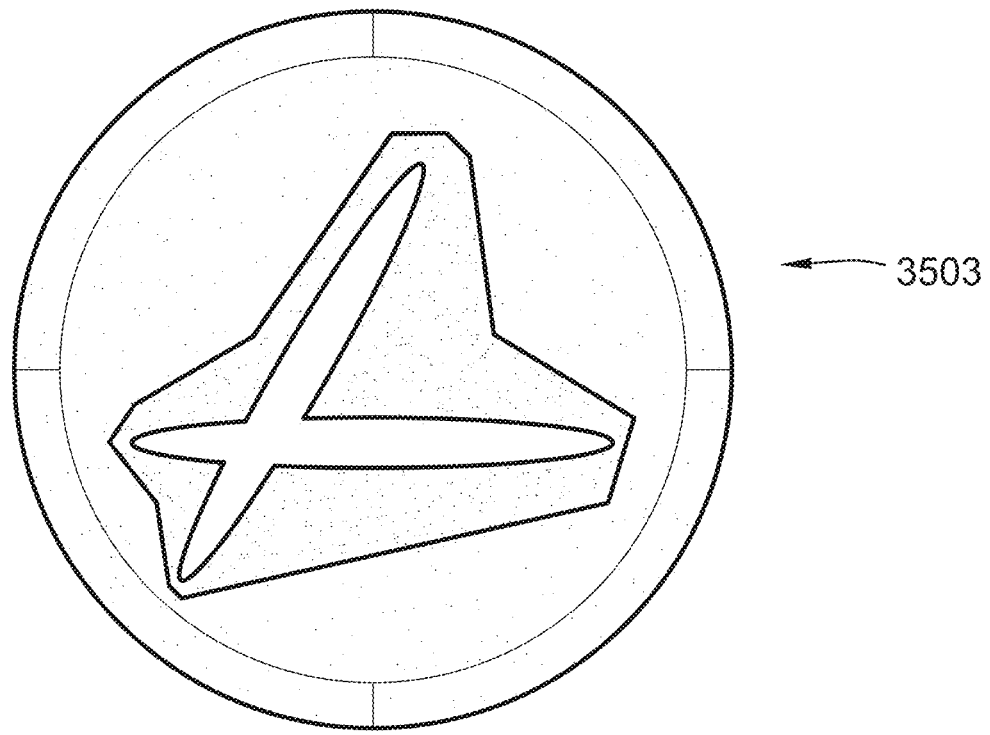

Referring now to FIGS. 35A to 35C exemplary setting windows 3501, 3502, 3504 are depicted for receiving inputs from a user for physics settings of a model of a physical system. From the Model Builder window 3401 (FIG. 34A), selection of the Pressure Acoustics, Frequency Domain (acpr) feature 3407 (FIG. 34A), Pressure Acoustics 1, displays the setting windows for that feature where the user inputs can be entered or selected. The settings windows 3501, 3502, 3504 control user inputs for physics settings including domain selections, physics, dependent variables, equations, and other properties for the physics. Settings window 3504 includes various parameters for the physics including expressions and value for the equations settings. A graphics display 3503 provides a graphic representation of an exemplary modeled object.

In some implementations, as a first optional step of a method for adding one or more PMLs to a model of a physical system, a simulation system user may indicate what modeling component a PML should be added to using typical user input tool associated with a simulation computing system, such as a mouse, keyboard, or touch screen. For models where there is only one modeling component this step may be unnecessary.

Figure 36:
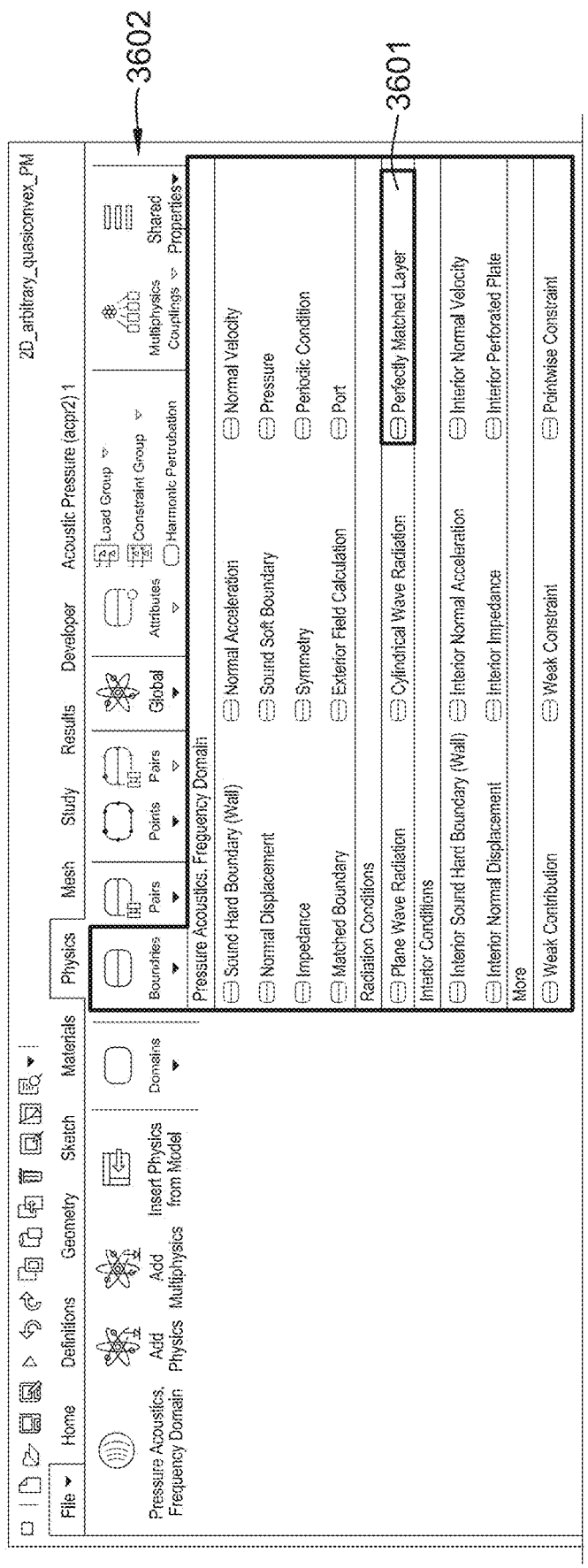
FIG. 36 illustrates exemplary GUI elements in a ribbon for a simulation system for adding a product geometry PML to a model, according some aspects of the present disclosure.
Figure 37:
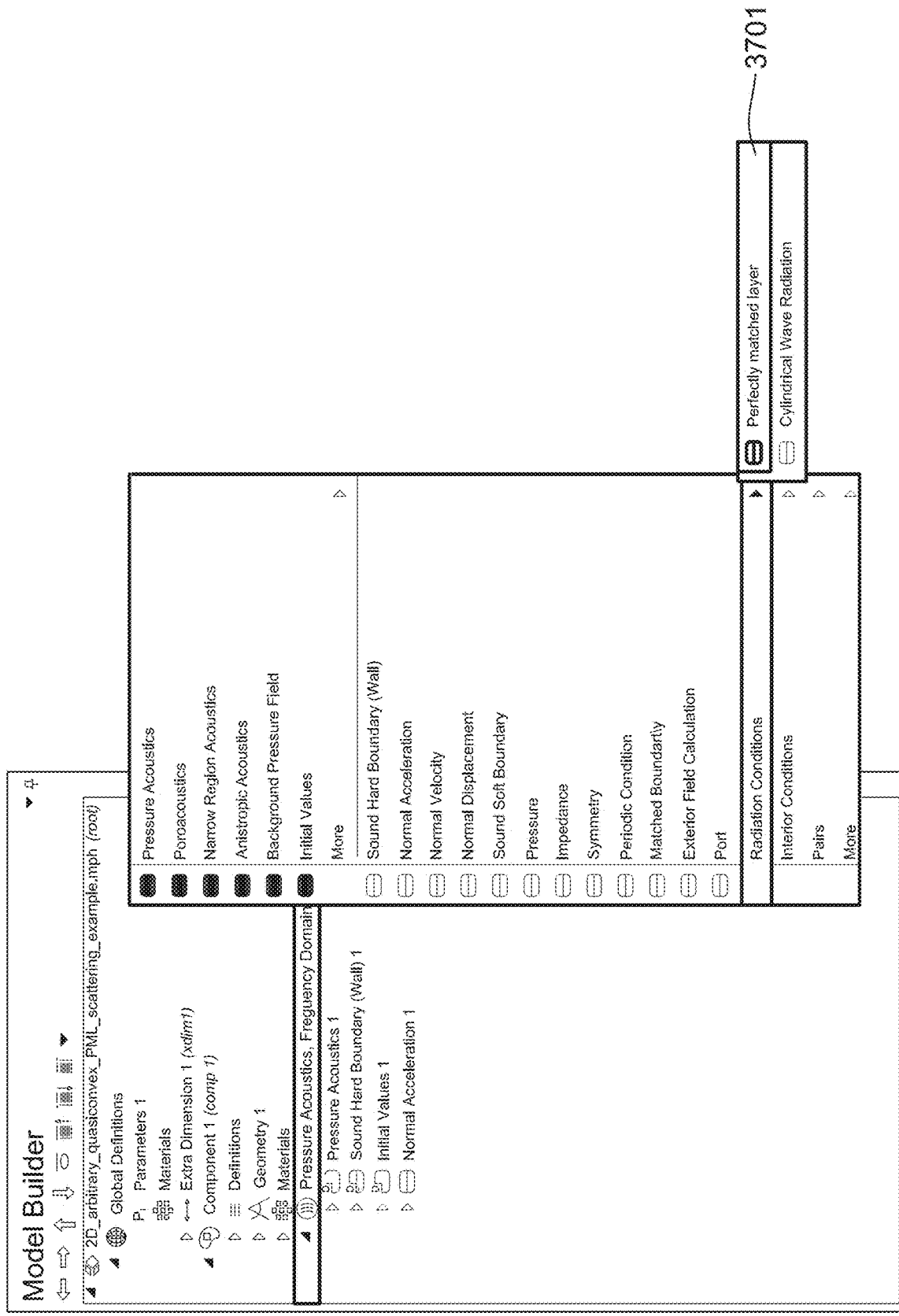
FIG. 37 illustrates exemplary GUI elements associated with a model tree for a simulation system for adding a product geometry PML to a model, according to some aspects of the present disclosure.

In a second step of the method, the simulation system user may use a typical user input tool for a simulation computing system to select a PML GUI element, such as a PML icon in a GUI ribbon or from a selection menu associated with a GUI ribbon. For example, referring to FIG. 36, a PML GUI element 3601 is depicted as being selected by a user from a GUI ribbon 3602. FIG. 36 depicts exemplary GUI elements in a ribbon for a simulation system for adding a product geometry PML to a model. The GUI elements are organized in FIG. 36 to be selected from the GUI ribbon 3602. In another example, referring to FIG. 37, exemplary GUI elements are depicted that are associated with a model tree for a simulation system for adding a product geometry PML to a model. The GUI elements are organized to be selected from a selection menu associated with a model tree. The user may, for example, right click a GUI element representative of the physics phenomenon being modeled shown as organized in the model tree, which further makes available additional options represented by menu items or menus. The user can then select a PML GUI element 3701 from the items in the menus.

In a third step of the method, in response to the user selecting the PML GUI element (e.g., 3601, 3701), an extra dimension including a line segment extra geometry, may be added to the model data structure. The extra geometry may be discretized into mesh elements. The number of mesh elements may be selected at this point or in a later step in accordance with mesh/discretization settings for the PML. Alternatively, the addition of the extra dimension to the model data structure may occur at a later step.

Figure 39:
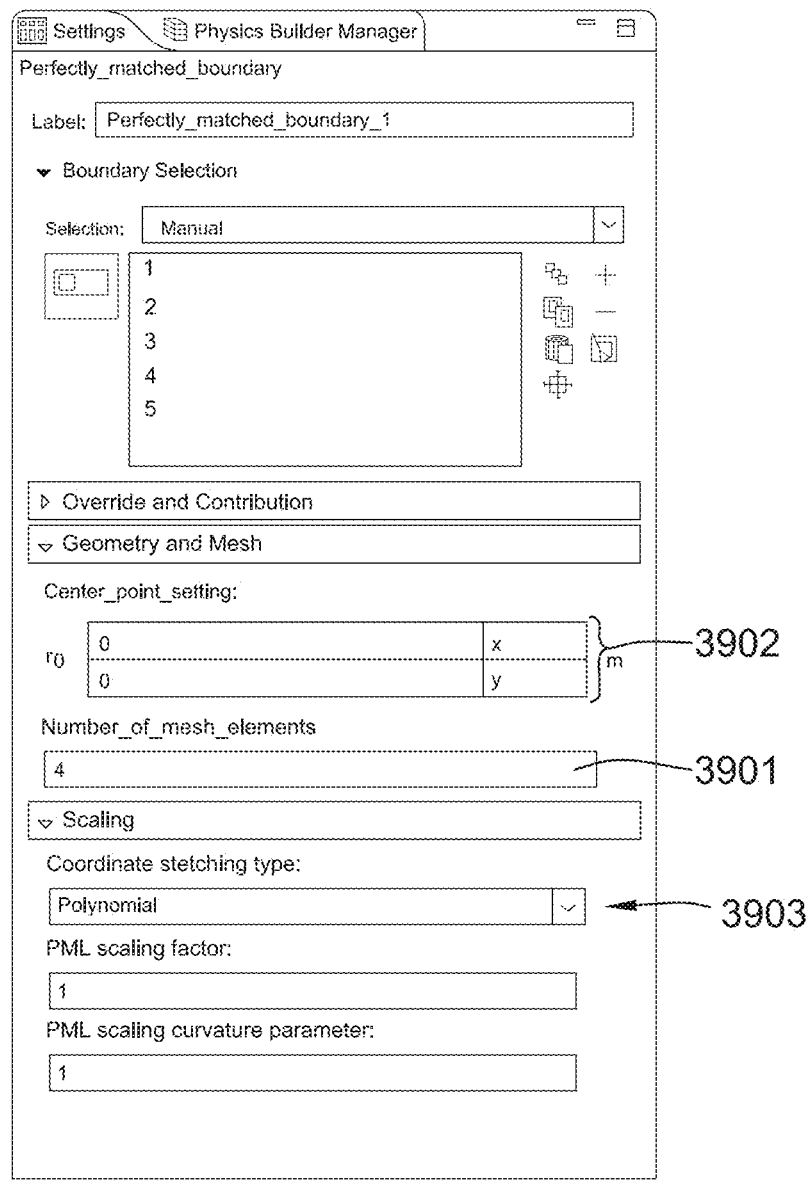
FIG. 39 illustrates an exemplary modeling settings window for receiving user settings for defining boundary selections, extra geometry mesh settings wave origin, and perfectly matched layer (PML) stretching function settings.

In a fourth step of the method for adding one or more PMLs to a model of a physical system, a settings window for the PML may be displayed in a GUI to a simulation system user. The settings window may include GUI input or GUI edit elements associated with the model. The setting window can also include a selection list for selecting and/or displaying the boundaries to which a PML should be added. An example of a selection list is shown in FIG. 38, which illustrates an exemplary modeling settings window and corresponding graphical representation of a physical object being modeled for receiving selections of boundaries or boundary segments. In the FIG. 38 example, the simulation system user may select boundaries using selection tools by either clicking on GUI indicator(s) 3801 of the boundaries (e.g., boundaries 3, 4, 5) which the user desires to add a PML to in the selection list, or the user may click graphical representation(s) of the boundaries 3802 in the displayed graphical representation of the physical system. In the exemplary aspect of FIG. 38, a pressure acoustics model including a geometry comprising two ellipses, surrounded by a boundary, is displayed with the PML being added along boundaries 3802. Another example of a PML settings window is depicted in FIG. 39, including, for example, the settings window with additional user editable settings for defining boundary selections, such as an extra geometry mesh setting 3901, wave origin 3902, and PML stretching function set settings 3903.

In some implementation, the GUI for the setting window for defining boundary conditions includes (i) one or more center point(s), from which outgoing waves are assumed to radiate, (ii) a number of mesh elements in the extra dimension, and (iii) a stretching function setting. The center point setting (e.g., wave origin) allows the simulation computing system user to indicate a location in the physical domain that acts as a source for the waves. This may be done in a multitude of ways, for instance by explicitly inputting the desired coordinates in an input or edit field that may be located in the settings window, or by indicating a location within a representation of the physical domain, for instance by using a mouse or other input device of similar functionality. A default position may be available, for instance at the origin at (0,0,0) (for 3D) or (0,0) for 2D). The mesh setting for the extra dimensions may be set by using an edit field or input field with an associated description such as "Number of mesh elements". There may be a default setting for instance 4, and the parameter may have an integer check only allowing integers larger than 0. The stretch function settings can include a mix of user settings and settings obtained automatically from the modeling interface. Several settings values for the stretching function would typically be obtained directly from the interface containing the PML boundary condition feature, information about wavelength and what type of physics is being simulated for instance. In some implementations, a simulation computing system user may set the type of coordinate stretching that should be performed where various stretching function settings may be selectable by the user. In some implementations, there may be one at least a setting for a scaling factor and there may also be a setting for a curvature parameter.

Referring again to FIG. 38, the three line segments that comprise the boundary 3402 have been selected for illustration purposes to demonstrate the selection procedure in the depicted GUI. While in a typical modeling case, the entire boundary might be selected to surround the exemplary two-ellipse geometry by a PML, the entire boundary does not need to be selected. The selected line segments that comprise the boundary 3402 may be referred to as the base geometry and in the discretized form as a discretized base geometry. The modeled geometrical representation, including the boundaries, may be discretized in accordance with discretization settings that are user editable. The discretization of the (in this case 2-dimensional) geometrical representation (e.g., 2D in the example of FIG. 38) may be performed according to methods known in Finite Element Methods (FEM), and described at least to some extent herein. The discretization of the geometrical representation of the modeled object (e.g., 2D in the example of FIG. 38) may be performed separately from the 1D extra geometry used to form a Cartesian product. For instance, the discretization of the geometrical representation including the boundaries are typically based on mesh settings for various parts of the model, while there may be a separate settings options for the extra geometry line segment.

In some implementations, it may be desirable to display a GUI geometry representation to the user that does not show the discretization. However, selections associated with such non-discretized geometry representations will apply to discretized representations of the geometry.

In a fifth step of the method for adding one or more PMLs to a model of a physical system, in response to the user selecting desired boundaries using the GUI, the simulation computing system may add the selected boundaries as product geometry data to the model data structure for forming a discretized product geometry. The product geometry includes the Cartesian product of shape functions representative of the user-selected boundaries and the extra geometry line segment. As depicted in FIG. 39. settings for the discretization used for the extra geometry in a discretized product geometry may be user editable. For example, the settings may be available in a settings window (e.g., 3901). The settings window may be associated with an extra dimension settings window and/or a perfectly matched layer/boundary settings window. It is contemplated that the actual formation of the discretized product geometry may be performed at a later stage in the method.

In a sixth step of the method for adding one or more PMLs to a model of a physical system, PML expressions may be parameterized based on discretized product geometry data, e.g. using base geometry mesh coordinates and extra geometry mesh coordinates. While both the extra geometry mesh coordinates and the base geometry mesh coordinates are used, a mesh including both the extra geometry coordinate points and the base geometry points is not necessarily formed.

In some implementations, it is contemplated to be advantageous to use local element coordinates (in some aspects, in combination with element numbering/indexing) rather than physical domain coordinates to at least to some extent. The PML expressions parametrized as described herein are added to the model data structure. The PML expressions may be further based on PML physics settings. The physics settings may at least in part be received from the physics interface where, for example, physics type and wavelength (or frequency or wavenumber), and possibly material properties, may be obtained automatically from the physics interface. Non-limiting examples of settings windows for defining physics settings are shown in FIGS. 35A to 35C. A combination of selection menus, edit fields and other GUI elements may be used to define physics settings on the modeled geometry.

Referring back to FIG. 39, it is contemplated that other PML settings may also be received as user inputs, such as the number of mesh elements 3901 the extra geometry line segment should be divided into and the origin point(s) of the waves 3902.

Figure 40A:
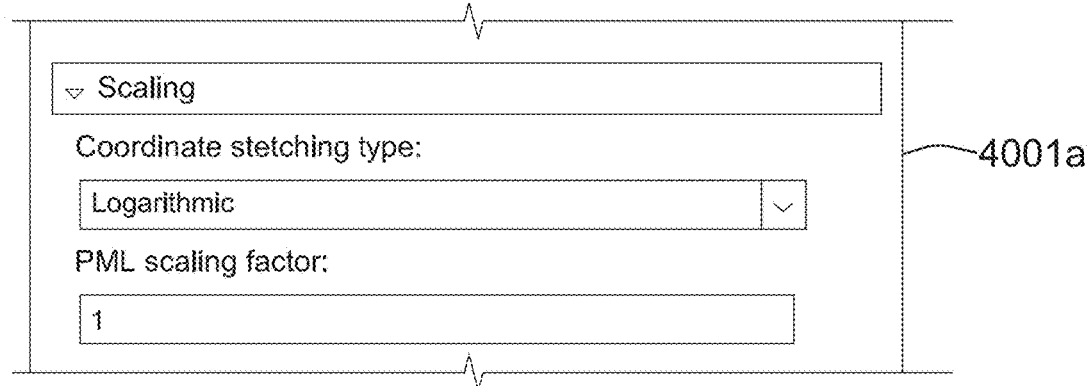
FIGS. 40A to 40C illustrate additional exemplary graphical user interface elements for receiving user input for defining a PML stretching function for the modeling settings windows depicted in FIG. 39, according to some aspects of the present disclosure.
Figure 40B:
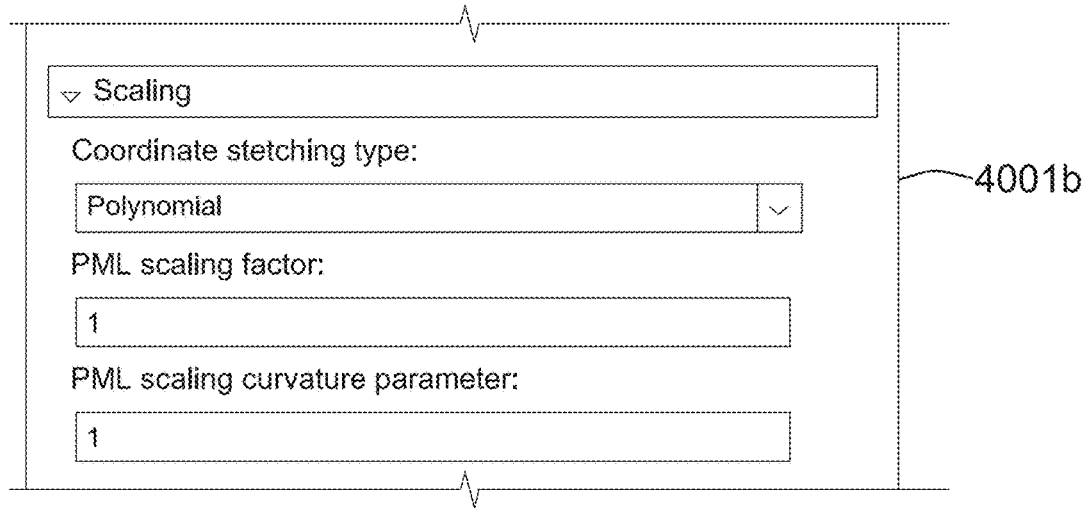
Figure 40C:
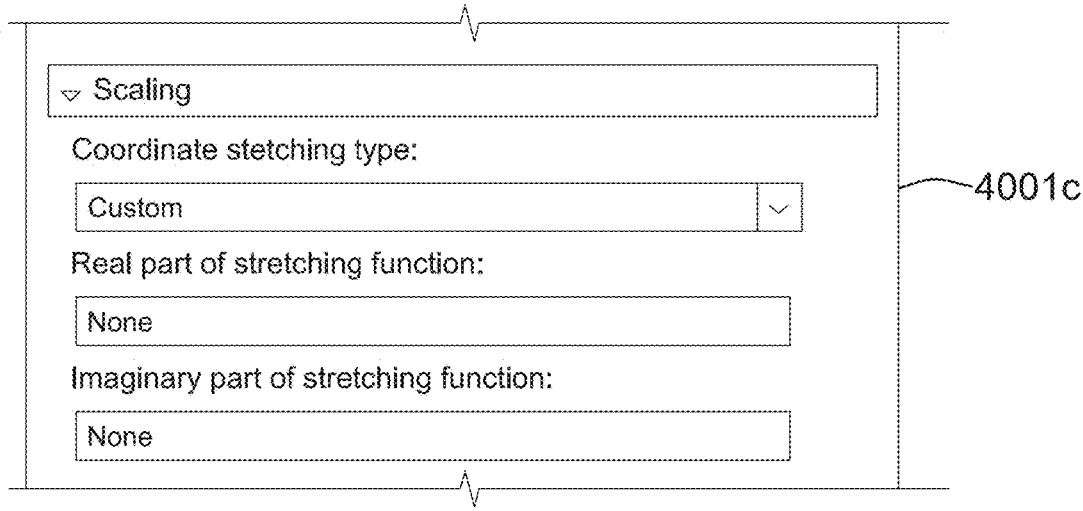

Referring now to FIGS. 40A to 40C, additional aspects setting windows are depicted for receiving user input for defining a PML stretching function for the exemplary modeling settings windows depicted in FIG. 39. For example, a coordinate stretching type setting 4001a, 40001b, 4000c may be available that affects how the PML performs coordinate stretching. For example, the coordinate stretching type setting may be logarithmic as depicted in settings window 4001a. In another example, the coordinate stretching type setting may be a polynomial including a scaling curvature parameter as depicted in settings window 4001b. In yet another example, the coordinate stretching type setting may be customized including a real portion and/or an imaginary portion of the stretching function. Depending on the coordinate stretching type selected only some of the stretching setting options may be available to the user. In some implementations, additional methods for wave origin may be available for more complicated scenarios than the wave origin being a single point. In addition, weak form expressions, expressing dependent variables and including expressions for the PMLs, may be formed by the simulation computing system using model data as shown elsewhere herein.

In a seventh step of the method for adding one or more PMLs to a model of a physical system, a stiffness or damping matrix data may be assembled based at least in part on product geometry parametrized PML expressions (possibly using element local coordinates) using shape functions representing discretized variables as described elsewhere herein.

In an eighth step of the method for adding one or more PMLs to a model of a physical system, solution data based on the stiffness or damping matrix data may be generated.

In a ninth step of the method for adding one or more PMLs to a model of a physical system, a graphical representation can be displayed of at least a portion of the solution data to the wave-related model including a PML parametrized on a product geometry. The graphical representation may be configured to be displayed in a GUI on a display device. A non-limiting example of such a display is depicted as discussed for FIGS. 41B and 42B. FIG. 41B illustrates a non-limiting aspect of a PML on a product geometry with an extra geometry formed by a selection from a base geometry of two boundary segments of the rectangular/square boundary. FIG. 42B illustrates a non-limiting aspect of a PML on a product geometry with an extra geometry formed by a selection from a base geometry including all boundary segments of the polygonal boundary.

Referring now to FIG. 41A, an exemplary graphical representation of a solution 4101 of traditional wave-related phenomena modeling implementation for an acoustic pressure field using PMLs is depicted without the incorporation of a product geometry operation. The traditional modeling implementation remained active on the upper rectangle, the right rectangle, and the upper right corner of the solution 4101 depicted in FIG. 41A.

Referring now to FIG. 41B, an exemplary graphical representation of a solution 4102 of an exemplary wave-related phenomena modeling implementation also for an acoustic pressure field is depicted for the geometry in FIG. 41A using PMLs on a product geometry and representing the stretching direction of the PML using arrows. The PML has been deactivated on the upper rectangle, the right rectangle, and the upper right corner for comparison purposes with solution 4101. Solution 4102 is very similar to solution 4101, where solution 4102 was generated with an extra geometry having been added and a product geometry with the boundary 4103 having been formed with the stretching direction indicated by the arrows.

Figure 42A:
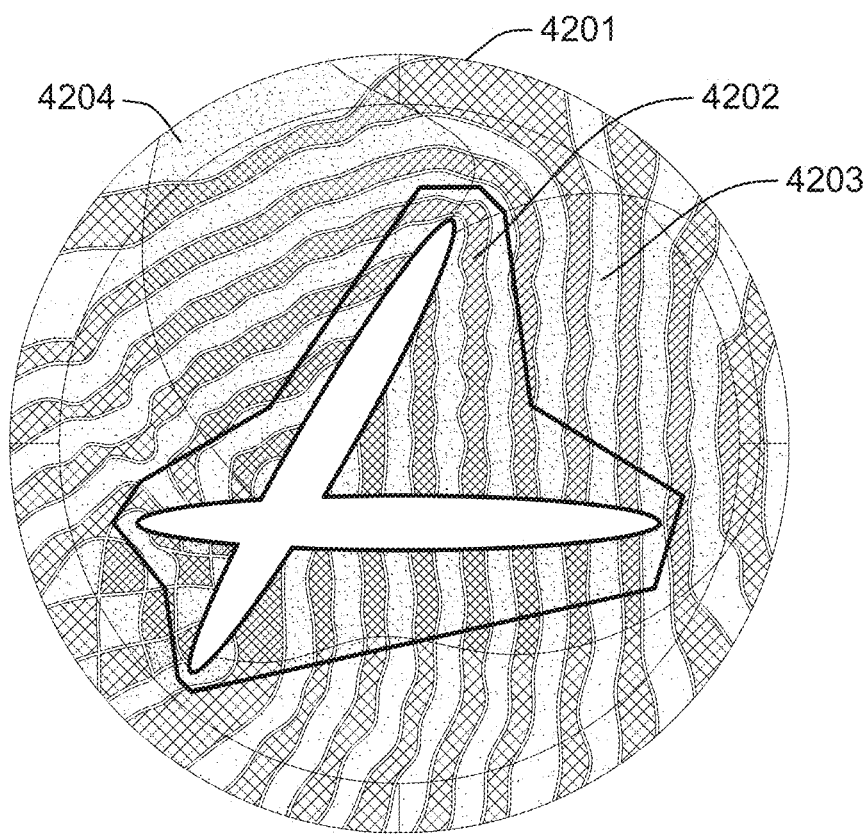
FIG. 42A illustrates an exemplary graphical representation of a solution of traditional wave-related phenomena modeling implementation using PMLs for a more complex geometry than FIG. 41A, according to some aspects of the present disclosure.
Figure 42B:
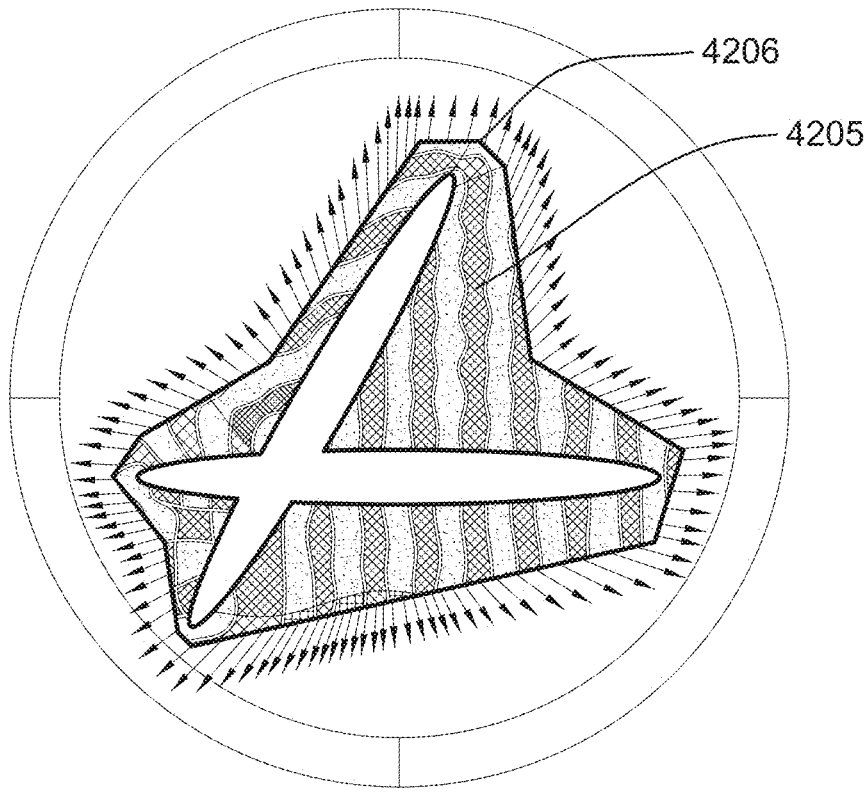
FIG. 42B illustrates an exemplary graphical representation of a solution of a wave-related phenomena modeling implementation for the more complex geometry of FIG. 42A using PMLs on a product geometry and representing the stretching direction of the PML using arrows, according to some aspects of the present disclosure.

Referring now to FIG. 42A, an exemplary graphical representation of a solution 4201 of a traditional wave-related phenomena modeling implementation for an acoustic pressure field using PMLs is depicted for a more complex geometry than FIG. 41A. The solution is for an irregular shaped 2D geometry 4202. In order to add a PML to the irregular shaped geometry using a traditional approach (i.e., without the incorporation of a product geometry operation), a geometry with a circular outer boundary 4203 is added, and then a second circular geometry 4204, divided into four parts, is added including the actual PML. This method of adding a PML is due to difficulties in adding a geometry containing a PML directly to 4202 due to the irregular shaped 2D geometry 4202 of the object being modeled.

Referring to FIG. 42B, an exemplary graphical representation of a solution 4206 of a wave-related phenomena modeling implementation also an acoustic pressure field is depicted for the more complex geometry of FIG. 42A using PMLs on a product geometry and representing the stretching direction of the PML using arrows. In contrast to the solution generated for FIG>42A, a PML on a product geometry as described in this application allows the parts of the geometry corresponding to 4203 and 4204 to be left out of the modeling and simulation, which are illustrated here for comparison purposes. The PML is active on the product geometry formed by the boundary 4206 of the modeled geometry 4205. The arrows are representative of the stretching direction p.

Figure 43:
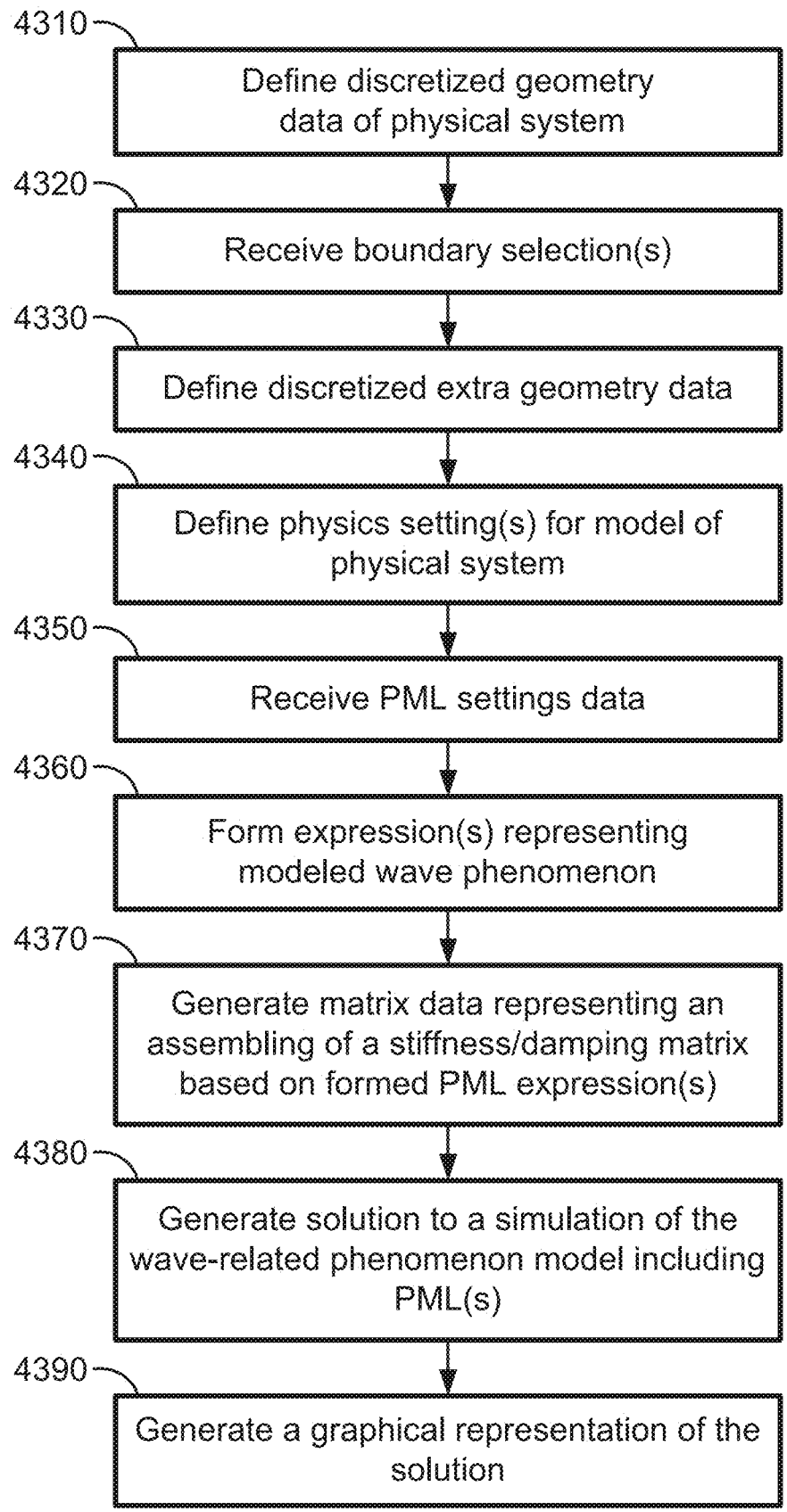
FIG. 43 is an exemplary a flowchart for adding and defining perfectly matched layers (PMLs) for use in generating a solution to a simulation of a wave-related phenomenon model including the PMLs, according to aspects of the present disclosure.

Turning now to FIG. 43, an exemplary a flowchart is depicted for a method for adding and defining perfectly matched layers (PMLs) for use in generating a solution to a simulation of a wave-related phenomenon model including the PMLs that may incorporate one or more aspects of the embodiments described for FIGS. 32 to 42 and elsewhere for the present disclosure. The method is a computer-implemented simulation method executable on one or more processors configured to add and define one or more perfectly matched layers (PMLs) to a model of a physical system. The model describes a wave-related phenomenon represented as a combined set of equations.

At step 4310, discretized base geometry data of the model of the physical system is defined as a mesh representation of a physical domain by operation of the one or more processors. Next, at step 4320, a selection of boundaries or boundary segments is received corresponding to at least a portion of the discretized base geometry data defined in step 4310. The selection may be received via one or more GUIs. Next at step 4330, discretized extra geometry data representing a meshed line segment is defined by operation of the one or more processors. The line segment may be a plurality of continuous line segments. Next, at step 4340, physics settings for modeling the physical system are defined by operation of the one or more processors. At step 4350, PML settings inputs are received including coordinate stretching settings. Next, at step 4360, weak form expressions representing the wave-related phenomenon of the model are formed. The weak form expressions include weak form PML expressions based on one or more of (i) the physics settings parametrized using discretized base geometry data associated with the boundary or boundary segment selection, (ii) the discretized extra geometry data, and (iii) at least a portion of the PML settings inputs. The forming of the expressions is implemented by operation of the one or more processors. Next, at step 4370, matrix data representing an assembling of a stiffness and/or dampening matrix is generated based on the formed weak form expressions by operation of the one or more processors. At step 4380, solution data representing a solution to a simulation of the wave-related phenomenon of the model is generated by operation of the one or more processors. The simulation is based on the formed weak form expressions. Then, at step 4390, a graphical representation of at least a portion of the solution data is generated by the one or more processors. The graphical representation is configured for display on a graphical user interface.

It is contemplated that the steps described above for the method depicted in FIG. 43 may be performed with a different ordering where the steps do not need to be performed sequentially. As one non-limiting example, the defining of the physics setting in step 4340 can be performed immediately after defining a base geometry or at other points in the method.

The non-limiting described modeling using PMLs is depicted primarily as 2D modeling. However, 3D modeling using PMLs is also contemplated.

An exemplary model equation for a wave in the PML is $$-\nabla \cdot \nabla u - k^2 u = 0 \qquad \text{Equation 30}$$

where k is the wave number, $$k = \frac{2\pi f}{c} \qquad \text{Equation 31}$$

which is a function of the frequency, $f$, the wave speed, c, and a dependent variable, u, such as, but not limited to, a dependent variable representing acoustic pressure or some other related physics. Equations 30 and 31 are based on quantities varying with time based on the following relationship:

$$e^{i\omega t} \qquad \text{Equation 32}$$

In some implementations, Equation 32 may be understood to include a minus sign in the exponent.

In some implementations, it is desirable when defining a scaling-type frequency domain PML to postulate that the wave equation is reasonable not only in real-valued space, but also in complex-valued geometries. For the PML to absorb outgoing waves, it is in principle sufficient that its complex coordinates are such that $$\Im m\left(\frac{\partial x}{\partial \xi} \cdot k\right) < 0 \qquad \text{Equation 33}$$

for any outgoing wave direction (wave vector) k and some parametrization of the PML such that $$\Re e\left(\frac{\partial x}{\partial \xi} \cdot k\right) > 0 \qquad \text{Equation 34}$$

In some implementations, it can be assumed that the parameter ξ grows "outward" from the physical domain boundary into the PML. If these conditions are met, then the amplitude of a plane wave of the form $$u_0 e^{i\omega t - ik \cdot x} \qquad \text{Equation 35}$$

will change with ξ as $$\frac{\partial |u_0 e^{i\omega t - ik \cdot x}|}{\partial \xi} = |u_0| \frac{\partial |e^{-ik \cdot \Re e(x) - i^2 k \cdot \Im m(x)}|}{\partial \xi} = |u_0| \frac{\partial \left(e^{k \cdot \Im m(x)}\right)}{\partial \xi} = \qquad \text{Equation 36}$$

$$|u_0| \frac{\partial (k \cdot \Im m(x))}{\partial \xi} e^{k \cdot \Im m(x)} = |u_0| \Im m\left(k \cdot \frac{\partial (x)}{\partial \xi}\right) e^{k \cdot \Im m(x)} < 0$$

and will decay. In some implementation, it may be understood for Equations 33 to 36 that that the symbol x may represent complex coordinates (e.g., coordinates with a real part and an imaginary part).

In a traditional PML approach that is set up as domains in the geometry, a notable central problem can be how to first define a suitable parametrization where ξ is a function of the real-valued coordinates in the PML geometry (referred to by y). For smooth geometries, $\xi$ is often taken as a distance function with respect to the inner PML boundary. But in order to define x as function of positions in the PML, a complete parametrization would be helpful. So in addition to $\xi$, one (in 2D) or two (in 3D) more parameters are needed to uniquely identify points in the PML. This amounts to parametrizing positions also in the direction tangential to the inner boundary. When using a distance function for $\xi$, it is possible to identify the position of the point on the inner PML boundary closest to a given point in the PML and use that for the tangential parametrization. That point is referred to as $y_0$. $\xi(y)$ and $y_0(y)$ are identified first and then complex PML positions are described as $$x(y)=f(\xi,y_0) \qquad \text{Equation 37}$$

for some vector-valued function f. This operation for a traditional PML only works if the closest point on the inner boundary is unique, which it will not be if the geometry has corners. Therefore, corners require special measures, e.g., using the x- and y- distance from the corner as parametrization in 2D.

Computing the distance function and finding the closest point on the inner boundary for a traditional PML operation is non-trivial, including for smooth geometries. In general, computing the distance function and finding the closest point on the inner boundary requires a search similar to what is done in contact modelling. Because of this, using traditional PML implementations that do not include the product geometries described elsewhere in the present disclosure, it may only be possible to perform modeling of PMLs on standard geometry configurations where a suitable distance function from a high-level analysis of the geometry can be identified, or the user may manually specify the required expressions.

An advantageous feature of the product geometry implementation for PMLs as described in the present disclosure include that the point $y_0$ is directly available, since it is the point on the boundary to which the extra dimension is attached. The "outwards" parameter $\xi$ can then be equated the extra-dimension coordinate, thus minimizing computing complexities.

In some implementations, a distance function may be used for $\xi$ where its gradient is parallel to the boundary normal, and therefore orthogonal to boundary tangent directions. However, in some implementations, the real-valued parametrization used for identifying points in the PML does not have to be orthogonal. For example, it can be a general curvilinear coordinate system. It is further contemplated that the $y_0$ plus extra geometry coordinate parametrization may in some implementations be essentially curvilinear by default.

In some implementations of a product geometry based PML operation for a physics simulation method for simulating waves, acoustics waves may be simulated using a frequency-domain pressure acoustics interface. A PML operation applies to boundaries of a modeling representation of a physical domain. It is contemplated that such boundary condition may be grouped in a GUI for a simulation computing system with other radiation conditions and the associated GUI settings window may include one or more settings related to the origin of the modeled wave(s), extra geometry mesh settings, and/or coordinate stretching settings.

When applying a product geometry for PML equations, the wave equation operations should be solved in complex-valued coordinates where the magnitude of the imaginary part grows outwards, away from the physical domain containing all objects and sources. In order to do this, three steps are taken. First, find a map from the mesh coordinates (with respect to which shape functions can be differentiated and weak form expressions integrated) to a parametrization of the PML domain where the parametrization encodes the notion of an outwards direction. Second, express the complex-valued coordinates as a function of the parametrization, letting the imaginary part of coordinates grow outwards. Third, express the weak form equations over the complex-valued coordinates in terms of the mesh coordinates (specifically, in terms of derivatives with respect to the mesh coordinates).

It is contemplated that the product geometry based PML operations described in the present disclosure are further advantageous for geometries beyond spheres, cylinders, and rectangles or cubes because of the introduction of an extra dimension including a line segment forming a product geometry on which the PML is active.

In some implementations, using a 1D extra-dimension geometry attached to the outer boundary of the physical domain provides a natural parametrization of the PML in the product geometry in terms of coordinates on the boundary and extra-dimension coordinate. This parametrization uses sdim+1 mesh coordinates (where sdim is the dimensionality of the geometrical representation of the modeled object), i.e., one more than the space dimension, but that does not lead to issues in the above second step of expressing the complex-valued coordinates as a function of the parameterization.

In some implementations, in order to transform the equations from complex coordinates to mesh coordinates, the Jacobian of mesh coordinates with respect to complex coordinates may be needed. This, in turn, is computed as the inverse of the Jacobian of complex coordinates with respect to mesh coordinates. But when using a product geometry, there are sdim+1 mesh coordinates (the sdim coordinates of the boundary point plus the extra-dimension position), so this inverse is singular.

One solution is to introduce an intermediate coordinate system with sdim components including of tangential and normal-directions in the mesh (where the normal coordinate is the extra-dimension coordinate). The Jacobian of these coordinates with respect to the complex coordinates can be computed as a non-singular inverse (of a 3×3 matrix). The Jacobian of the sdim+1 mesh coordinates with respect to these sdim intermediate coordinates can be explicitly expressed using normal and tangent vectors. Such an operation requires a well-defined tangent direction or two in 3D.

An alternative and possibly even preferred method may be to use mesh element-local coordinates.

In some implementations, the weak form equation can be expressed in terms of fundamental derivatives with respect to the element-local coordinates in the boundary elements and the extra-dimension coordinate, multiplied by a Jacobian of these element coordinates with respect to complex coordinates directly. The Jacobian is the nonsingular inverse of the Jacobian of complex coordinates with respect to element coordinates. Effectively, this procedure removes a product of the Jacobian of mesh coordinates with respect to element coordinates and its own inverse, a product which would otherwise cancel out anyway.

When integrating the weak form equation that was originally expressed in complex PML coordinates using element-local coordinates, there is also a volume factor in the integration to consider. Its absolute value must equal the absolute value of the determinant of the Jacobian of complex coordinates with respect to element-local coordinates. However, its sign must be selected depending on whether the element-local coordinate system is right- or left-handed. The system handedness in each element may be found by computing the determinant of the Jacobian of the real part of the PML coordinates with respect to element coordinates. The sign of this determinant multiplies the entire weak expression.

Non-limiting examples of expressions that may be used to construct weak form expressions for dependent variables dampened by a PML are described below. Variable values may be represented in a discretized form as shape functions, and the process of forming a Cartesian product of shape functions representing a base geometry, and an extra geometry (corresponding to the "outwards parameter" discussed earlier) is shown elsewhere herein. The non-limiting example is shown for a 2D-dimensional case, but a similar procedure may be used for a 3D.

$$\tilde{x} = y_0 + pf(\xi) \qquad \text{Equation 38}$$

Equation 38 is an expression of complex-valued coordinates $\tilde{x}$ as a function of the parametrization using a coordinate representative of an extra geometry. The data for the extra geometry (typically a number between 0 and 1) may be referred to as extra geometry data, and in the discretized form, expressed as shape functions this data may be referred to as discretized extra geometry data.

$$y_0 = (x, y) \in \Gamma \qquad \text{Equation 39}$$

$y_0$ in Equation 39 are coordinates representative of the boundary of the modeled geometry. The modeled geometry may at least in part be expressed using geometry data which in its discretized form, such as a mesh, may be referred to as discretized geometry data, while the boundaries which have a PML applied to them may form what is referred to as the base geometry. The data for the base geometry (such as coordinate data) may be referred to as base geometry data, and in the discretized form, expressed as shape functions this data may be referred to as discretized base geometry data.

In the non-limiting example where an intermediate system is introduced so that a weak form expression for the product geometry using the tangent, η to the boundary Γ, and the normal the below Jacobian is created in Equation 40:

$$J = \frac{\partial(\tilde{x}, \tilde{y})}{\partial(\eta, \xi)}. \qquad \text{Equation 40}$$

Letting $n=(n_x, n_y)$ be an outtwards pointing normal from δin $y_0$, the derivative $$\frac{\partial \tilde{x}}{\partial \eta}$$

can be reformulated as Equation 41:

$$\frac{\partial \tilde{x}}{\partial \eta} = \frac{\partial \tilde{x}}{\partial x}\frac{\partial x}{\partial \eta} + \frac{\partial \tilde{x}}{\partial y}\frac{\partial y}{\partial \eta} \qquad \text{Equation 41}$$

$$\frac{\partial \tilde{x}}{\partial \eta} = \frac{\partial \tilde{x}}{\partial x}n_y - \frac{\partial \tilde{x}}{\partial y}n_x$$

The Jacobian is then described by Equation 42:

$$J = \begin{bmatrix} \frac{\partial \tilde{x}}{\partial x}n_y - \frac{\partial \tilde{x}}{\partial y}n_x & \frac{\partial \tilde{x}}{\partial \xi} \\ \frac{\partial \tilde{y}}{\partial x}n_y - \frac{\partial \tilde{y}}{\partial y}n_x & \frac{\partial \tilde{y}}{\partial \xi} \end{bmatrix} \qquad \text{Equation 42}$$

Using $T=J^{-T}$ with element $T_{ij}$ the element of row i and column j (note that superscript −T refers to the inverse transpose, not to the matrix T), the weak form expression can be formulated as Equations 43 and 44:

$$\int_{D \times \Gamma} \left( -\left(T_{11}\frac{\partial v}{\partial \eta} + T_{12}\frac{\partial v}{\partial \xi}\right) \cdot \left(T_{11}\frac{\partial \hat{u}}{\partial \eta} + T_{12}\frac{\partial \hat{u}}{\partial \xi}\right) - \right. \qquad \text{Equation 43}$$

$$\left. \left(T_{21}\frac{\partial v}{\partial \eta} + T_{22}\frac{\partial v}{\partial \xi}\right) \cdot \left(T_{21}\frac{\partial \hat{u}}{\partial \eta} T_{22}\frac{\partial \hat{u}}{\partial \xi}\right) + \frac{\omega^2}{c^2}\hat{u}v \right) |J|dxdyd\xi$$

where $$\frac{\partial u}{\partial \eta} = \frac{\partial u}{\partial x} \cdot n_y + \frac{\partial u}{\partial y} \cdot (n_x) \qquad \text{Equation 44}$$

and similarly for the test function v. As described elsewhere herein (see especially the discussion from around Equation 4 and onwards) dependent variables may be described using DOFs and using shape function approximations. These shape functions are used to form a discretized product geometry as a Cartesian product of shape functions as described elsewhere herein.

In some implementations, a continuous stretching direction can be set by using a suitable p a non-limiting example of an expression for p is shown below. The stretching directions of closely located points in the boundary should also to some extent diverge, to what extent this is true would depend on the strength of the dampening.

$$p = \frac{1}{r}(y_0 - r_0), r = |y_0 - r_0| \qquad \text{Equation 45}$$

It has been demonstrated that an efficient PML stretching function is given by assuming that the imaginary part of the Jacobian of complex coordinates with respect to the "outwards" direction grows rationally, i.e., as
assuming that the (extra dimension) coordinate ξ goes from 0 to 1 over the PML. The point of attachment of the extra geometry line segment is at =0 where the complex stretching function $f$ must be zero. Integrating the Jacobian outwards results in the stretching function $$f = s(-i\log(1-\xi^p)) \qquad \text{Equation 47}$$

In this context, the real part of the stretching function should just be scaled such that the chosen number of elements can properly resolve a propagating wave. s is the scaling factor that may be set by the user using the menu in FIG. 40 and p is the PML scaling curvature parameter. s and p may be defined using a GUI element such as the menu shown in FIG. 40.

It is contemplated that the examples of scaling functions, and corresponding parameters, shown in FIG. 40 are exemplary and non-limiting. The general procedure for defining a scaling function may be to select a scaling function and then to define the corresponding parameters, using by typing in input fields or edit fields or through a selection in some sort of GUI menu. The system then creates the appropriate scaling function using the defined parameters. In some implementations, a graphical representation of the selected scaling function may also be displayed to the user in response to selecting a specific type of scaling function.

An advantageous aspect of using a product geometry formed from a base geometry and an extra geometry is that integration order may be set separately in the extra dimension with a different integration order for the base dimension. Such varying integration order is possible to set on the element level, where separate integration patterns may be used for the base geometry and for the extra geometry.

In some implementations, methods, systems, or apparatus are contemplated based on any and all combinations of any two or more of the steps, acts, or features, individually or collectively, disclosed or referred to or otherwise indicated in the present disclosure.

The exemplary aspects for simulation methods, apparatus, and systems for modifying a geometry, for adding extra geometries to a base geometry, and for adding geometries to model(s) of physical system(s) presented in FIGS. 1-43 are merely examples and are understood to apply to broader applications and physic phenomena, not just the simulation aspects described in more detail or illustrated in the figures. For example, it would be understood that many different custom geometries depending on a particular application can be modified or extra geometries added thereto using the present disclosures. The illustrated aspects are merely examples of the broader operations that may be performed by a modeling system. Furthermore, other types of graphical, user, or alternative input-type interfaces are contemplated.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Each of these aspects and obvious variations thereof is contemplated as falling within the spirit and scope of the claimed invention, which is set forth in the following claims. Moreover, the present concepts expressly include any and all combinations and subcombinations of the preceding elements and aspects.

What is claimed is:

1. A computer-implemented simulation method executable on one or more processors configured to add and define one or more perfectly matched layers (PMLs) onto a model of a physical system including corners and/or curves, the model describing a wave-related phenomenon represented as a combined set of equations, the simulation method comprising the acts of:

defining, via the one or more processors, discretized geometry data of the model of the physical system as a two-dimensional mesh representation of a two-dimensional physical domain or a three-dimensional mesh representation of a three-dimensional physical domain;

receiving, via a graphical user interface, a selection of a boundary or a boundary segment corresponding to at least a portion of a boundary of the discretized geometry data, the selection representing discretized base geometry data that includes at least one corner or curved segment;

defining, via the one or more processors, discretized extra geometry data representing a meshed line segment;

in response to defining the extra geometry data and the discretized base geometry data, attaching the discretized extra geometry data to the discretized base geometry data;

defining, via the one or more processors, physics settings for modeling the physical system;

receiving PML settings inputs including coordinate stretching settings;

in response to receiving the PML settings inputs, forming, via the one or more processors, weak form expressions representing the wave-related phenomenon of the model, the weak form expressions including weak form PML expressions based on the received PML settings and one or more of the physics settings parametrized using modified geometry data including the discretized base geometry data associated with the boundary selection or the boundary segment selection, the attached discretized extra geometry data, and at least a portion of the PML settings inputs, wherein one of (i) base geometry mesh elements and extra geometry mesh elements are one-dimensional for a two-dimensional physical domain model, or (ii) base geometry mesh elements are two-dimensional and extra geometry elements are one-dimensional, respectively, for a three-dimensional physical domain model, at least one of the base geometry and extra geometry mesh elements optionally being curved; and simulating, via the one of more processors, the wave-related phenomena of the model based on the weak form expressions, the simulating acts including:

generating matrix data representing an assembling of a stiffness and/or dampening matrix based on the formed weak form expressions;

generating solution data representing a solution to the wave-related phenomenon of the model; and generating a graphical representation of at least a portion of the solution data, the graphical representation configured for display on a graphical user interface.

2. The computer-implemented simulation method of claim 1, wherein the weak form PML expressions are formed based on discretized product geometry data from local element coordinate data.

3. The computer-implemented simulation method of claim 1, wherein the coordinate stretching settings include a PML scaling factor.

4. The computer-implemented simulation method of claim 1, wherein the coordinate stretching settings include a PML scaling curvature parameter.

5. The computer-implemented simulation method of claim 1, wherein the selected boundary or selected boundary segment is the entire boundary of the base geometry.

6. A graphical user interface (GUI) executed in a simulation computing system comprising one or more processors, the GUI configured to allow a user to add and define one or more perfectly matched layers (PMLs), using product geometry parametrization, onto a complex boundary representation of a physical domain in a model of a physical system, the complex boundary representation including corners and/or curves, the model describing a wave-related phenomenon represented in terms of a combined set of equations, the GUI including GUI elements configured for implementation of the following acts, comprising:

defining, via one or more processors, discretized geometry data for the model of the physical system as a two-dimensional mesh representation of a two-dimensional physical domain or a three-dimensional mesh representation of a three-dimensional physical domain;

receiving, via one or more GUIs, a first input representing a user instruction to add a PML to the model;

in response to receiving the first input, displaying a GUI settings window including selection tools for receiving a second input of base geometry data representing a user selection of a boundary or a boundary segment corresponding to at least a portion of the boundary of the discretized geometry data, the selection including a corner or curved segment;

receiving, via selection tools of the GUI settings window, the second input representing the user selection of the boundary or the boundary segment, the boundary selection or the boundary segment selection defining discretized base geometry data;

defining extra geometry meshing instructions;

discretizing, via the one or more processors, extra geometry line segment data representing an outward direction of a PML from the selected boundary or the selected boundary segment according to the extra geometry meshing instructions;

in response to defining the discretized base geometry data and discretizing the extra geometry line segment data, attaching the discretized extra geometry line segment data to the discretized base geometry data;

receiving, via the one or more GUIs, a third input representing one or more physics settings;

receiving, via the one or more GUIs, PML settings data including one or more of coordinate stretching type, PML scaling factor, PML scaling curvature parameter, or wave source location setting;

receiving, via the one or more GUIs, a fourth input for implementing a simulation of the wave-related phenomena of the model, the simulation including the acts of:

forming, via the one or more processors, weak form expressions representative of wave-related phenomenon of the model, the weak form expressions including weak form PML expressions based on at least a portion of the PML settings data and (ii) the one or more physics settings parametrized using modified geometry data including the discretized base geometry data associated with the boundary selection or boundary segment selection and the attached discretized extra geometry line segment data, wherein one of (I) the modified base geometry mesh elements and extra geometry mesh elements are both one-dimensional elements for a two-dimensional physical domain model, or (II) the modified base geometry mesh elements are two-dimensional elements and the extra geometry elements are one-dimensional elements, respectively, for a three-dimensional physical domain model, at least one of the mesh elements optionally being curved;

generating, via the one or more processors, matrix data representing an assembling of a stiffness matrix based on the formed weak form expressions;

generating, via the one or more processors, solution data representing a solution to the wave-related phenomenon of the model, the simulation based on the formed weak form expressions; and generating, via the one or more processors, a graphical representation of at least a portion of the solution data, the graphical representation configured for display on the one or more GUIs.

7. The GUI of claim 6, wherein the weak form PML, expressions are formed based on discretized product geometry data from local element coordinate data.

8. The GUI of claim 6, wherein the wave-related phenomenon is one of an acoustics, electromagnetics, or solid mechanics phenomenon, and the receiving of one or more physics settings is implemented through a settings window configured for receiving corresponding physics settings.

9. The GUI of claim 6, wherein the user selection of the boundary or the boundary segment is implemented in a non-meshed graphical representation of the geometry of the physical system.

10. The GUI of claim 6, wherein the one or more GUIs for receiving the PML settings data are located within the same settings window as the GUI for performing a user selection of the boundary or the boundary segment.

11. The GUI of claim 6, wherein the graphical representation of the solution data includes a graphical representation of a direction of stretching.

12. The GUI of claim 6, wherein the base geometry has an irregular shape.

13. A simulation computing system comprising one or more processors and an embedded memory for storing instructions for execution by the one of more processors, the simulation computing system configured to generate and combine shape functions for a model of a physical system and to modify a geometry of the model to allow simulation using meshes having lower dimensionalities than the modelled physical system, the model including the geometry and physical quantities represented in terms of a combined set of equations, the simulation computing system, upon execution of the stored instructions, implementing the acts comprising:

defining base geometry data representing a base geometry of a physical system represented by a first combined set of equations, the base geometry data associated with a first model of the physical system;

in response to a user selecting an extra dimension option, (i) displaying a setting window or input field for defining geometrical data of pre-defined extra dimension shapes wherein the type of shapes are based on the selected option, (ii) receiving the geometrical data, and (iii) defining extra geometry data corresponding to the received geometrical data, the extra geometry data representing one or more extra geometries for a modified model based on the first model;

receiving one or more first user inputs via a GUI component, the first user inputs being applied to determine, via the one or more processors, a first set of geometric entity data representing one or more geometric entities of the base geometry of the physical system from which to extend the one or more extra geometries, the determining of the first set of first geometric entity data including configuring the first set of geometric entity data for forming Cartesian product data in combination with the extra geometry data;

generating, via the one or more processors, modified model data representing a discretized modified model of the physical system, the discretized modified model including the base geometry discretized into a first plurality of finite elements with the base geometry expressed as shape functions, each of the first plurality of finite elements being of a dimensionality less than or equal to the dimensionality of the base geometry, the discretized modified model including at least one of the one or more extra geometries discretized into a second plurality of finite elements with at least one of the one or more extra geometries expressed as shape functions, the second plurality of finite elements being of a dimensionality less than or equal to the dimensionality of the one or more extra geometries, the first plurality of finite elements being representative of the base geometry excluding the one or more extra geometries, the second plurality of finite elements being representative of at least one of the one or more extra geometries excluding the base geometry;

forming, via the one or more processors, Cartesian product data representing a Cartesian product of the first plurality of finite elements with the second plurality of finite elements, the forming of the Cartesian product data occurring after the generating of modified model data representing the discretized modified model, the discretized modified model including at least in part some of the physical quantities being dependent on spatial coordinate components from the Cartesian product data including spatial coordinate components from the base geometry and spatial coordinate components from the one or more extra geometries;

simulating, via the one of more processors, the modified model based on the Cartesian product data, the simulating acts including:
  generating matrix data representing an assembling of a stiffness matrix based on the Cartesian product;
  generating solution data representing a solution to the modified model, the solution based on the matrix data representing the assembling of the stiffness matrix based on the Cartesian product of the first plurality of finite elements and the second plurality of finite elements, thereby allowing the generation of a finite element model based on the generated non-discretized equation data, the model describing a physical system of a dimensionality that is the sum of the base geometry dimensionality and the extra geometry dimensionality wherein the solution is based on meshes for the modified model having lower dimensionalities than the modelled physical system; and generating a graphical representation of at least a portion of the solution data, the graphical representation configured for display on a graphical user interface.

14. The simulation computing system of claim 13, wherein the non-discretized combined set of equations are a combined set of non-discretized partial differential equations configured as input data for a partial differential equation solver.

15. The simulation computing system of claim 13, wherein the first plurality of finite elements and the second plurality of finite elements include shape functions for expressing one or more dependent variables representing physical quantities of the physical system.

16. The simulation computing system of claim 13, wherein the one or more extra geometries are created based on a user selection of a shape from a list of shapes presented within a settings window of a graphical user interface, one or more user-specified lengths attributable to the selected shape being defined within the settings window.

17. The simulation computing system of claim 13, wherein properties attributable to the extra geometry are defined within the same settings window that include the GUI components used for the first user inputs.

18. The simulation computing system of claim 13, wherein the base geometry represents a chemical reactor and the one or more extra geometries represent particles within the chemical reactor.

19. The simulation computing system of claim 13, wherein the base geometry represents in-plane directions of a shell in a shell model and one or more extra geometry line segments represent one or more thicknesses of the shell.

20. The simulation computing system of claim 13, wherein the base geometry represents at least in part the wave-related phenomenon of the model and the extra geometry represents the outward direction of a perfectly matched layer (PML) extending away from the base geometry.

\* \* \* \* \*